(12) United States Patent
Lee et al.

(10) Patent No.: US 10,672,289 B2
(45) Date of Patent: Jun. 2, 2020

(54) SYSTEM FOR DYNAMICALLY PROVISIONING CYBER TRAINING ENVIRONMENTS

(71) Applicant: Circadence Corporation, Boulder, CO (US)

(72) Inventors: Laura Lee, San Diego, CA (US); Raymond C. Prouty, San Diego, CA (US); Joseph T. Kowtko, Jamesburg, NJ (US); Ryan Pressley, Saltillo, MS (US)

(*) Notice: Subject to any disclaimer, the term of this patent is extended or adjusted under 35 U.S.C. 154(b) by 0 days.

(21) Appl. No.: 16/109,430

(22) Filed: Aug. 22, 2018

(65) Prior Publication Data

US 2019/0066530 A1 Feb. 28, 2019

Related U.S. Application Data

(63) Continuation-in-part of application No. 16/056,892, filed on Aug. 7, 2018, now Pat. No. 10,515,564, (Continued)

(51) Int. Cl.

| | |
|---|---|
| *A63F 9/24* | (2006.01) |
| *G09B 9/00* | (2006.01) |
| *H04L 29/06* | (2006.01) |
| *A63F 13/00* | (2014.01) |
| *G09B 19/00* | (2006.01) |
| *G06N 3/00* | (2006.01) |
| *A63F 13/85* | (2014.01) |
| *A63F 13/63* | (2014.01) |

(Continued)

(52) U.S. Cl.
CPC .............. *G09B 9/00* (2013.01); *A63F 9/24* (2013.01); *A63F 13/00* (2013.01); *A63F 13/63* (2014.09); *A63F 13/85* (2014.09); *G06F 3/00* (2013.01); *G06N 3/006* (2013.01); *G09B 7/00* (2013.01); *G09B 19/0053* (2013.01); *H04L 67/38* (2013.01)

(58) Field of Classification Search
CPC ......... G06N 3/006; H04L 67/38; A63F 13/85; A63F 9/24; A63F 13/00
See application file for complete search history.

(56) References Cited

U.S. PATENT DOCUMENTS

| | | |
|---|---|---|
| 7,474,429 B2 | 1/2009 | Morooka et al. |
| 7,837,543 B2 | 11/2010 | Graepel et al. |

(Continued)

OTHER PUBLICATIONS

Ernits et al., i-tee: A fully automated Cyber Defense Competition for Students, Copyright 2015, 2 pages.

(Continued)

*Primary Examiner* — Steve Rowland
(74) *Attorney, Agent, or Firm* — Weide & Miller, Ltd.

(57) ABSTRACT

Methods and systems allow a user or operator to easily create cyber-training environments for use in a cyber-training system. In one embodiment, the environments are configured as missions. The missions may have a plurality of features, such as training objectives, a mission storyline, a mission order and mission objectives, relative to a mission environment. The mission environment comprises a virtual environment, such as defined by a virtual network having virtual machines or devices.

20 Claims, 68 Drawing Sheets

System Architecture

Related U.S. Application Data which is a continuation of application No. 15/274,096, filed on Sep. 23, 2016, now Pat. No. 10,056,005, application No. 16/109,430, which is a continuation-in-part of application No. 15/466,833, filed on Mar. 22, 2017, now Pat. No. 10,238,948.

(60) Provisional application No. 62/549,779, filed on Aug. 24, 2017, provisional application No. 62/232,423, filed on Sep. 24, 2015.

(51) Int. Cl.
*G09B 7/00* (2006.01)
*G06F 3/00* (2006.01)

(56) References Cited

U.S. PATENT DOCUMENTS

| | | | |
|---|---|---|---|
| 8,005,879 | B2 | 8/2011 | Bomhoevd et al. |
| 8,099,272 | B2 | 1/2012 | Conway |
| 8,266,320 | B1 | 9/2012 | Bell et al. |
| 8,554,536 | B2 | 10/2013 | Adelman et al. |
| 8,751,629 | B2 | 6/2014 | White et al. |
| 9,076,342 | B2 | 7/2015 | Brueckner et al. |
| 9,246,768 | B2 | 1/2016 | White et al. |
| 9,697,355 | B1 | 7/2017 | Park et al. |
| 2003/0046689 | A1 | 3/2003 | Gaos |
| 2005/0192870 | A1 | 9/2005 | Geddes |
| 2007/0066403 | A1* | 3/2007 | Conkwright .......... A63F 13/10 463/43 |
| 2009/0208910 | A1* | 8/2009 | Brueckner ............. G09B 5/00 434/11 |
| 2009/0254842 | A1 | 10/2009 | Leacock et al. |
| 2009/0320137 | A1 | 12/2009 | White et al. |
| 2011/0257961 | A1 | 10/2011 | Tinkler et al. |
| 2012/0058829 | A1 | 3/2012 | Yanagisawa et al. |
| 2012/0084242 | A1 | 4/2012 | Levin |
| 2013/0014264 | A1 | 1/2013 | Kennedy et al. |
| 2013/0288788 | A1 | 10/2013 | Lim et al. |
| 2014/0120993 | A1 | 5/2014 | Tsuchiya |
| 2014/0186801 | A1 | 7/2014 | Slayton et al. |
| 2014/0199663 | A1* | 7/2014 | Sadeh-Koniecpol .... G09B 5/00 434/118 |
| 2015/0040033 | A1 | 2/2015 | Kurtz et al. |
| 2015/0050623 | A1* | 2/2015 | Falash .................... G09B 9/24 434/38 |
| 2015/0143374 | A1 | 5/2015 | Banga et al. |
| 2015/0231502 | A1 | 8/2015 | Allen et al. |
| 2017/0032694 | A1* | 2/2017 | Brueckner ............. G09B 5/02 |
| 2017/0103783 | A1 | 4/2017 | Paglia et al. |
| 2017/0140660 | A1 | 5/2017 | Morton et al. |
| 2017/0140663 | A1* | 5/2017 | Sadeh-Koniecpol .... G09B 5/00 |
| 2017/0244746 | A1* | 8/2017 | Hawthorn ........... H04L 63/1433 |
| 2017/0304707 | A1 | 10/2017 | Morton et al. |

OTHER PUBLICATIONS

International Search Report and Written Opinion for International Application No. PCT/US2018/47509 dated Oct. 29, 2018, 14 pages.

Price et al., Asset Criticality in Mission Reconfigurable Cyber Systems and its Contribution to Key Cyber Terrain, Proceedings of the 50th Hawaii International Conference on System Sciences, Jan. 2017, retrieved from https://scholarspace.manoa.hawaii.edu/handle/10125/41893, 1 pages.

* cited by examiner

System Architecture

New Mission

Open Mission

For save as it doesn't matter if the mission is dirty or not. All plugins have to save all their data in the new mission folder.

User Selects: Save Mission As

Webswing within Game Environment

Create New Mission Top Level Graphic

User Interface for creating new mission

User Interface for Open Existing Mission

Save Changes Prompt

Copy Mission User Interface

Advanced Mission Settings Interface

Exporting Mission Summary

MyMissions > XYZ_mission_1_Easy > export

Name

- Assets
- Events
- Network_Map
- Athena_Questions.txt
- General_Questions.txt
- Mission_Questions.txt
- Quiz Q&A.csv
- quiz.txt
- services_0.yaml
- vem.yaml
- vsphere.yaml Export Files Created

Figure 14

Storyline Video or Text

Defining the Storyline

Mission Orders

Define Mission Order

Situation Editor

Figure 19

Mission Order Page Settings

Mission Objectives

Mission Objectives tab

Search for Skill

Figure 23

Solution and Hints

Defining the Solutions and Hints

Define Solution

Add Hint

Network Map

Network Map Options

View indication of Key Terrain

Zoom Example

Nodes Palette

Attributes Palette

Mouseover Feedback

Editable Properties

Figure 35

Arrange Item

Lock Item

Defining the Network Map

Defining Events

Add Events

Steps for id dialog

Quizzes

Figure 40C

Define Quizzes

Check List

Define Mission

Mission Verification Summary

Advanced Mission Settings Dialog

Export Summary Dialog

Mission Development Methodology Walkthru

Conceptualize Mission
- Write Storyline
- Identify Training Outcomes
- Identify Key Terrain
- Identify Mission Objectives
- Define Mission Characteristics
- Model Threat Actor
- Write Mission Orders

Refine Mission
- Identify Skills for each Objective
- Define Network Diagram
- Develop Mission Events List
- Determine Umpire Check Detecti...
- Develop Solution/Hints
- Variability

Identify Supporting Information
- Athena Q&A
- Qualifying Exam
- References

Associate Mission Files
- Mission Video
- Mission Thumbnail (Logo)
- Mission Coin
- Other File(s)

Mission Development Walkthru Panel

Figure 47

Welcome Page

User Pre-Requisite Skills

360

What is the cyber key terrain for the business or mission?

Maravian National Bank

What protocols would be found in the environment?

telnet
vnc
ssh

What business/mission systems (and data) surrogates need to be created?

Command and Control Server

What are the baseline flows that are necessary for this business (or line of business) or mission to function – and what is their priority?

What is the defensive posture of the business (e.g., how good are they, what do they use)?

Key Terrain

Figure 50

Mission Characteristics

Figure 51

Training Outcomes

Associated Mission File(s)

Mission Order Page

Mission Objectives (for type Mission)

Solution and Hints Page

Edit Text Hint

Network Map Page

450

| Event ID | Event Description | Event Type | Event Frequency | Event Time (seconds) | Interval (seconds) | Target(s) | Emits Target / Argument | Arguments |
|---|---|---|---|---|---|---|---|---|
| 1 | My favorite fishing event | Delivery - Drivebydownload | Run Once | 0 | | Server1, Client1 | target1 | {wkst1, wkst2, wkst3, wkst4, wkst5}.xanadu.com |
| 2 | | Privilege Escalation - ScheduledTask | Run Once | 300 | | target1 | | |
| 3 | | Persistence - ScheduledTask | Run Once | 600 | | target1 | | 172.16.10.0/24 |
| 4 | | Discovery - NetworkScan | Run Once | 900 | | target1 | discover1 | |
| 5 | | Lateral Movement - PasstheHash | Run Once | 1200 | | target1 | | target1.discover1 |
| 6 | | Collection - Staging | Periodic | 1260 | 90 | target1 | collection1 | target1.discover1 |
| 7 | | Exfiltration - Compress | Run Once | 1500 | | target1 | | target1.collection1 |

[Add Event] [Delete Selected Event]

452 — Events Page — 454

Figure 59

Athena Q&A Page

Quizzes Page

Mission Library Plugin

Example Mission that Snaps into Coliseum

Coliseum Backbone for 8 teams

Coliseum Backbone for 16 teams

SYSTEM FOR DYNAMICALLY PROVISIONING CYBER TRAINING ENVIRONMENTS

CROSS-REFERENCE TO RELATED APPLICATIONS

This application claims priority to U.S. Provisional Application Ser. No. 62/549,779 filed Aug. 24, 2017; this application is also a continuation-in-part of and claims priority to U.S. application Ser. No. 16/056,892, filed Aug. 7, 2018, which is a continuation of U.S. application Ser. No. 15/274,096 filed Sep. 23, 2016, which claims priority to U.S. Provisional Application Ser. No. 62/232,423, filed Sep. 28, 2015; and this application is a continuation-in-part of U.S. application Ser. No. 15/466,833 filed Mar. 22, 2017. All of said prior applications are incorporated by reference herein in their entirety.

FIELD OF THE INVENTION

The present invention relates to novel systems and methods for generating or creating cyber training environments and missions.

BACKGROUND OF THE INVENTION

As cyber-attacks continue to increase in frequency and become more sophisticated, the need for security systems and highly trained experts to protect industry and government information systems is growing just as fast. This rapidly growing cyber security threat landscape coupled with the shortage of personnel with the expertise required to safeguard critical systems and sensitive information poses a serious security risk for the public and private sectors.

Unfortunately, current training methods are severely challenged to keep up-to-date and provide the training necessary to combat the threat. This highly complex security training has traditionally occurred in the classroom or has been provided by consultants with access to live systems evaluating real-time security threats as they occur. These existing training methodologies and techniques cannot keep up with the rapidly changing security threats nor can they train personnel fast enough. To further complicate existing training programs, real-life cyber threat scenarios become outdated by new threats shortly after training is introduced.

Current training systems are built with the specific target for training in mind and dedicated to staff and students as such. For example, some of these targets may include healthcare, finance, power grid network infrastructure, etc. Current training systems are customized with hardware, software, and built to satisfy the training needs of the targeted industry. Present day systems are generally static in nature and configured once for the targeted industry, then modified manually as training needs and technology changes.

This focused manual customization for each industry target in need of training increases the cost of the overall training system development and support, making current training systems expensive and too costly for most businesses desperately in need of such state of the art training. Such legacy training systems require extensive manual modification and on-going customization to keep up with the student's training needs and the rapid pace of technology evolution in each particular industry where training is required. This fast-paced evolution of technology quickly makes training systems obsolete and in need of revision to keep up with the continual flow of new students, new systems and new operational methods.

Further, even in those situations where computer implemented training systems have been developed, those systems suffer from similar problems. While these systems can be used to train larger numbers of students, the training systems are not flexible and provide limited training benefits. For example, existing training systems are designed to implement fixed training sessions. That is, these training systems include one or more predesigned or fixed training applications. The training system simply implements that single fixed training application or selects from one of a small set of fixed training applications. Thus, students see the same training environments over and over. If the operator desires to present students with a different training session or environment, an entirely new training application must be built and loaded into the training system.

This "select from fixed training sessions" configuration is consistent with the goal of existing training sessions: to create a training session in which a student practices or implements one or more specific tasks. In accordance with the task-based training, the training is used to train the student on a particular task and to increase their proficiency in implementing the task. However, in the real world, each cyber threat is very different. Thus, a student's ability to perform a particular designated task is insufficient in helping the student understand when to perform the task or how to use it in conjunction with other tasks or techniques in order to address a cyber threat.

Given the rapidly changing cyber threat risk and the constant attacks from hackers around the world, a dynamic, virtual network training system and method are needed to provide an isolated and controlled network environment with the level of complexity needed to train experts how to rapidly respond to cyber-attacks, terrorism, and cyber-crime, and how to stop them. In order to implement such a system, a method and system are needed to generate a plurality of varied or variable training missions, such as having different environments and objectives.

SUMMARY OF THE INVENTION

Embodiments of the invention comprise methods and systems which allow a user or operator to easily create cyber-training environments for use in a cyber-training system, and preferably methods and systems for designing and configuring specific training mission hardware and software environments.

In one embodiment, the environments are configured as missions. The missions may have a plurality of features, such as training objectives, a mission storyline, a mission order and mission objectives, relative to a mission environment. Preferably, the mission environment comprises a virtual environment, such as defined by a virtual network having virtual machines or devices.

Aspects of the invention comprise hardware and software which are uniquely configured to automate the creating of such cyber-training environments or missions, thus solving problems with and providing advantages over existing technology which requires cyber training platforms to be custom design or configured with a static configuration.

Further objects, features, and advantages of the present invention over the prior art will become apparent from the detailed description of the drawings which follows, when considered with the attached figures.

DESCRIPTION OF THE DRAWINGS

FIG. 14 illustrates an export files created interface according to embodiments of the present invention.

FIG. 19 illustrates a situation editor according to embodiments of the present invention.

FIG. 23 illustrates a skills interface according to embodiments of the present invention.

FIG. 35 illustrates editable properties dialogs according to embodiments of the present invention.

FIG. 40A-40D illustrates quizzes interfaces according to embodiments of the present invention.

FIG. 47 illustrates a mission development methodology walkthrough according to embodiments of the present invention.

FIG. 50 illustrates a key terrain interface according to embodiments of the present invention.

FIG. 51 illustrates a mission characteristics interface according to embodiments of the present invention.

FIG. 59 illustrates an events interface according to embodiments of the present invention.

DETAILED DESCRIPTION OF THE INVENTION

In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

Embodiments of the invention comprise methods and system for creating or generating cyber environments, and preferably methods and systems for designing and configuring specific training mission hardware and software environments.

Figure 1:
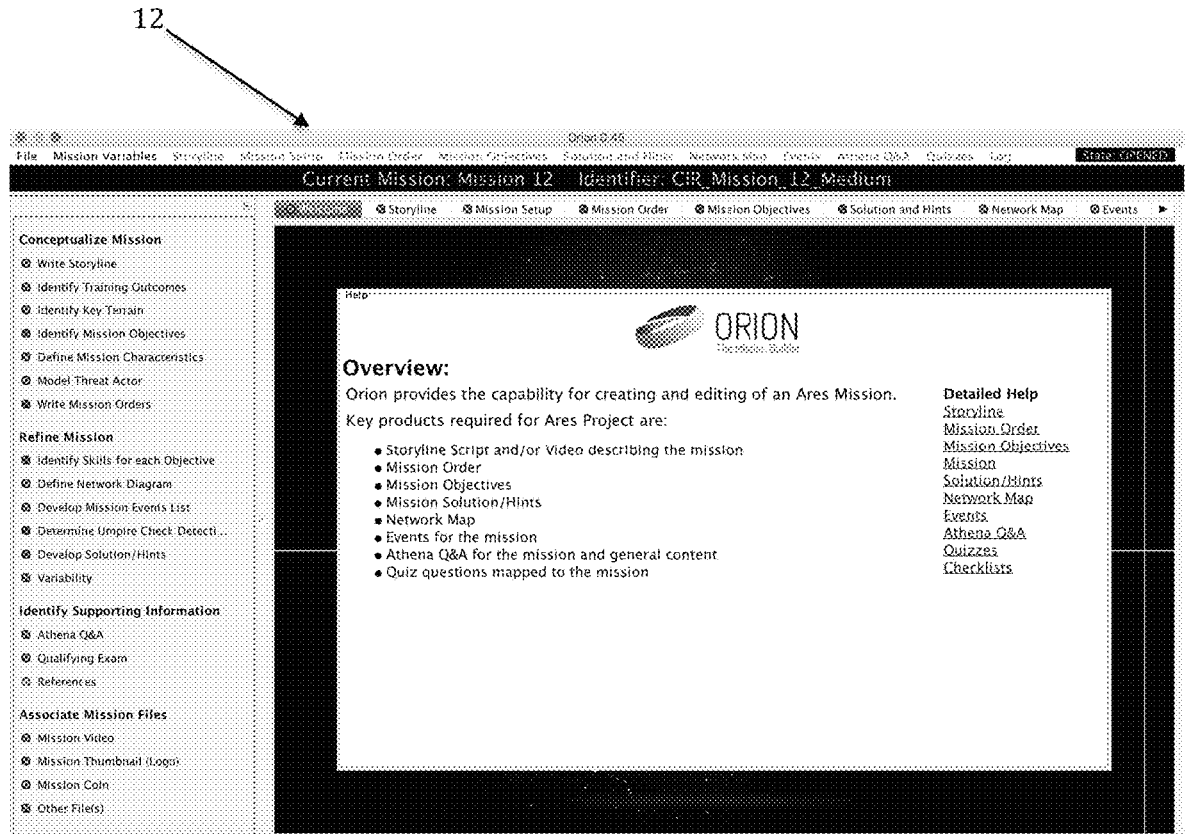
FIG. 1 illustrates a graphic user interface according to embodiments of the present invention.

FIG. 1 illustrates one embodiment of aspects of the present invention, wherein the invention is referred to as the "Orion" system or tool. Aspects of the invention preferably comprise: (1) A mission design methodology. In one embodiment, this methodology is an iterative, collaborative process embodied in the tool that defines everything for a complete cyber training environment. (2) Network templates. The templates define a baseline environment complete with working definitions of the network services/ protocols and unique overlays (#3) to include variation and threat actor (it creates full orchestration to support dynamic provisioning). (3) Ability to define variability (services_0) layer as part of the design process. (4) Event driven process for two-sided training events (offense v defense). (5) Support of real-time assessment data and reporting by defining umpire detections for each event.

Figure 4A:
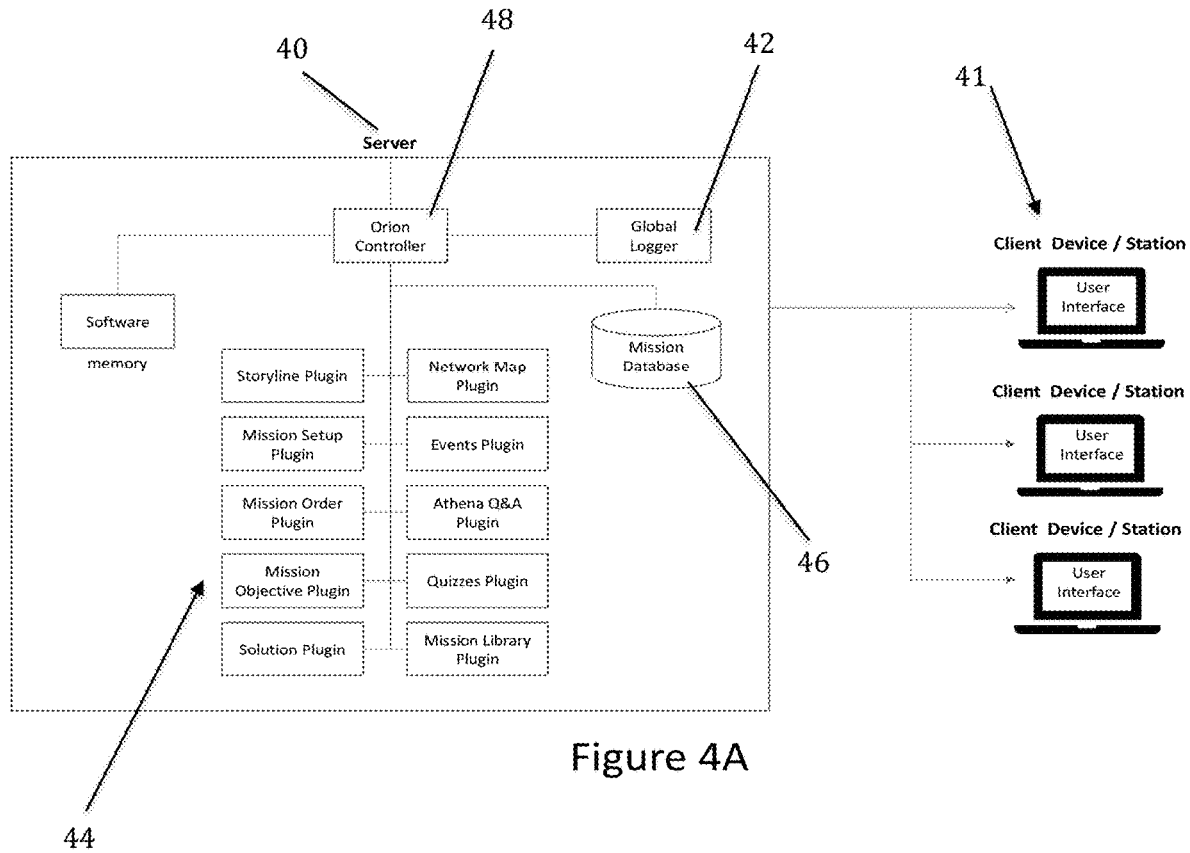
FIG. 4A illustrates a block diagram of a system according to embodiments of the present invention.

In one embodiment shown in FIG. 4A, the system comprises an Orion controller 48, such as associated with a server 40, and one or more clients 41, such as implemented at computing devices such as laptop or desktop computers or the like. The system is preferably configured so that stand-alone clients will run on any machine that supports Java8, so that the server components will run on any machine that supports Java, so that the web client will run on any machine that support a modern browser, and wherein the system tool is implemented as a state machine (such as to simplify the design process and allow a global logger to be maintained). Of course, the system could be configured to operate in other environments.

Figure 4B:
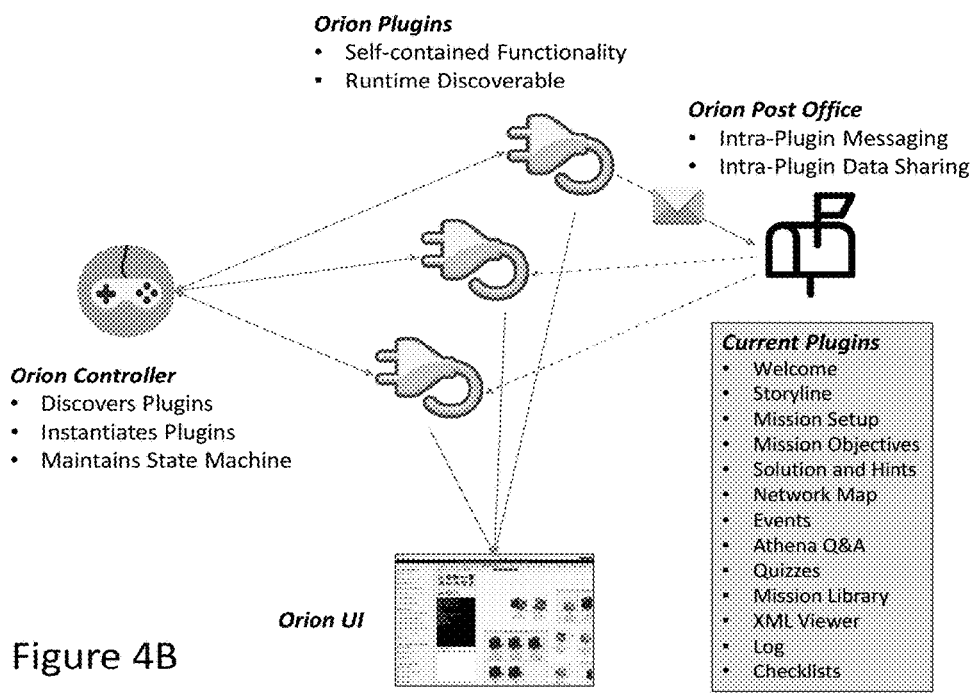
FIG. 4B illustrates a software architecture according to embodiments of the present invention.

As illustrated in FIGS. 4A and 4B, the system may, as described in more detail below, implement a global logger 42, include a plurality of plug-ins 44, include one or more memory devices for storing machine-readable code for execution by the Orion controller 48 (for implementing various of the functionality described herein), and include one or more databases, such as a mission database 46 for storing missions or mission information. The plug-ins 44 may include a storyline plugin, a mission setup plugin, a mission order plugin, a solution plugin, a network map plugin, an events plugin, an Athena Questions and answers plugin, a quizzes plugin and a mission library plugin. As noted above, the system server(s) 40 are preferably configured to communicate with one or more client devices 41. The client devices 41 may display one or more user interfaces, such as the one or more graphical user interfaces described below, such as to provide information to a user and receiving information from a user, including in configuring the various parameters of a mission, etc.

The mission database 46 can include a plurality of preconfigured missions as well as missions that have been saved by mission developers, such that the mission database 46 may grow over time. A mission designer can design a mission from scratch or start from one of the preconfigured or saved missions and use that mission without change or after modifying the mission.

The Orion system is a cyber mission builder and provides the capability for creating and editing of a new cyber scenario or mission that can be used in a training environment or platform. For example, using the system, a user can create scenarios involving how to defend a bank's network from a financial attack using ransomware or a scenario where a hacker tries to steal credit card data. Orion is used to develop new missions and content. It is used by mission designers, not end users of cyber training.

Figure 2:
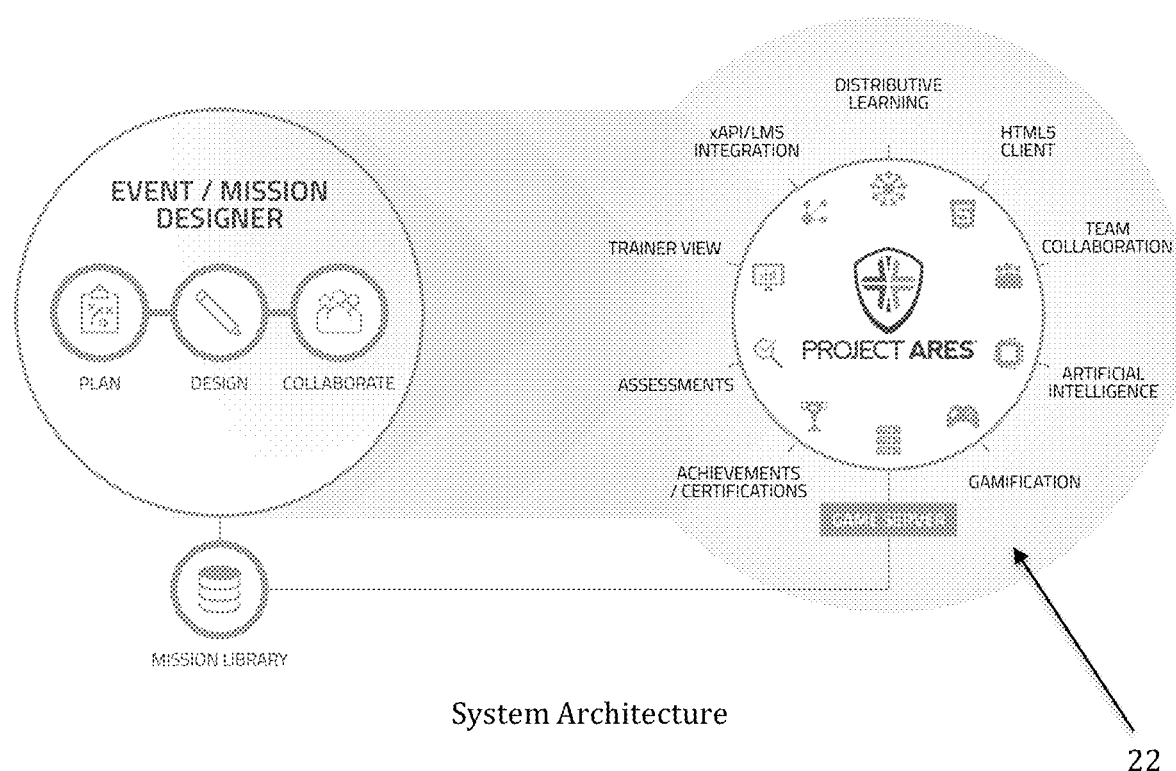
FIG. 2 illustrates a system architecture according to embodiments of the present invention.

FIG. 2 depicts the system of the invention and how it fits within the larger ecosystem of a gamified training system, such as a game system referred to as "Ares". In one embodiment, for example, an Ares gaming system 22 has the components of a game environment, a cyber security domain, an artificial intelligence (AI) components, and a virtualized network. The virtualized network comprises a virtual environment of virtual machines, plus software tools and the like. In one embodiment, Ares starts a game in a phase I where the user selects a specific mission, skill level, learns the mission objectives and uses the interface to perform any necessary mission preparation including taking proficiency quizzes. The game then proceeds to a phase II where the user is immersed in the game trying to accomplish the mission objectives. After the mission play is over, the game transitions to the assessment phase where the player learns what happened and what they did (strengths/weaknesses). This process includes a complete walk through of an after-action report covering the mission in detail.

The Ares game system may include an automated advisor, such as an automated artificial intelligence advisor (such as under the name "Athena"). This advisor may, for example, be capable of providing a player assistance during a game, such as by answering player questions or providing hints, among other things. The Ares game system may also include an "umpire" (which may be implemented as part of the advisor, or separately therefrom). The umpire may, for example, score the player based upon their actions (and/or inactions) during the mission.

Relative to the Ares system (or similar systems), the Orion system of the present invention preferably allows an operator to create or generate different missions (e.g., objective-based assignments within a defined environment, such as a cyber environment which includes a virtualized network).

In one embodiment, the high-level architecture of the system is a plugin paradigm using a state-machine lifecycle. Each plugin 44 is an independent wizard for adding/ modifying one aspect of the mission. The plugins 44 are maintained by a controller which messages state changes with each plugin. There is a general method for communications between plugins. A global logger 42 is maintained.

A top-level state machine (TLSM) is implemented that supports the mission building guidelines. The purpose of the TLSM is to provide a concrete implementation of the guidelines. It will provide a means to collect and store artifacts that are produced outside of the Orion environment (e.g., mission video, adversary attack motivations, mission art, . . . )

The status of the TLSM is maintained by the Orion controller and is visible in a panel on the graphical user interface (GUI). The panel can be hidden/displayed at any time.

Orion Controller

Figure 3:
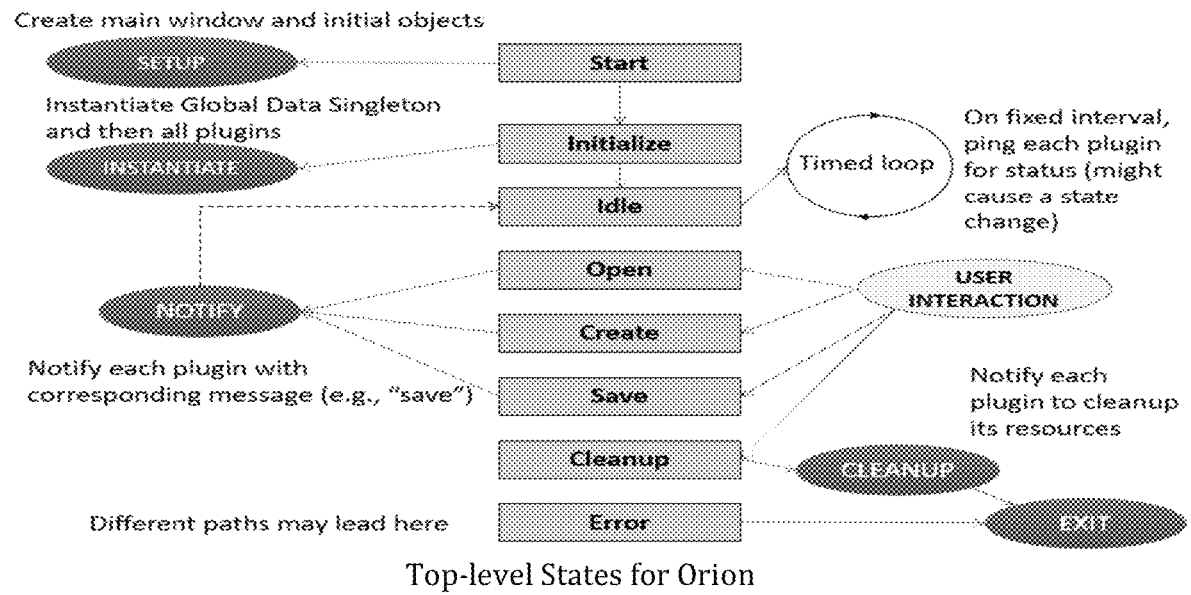
FIG. 3 illustrates how a controller will operate in different states according to embodiments of the present invention.

The Orion or system controller 48 provides the glue for the application—keeping track of what is going on and communicating to individual plugins 44 as needed. Table 1 describes the Orion System Controller States. FIG. 3 and Table 1 illustrate how the controller 48 will operate within these states.

TABLE 1

| State | Actions |
| --- | --- |
| Start | The application is started. The main window is created. The Controller and Logger are instantiated. The environment is probed (username, machine name, OS, etc). Command arguments are processed. |
| Discover | Appropriate directories are searched for wizard plugin class files. |
| Initialize | Each plugin is instantiated with a reference to the Controller, a reference to the global Logger, a reference to the main menu bar, and a graphical container for it to display its content. A tab is generated for the plugin on the main window as in FIG. 1. |
| Idle | There are no pending user commands to process at the main window or main menu level. |
| Open | Open an existing mission |
| Create | Create a new mission. The controller will create a data directory for each plugin under the main mission directory. |
| Save | The loaded mission is being saved. This requires integrating the saves of each plugin |
| Cleanup | The application is shutting down |
| Error | An unrecoverable error has occurred |

Global Data Singleton

Orion has some data which is "shared" among the plugins. To maintain the integrity of the data, the data is preferably maintained by a (set of) global data singleton(s). In one embodiment, the following data is included:

(1) Master Services List from database
(2) Master Detections List from database
(3) Master Umpire Check Callback Functions from database
(4) Master Service Events from database
(5) Master Adversary Events from database
(6) Master Malware List from database
(7) Master Badges/Skills List from database
(8) Master Quiz Questions List from database
(9) Master Virtual Machine (VM) Templates from database
(10) Master Tools List from database
(11) Current Mission Objectives and associated Umpire Detections
(12) Current Mission Network Diagram Node Information
(13) Current Mission service/detection variable data The master data is preferably read in when the singleton is instantiated. At this time, the singleton will check to see if there are updates to the master from the mission design databases and use those.

Current mission data is read in when a mission is opened (or structure created when new mission is created).

Any data which may be editable within Orion is accessed in a synchronized manner.

Plugin States

Figure 5A:
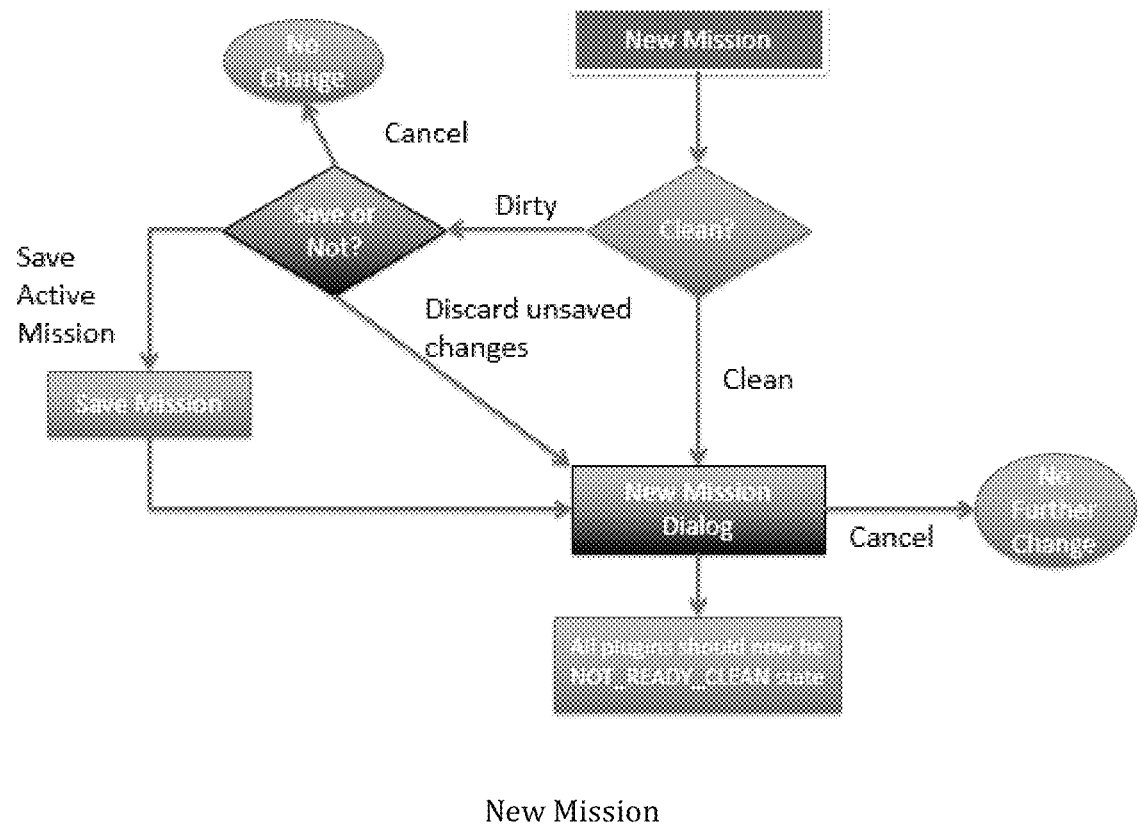
FIGS. 5A, 5B and 5C illustrate changing plug-in states when switching to a different mission according to embodiments of the present invention.
Figure 5B:
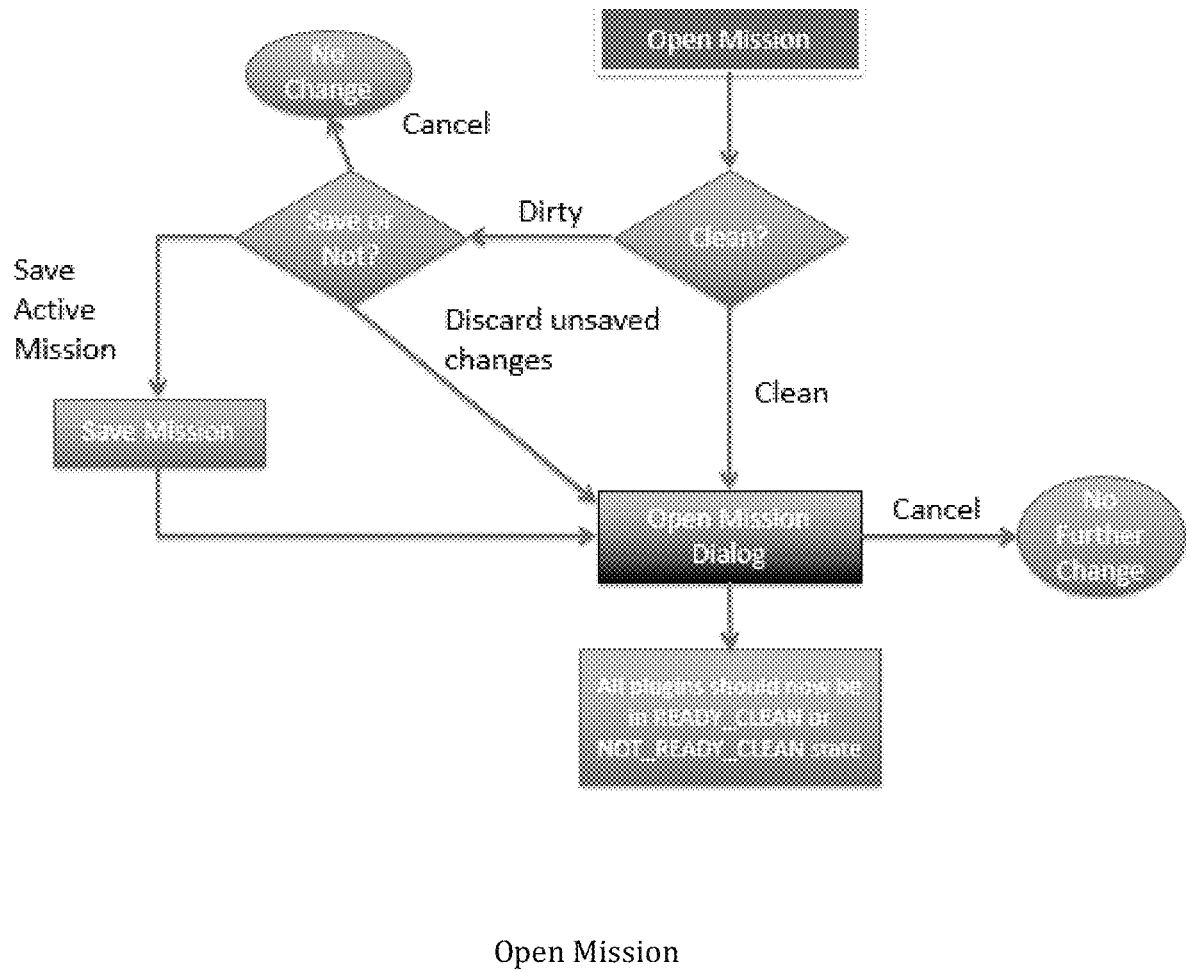
Figure 5C:
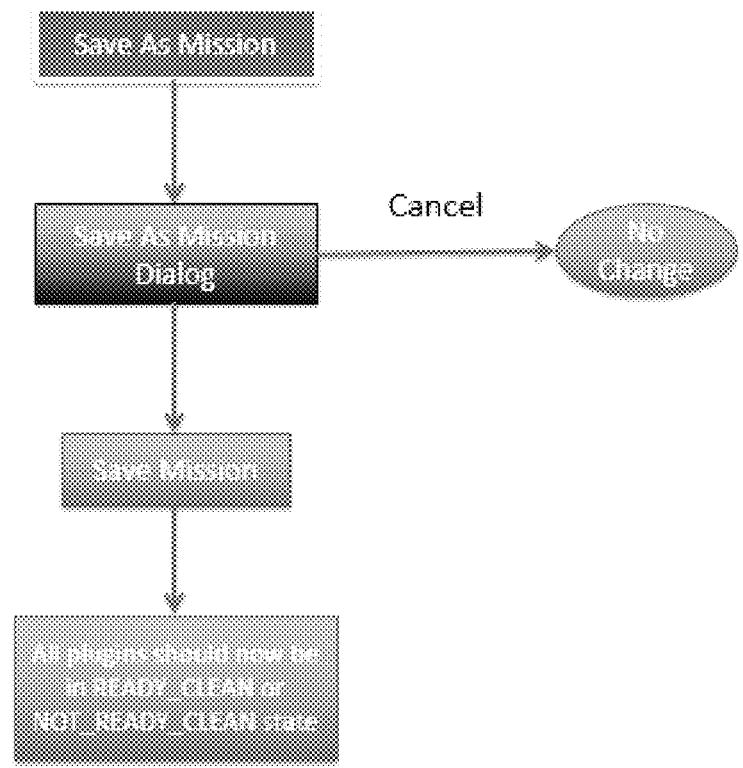

At startup, all plugins are disabled until a mission is opened or created. Once a mission is active, each plugin tab 12 indicates the state of that plugin, such as shown in table 2. These plugin states are used when switching to a different mission to determine action needed, such as illustrated in FIGS. 5a, 5b, and 5c (wherein dark gray boxes indicate that a dialog box is invoked). The plugins are instantiated by the Orion controller when a mission is opened or created.

TABLE 2

| PLUGIN STATE | COMMENT | TAB LED |
| --- | --- | --- |
| READY_DIRTY | Plugin has all the data it needs, but it has unsaved changes. | Green Flashing |

TABLE 2-continued

| PLUGIN STATE | COMMENT | TAB LED |
| --- | --- | --- |
| READY_CLEAN | Plugin has all the data it needs, no save needed. | Green Solid |
| NOT_READY_DIRTY | Plugin does not have all the data it needs, and it has unsaved changes. | Red Flashing |
| NOT_READY_CLEAN | Plugin does not have all the data it needs, but no save is needed. | Red Solid |

Inter-Plugin Communication

A general method of plugin to plugin communication is provided. In one embodiment, this communication is a messaging mechanism similar to a post office. One plugin posts a message (e.g., mission objectives when objective added) and other plugin(s) gets the post and processes it as appropriate (e.g., solution and hints to add another page for the new objective).

The processing may use threads with a behind-the-scenes wait-notify mechanism. In one embodiment, messages are not received on the GUI thread, so no direct drawing occurs as a result.

Messages

The PluginMessage class provides the structure for the message to be sent. A message consists of: (1) Source (the plugin that sent the message); (2) Source Name (the name on the plugin tab; (3) Message ID (defined in PluginMessageType enum); and (4) Payload (any object to send—simple or complex).

Messages are not sent over a socket so the payload is not being serialized—the actual object arrives at the other plugins who in principal could corrupt the object.

Message Types

PluginMessageType enum contains the IDs for the messages. Current values may be: (1) Objectives and (2) Text.

Sending Messages

Every plugin has a method postMessage(MessageType type, Object payload). This creates a message with the plugin as the source, the plugin tab name as the source name, and the type and payload given.

Example: postMessage(MessageType.objectives, objectives) where objectives is an object that contains the objectives.

All plugins get the message. Those that have need of it use it, others ignore it.

The Log Plugin

The log plugin simply logs every message it gets—keeping a record of messages posted in the log tab.

Processing Messages

Every plugin implements the interface IMessageProcessor. It contains one method processMessage(PluginMessage message). The default implementation will do nothing. Override processMessage to be able to handle message(s). For example:

```
@Override
public void processMessage(PluginMessage message) {
        switch(message.getType( ) {
        case objectives:
                dosomething(message.getPayload( );
                break;
        case (whatever)
                break;
        }
}
processMessage is called on a separate (non-GUI) thread.
```

Webswing Configuration

When Orion is configured as a thin client using the web browser to deliver Orion capability, Webswing is used to present the Orion experience to the user. Webswing provides a Javascript client, which mirrors a running Java app (such as Orion) on the server. Webswing captures Swing draw calls, and sends it to the Javascript client via a secure websocket connection, which then mirrors the draw call.

Figure 6:
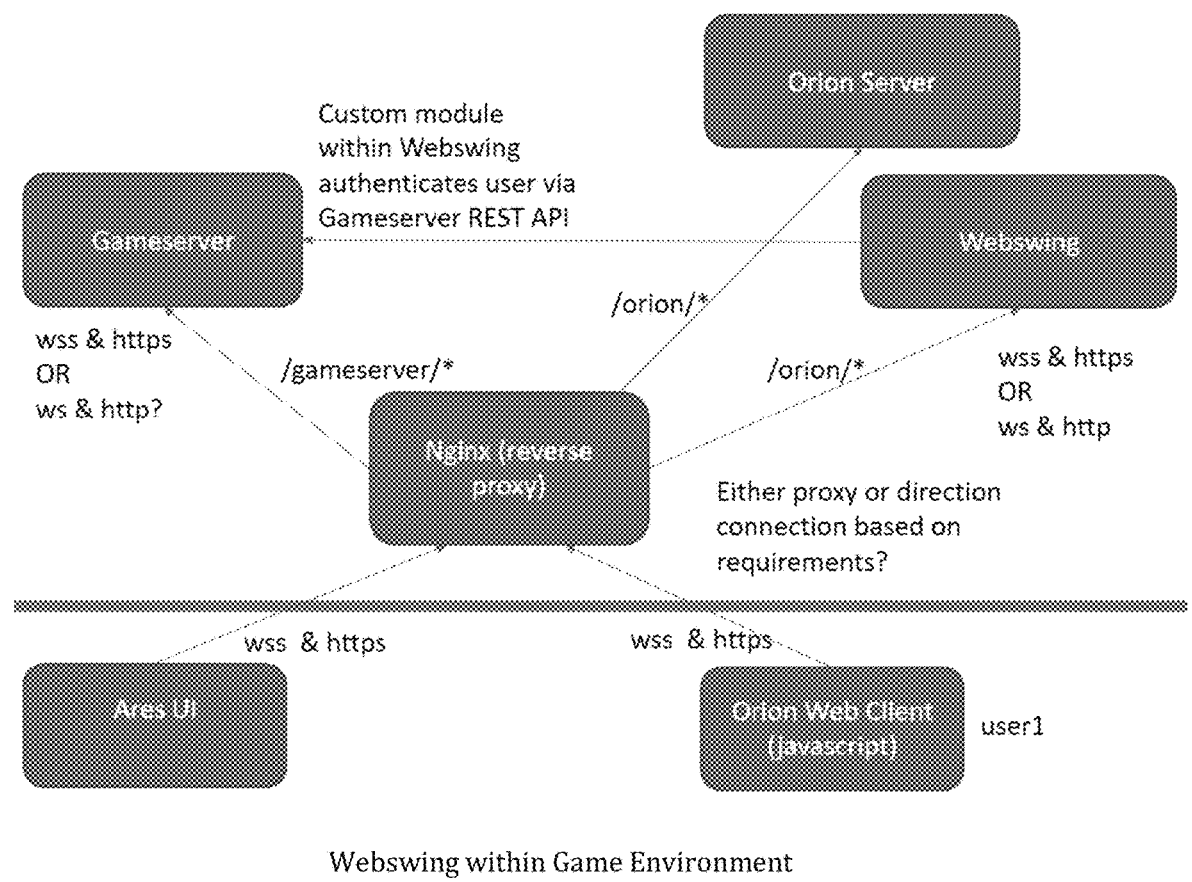
FIG. 6 illustrates communication between a user and the server using Webswing according to embodiments of the present invention.

FIG. 6 depicts the communications between the user and the server using Webswing.

Security Model

Data in Transit

Data which traverses an external network (not localhost) will utilize TLS v1.2. This is between the Mission Server and Orion. The connections utilize both client and server authentication using certificates signed by a recognized Certificate Authority.

Mission Building

Mission Definition

Figure 7:
FIG. 7 illustrates a create new mission top level graphic according to embodiments of the present invention.

Basic information for the mission is defined when the mission is created. These parameters include one or more of:

(1) Organization
(2) Mission Name
(3) Mission Description
(4) Mission Number as a unique identifier when combined with an organization
(5) Mission Level of Difficulty As illustrated in FIG. 7, this information may be presented via a game environment on a world map, where the user can select the mission to play.

Create New Mission

Figure 8:
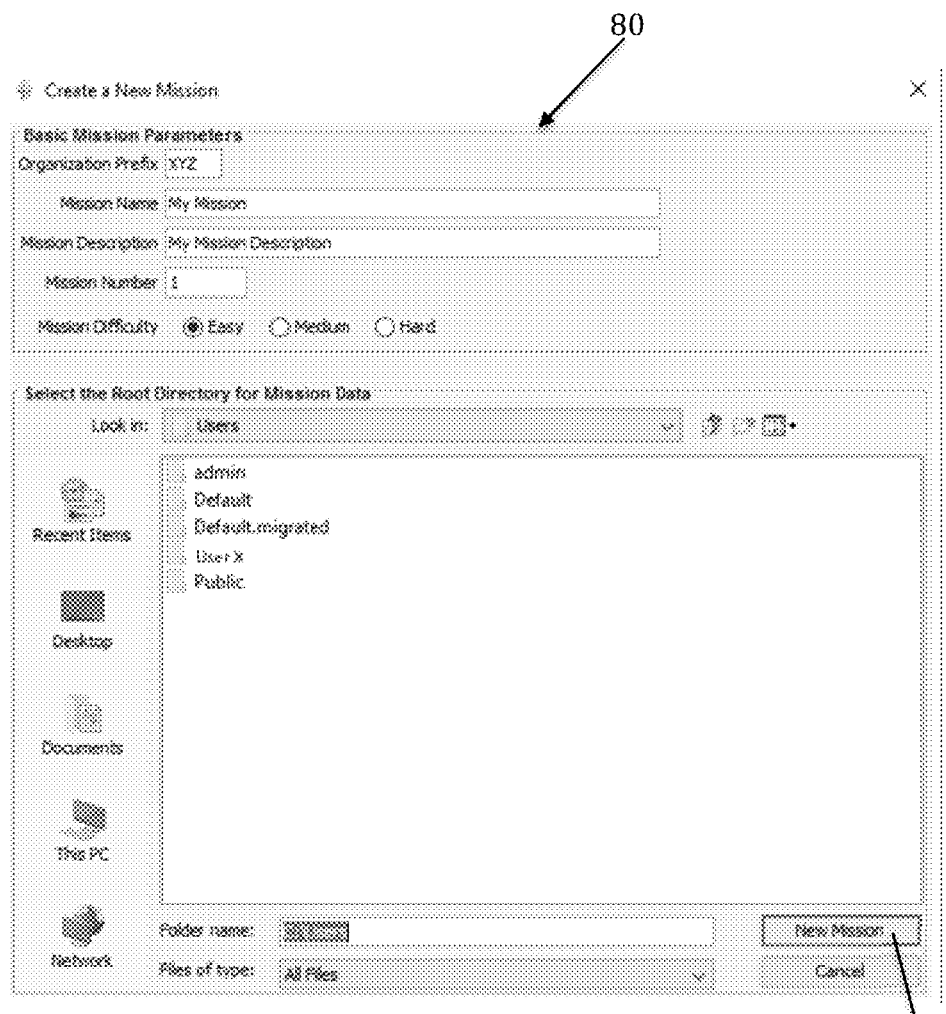
FIG. 8 illustrates a graphic user interface for creating new missions according to embodiments of the present invention.

One example of a methodology for creating a new mission is as follows:

Click File→New Mission from the mission setup plugin in FIG. 1 . . . to bring up the Create New Mission dialog 80 (see FIG. 8).

Enter the desired Organization Prefix, Mission Name, Mission Description, Mission Number and choose a Mission Difficulty.

Select/browse to the place where the mission is to be stored and click the New Mission button 82. A folder is created in the selected folder titled <prefix>_mission_<number>_<difficulty> (e.g. XYZ_mission_1_Easy).

Click the Cancel button to exit the dialog without creating a mission.

Open Existing Mission

Figure 9:
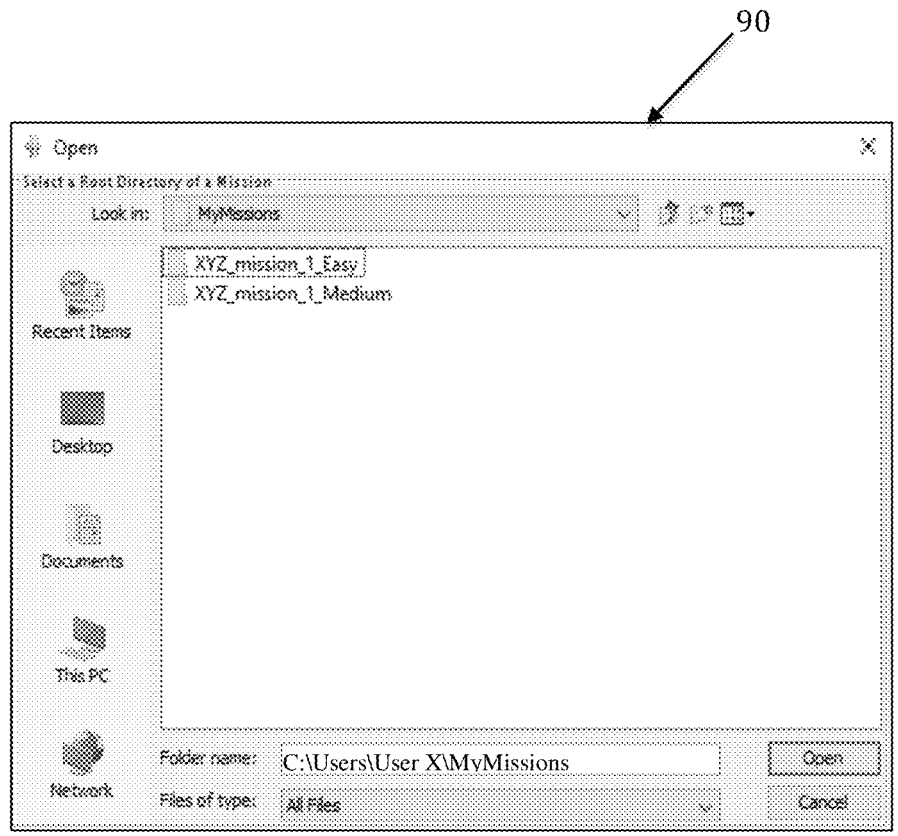
FIG. 9 illustrates a graphic user interface for opening an existing mission according to embodiments of the present invention.

One example of a methodology for opening an existing mission is as follows:

Click File→Open Mission . . . to bring up an Open dialog 90 (see FIG. 9).

Browse to the folder containing the desired mission.

Select the mission and click the Open button. Orion tabs will populate with the current data of the mission.

Click the Cancel button to exit the dialog without opening a mission.

Unsaved Changes

Figure 10:
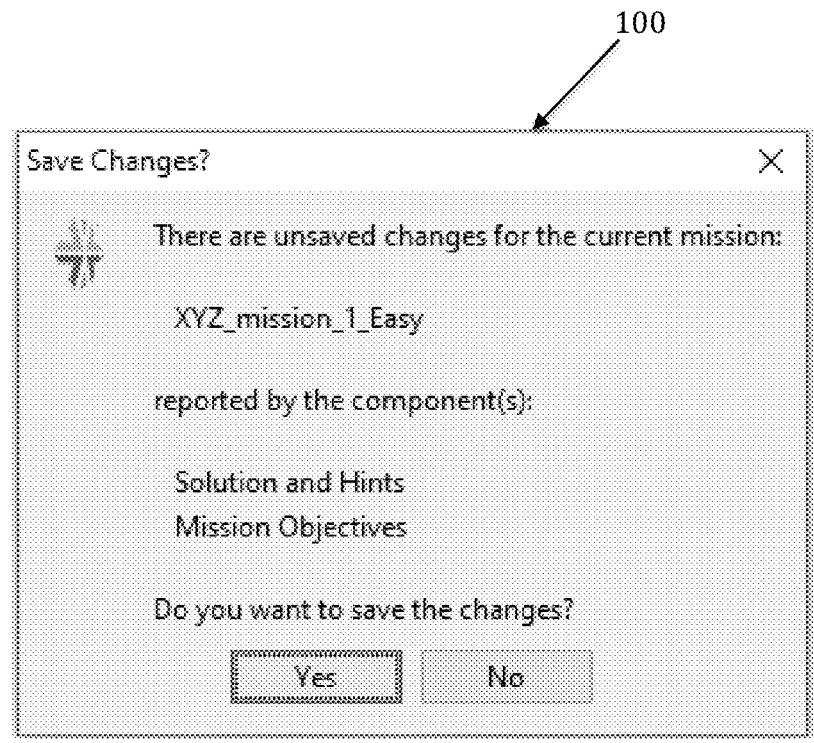
FIG. 10 illustrates a save changes dialog according to embodiments of the present invention.

When switching to another mission (either by creating a new mission or opening a different existing mission) or exiting the Orion application when unsaved changes exist, the Save Changes dialog 100, such as illustrated in FIG. 10, may be displayed.

Click the Yes button to save the changes prior to switching mission or exiting Orion. Click the No button to switch or exit without saving the changes.

Save Mission

To save the current mission, click File→Save Mission . . . . The mission data for each tab is saved in a folder under the main Mission folder.

Many of these tabs also provide for save of just their associated information (see appropriate section in this document).

Copy Mission

Figure 11:
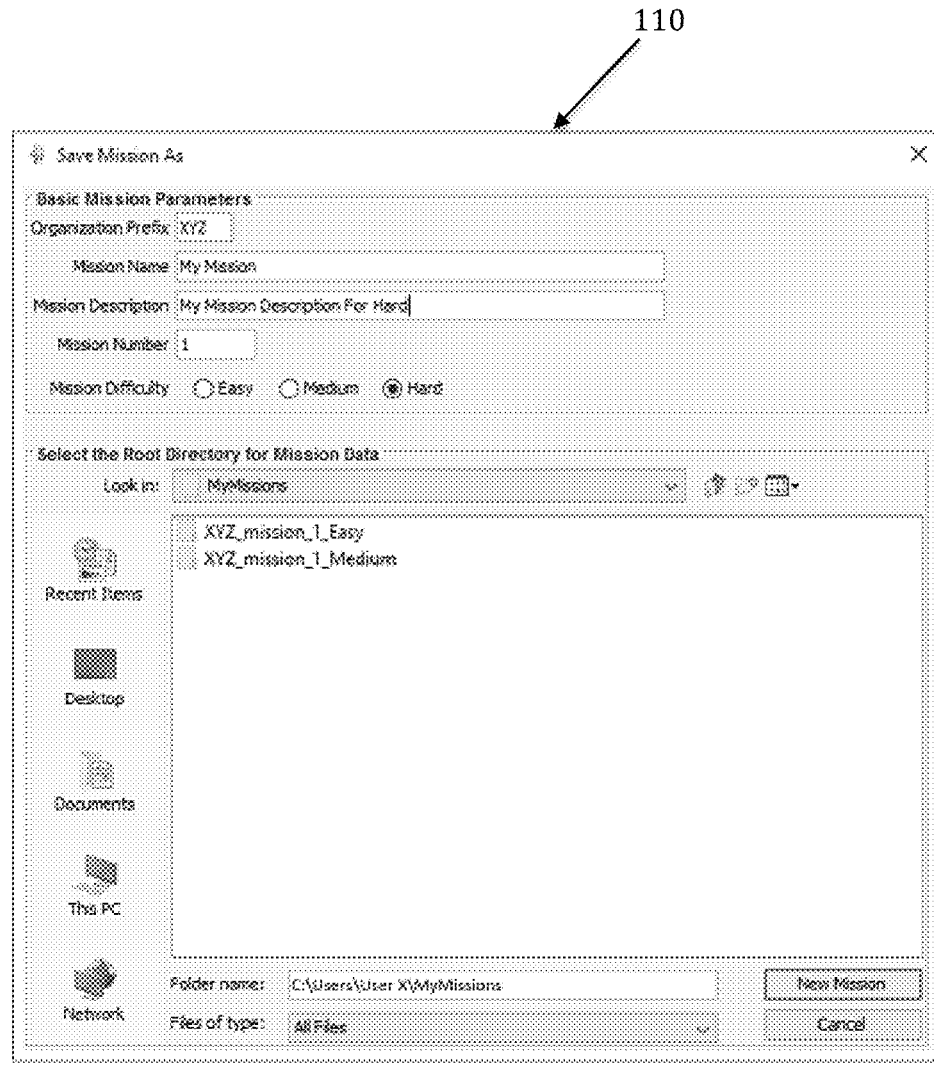
FIG. 11 illustrates a graphic user interface for copying a mission according to embodiments of the present invention.

To copy the currently loaded mission to a new one,

Click File→Save Mission As . . . to bring up the Save Mission As dialog 110 (see FIG. 11).

Edit the Organization Prefix, Mission Name, Mission Description, Mission Number and Mission Difficulty as desired using the dialog 110.

Select/browse to the place where the mission is to be stored

Click the New Mission button. The current mission data is copied to the new mission.

Click the Cancel button to exit dialog without creating a copy of the mission.

Advanced Mission Settings

In a preferred embodiment, control parameters for executing the Orion mission are defaulted to typical values and can be modified by the Mission Designer.

Figure 12:
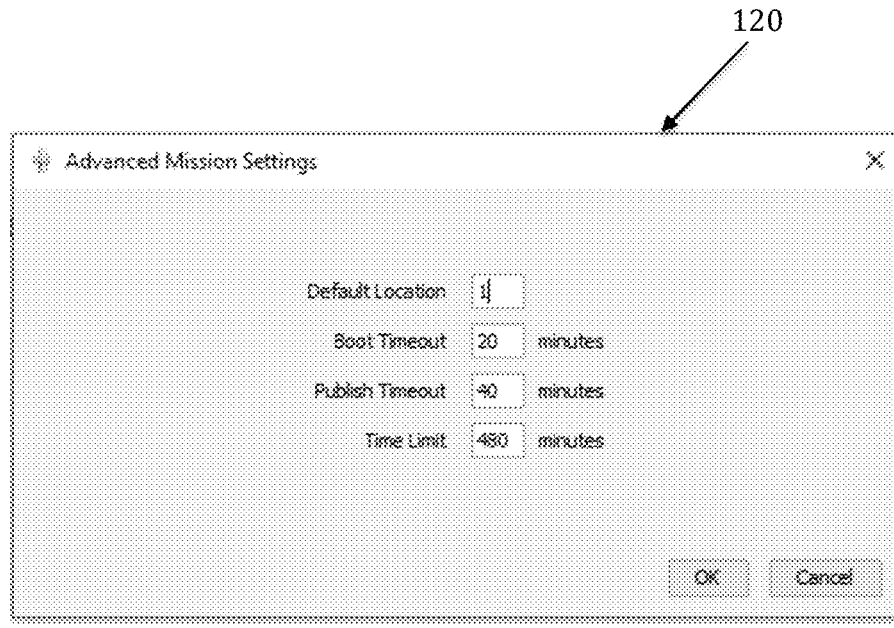
FIG. 12 illustrates an advanced mission setting dialog according to embodiments of the present invention.

To modify the parameters:

Click File→Advanced Mission Settings . . . to bring up the Advanced Mission Settings dialog 120, FIG. 12.

Default Location: If you have multiple locations where your virtual machines (VMs) are stored, you can select which location by numeric value here.

Boot Timeout: If the virtual machines in the mission don't start up within this time, the mission will fail. If you have a very large number of virtual machines, this may need to be a larger value.

Publish Timeout: If all the umpire checks, orchestration and transformations don't load and complete within this amount of time, the mission will fail. If you are doing a lot of manipulations of your base virtual machines, you may want a longer duration for a publish timeout.

Time Limit: After this period of time, your mission will suspend and all your VMs are suspended along with it.

Enter desired changes to the parameters and click the OK button. The dialog closes. Parameter changes is saved when the mission is saved.

Click the Cancel button to close the dialog without making any changes.

Exporting Mission Definition

The following items may be included in the export:

Mission Orders→orders.xml (in export/Assets folder)

Objectives with associated skills and umpire checks, solutions and hints→services_0.yaml Network Map→out.xml (in export/Network_Map folder)

Events→msel.json (in export/Events folder)

Athena Q&A defined in this mission (Mission_Questions.txt, General_Questions.txt, Athena_Questions.txt)

Quizzes defined in this mission (quiz.txt)—a Quiz Q&A.csv file is also created for easy viewing.

Mission parameters (vem.yaml, vsphere.yaml)

Some tabs also provide for import and/or export of just their associated information (see appropriate section in this document).

Figure 13:
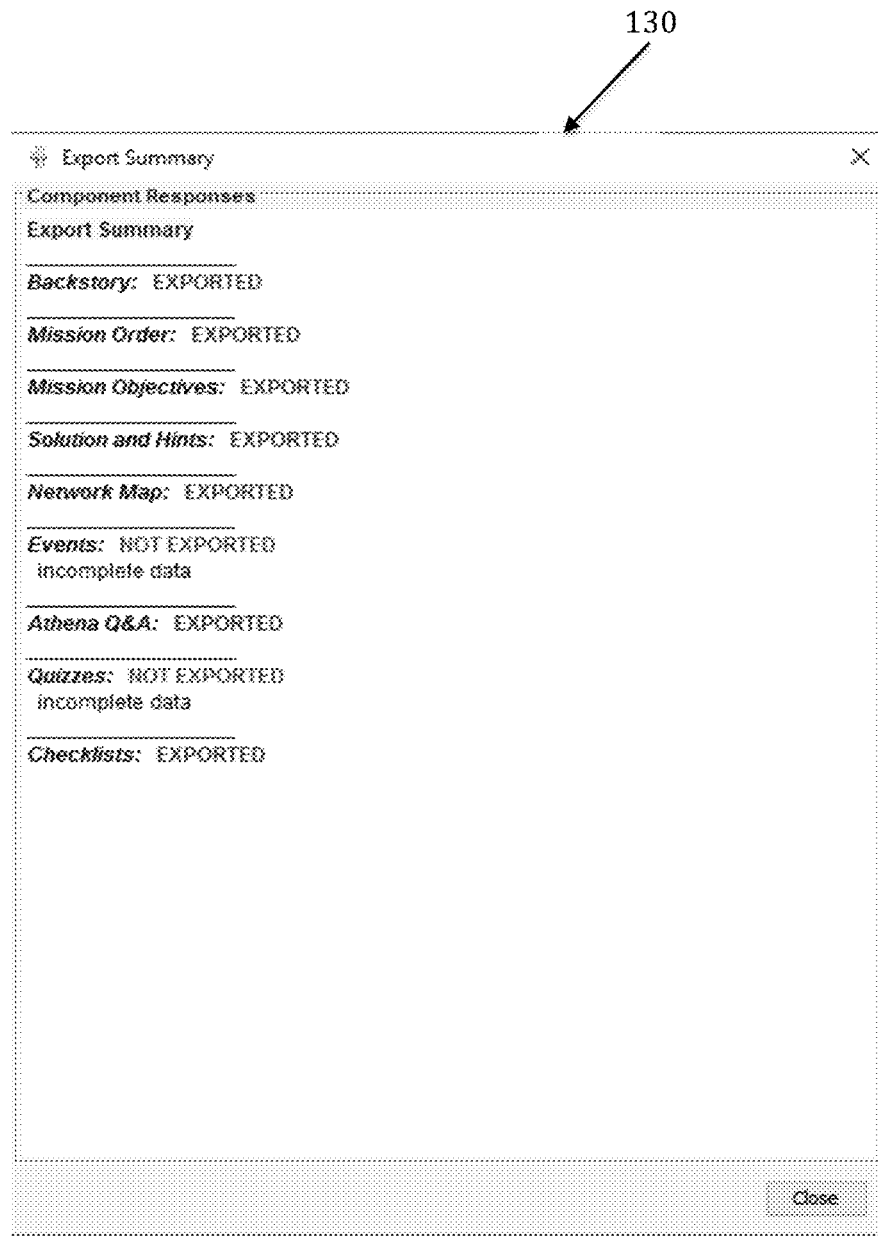
FIG. 13 illustrates an export mission summary dialog according to embodiments of the present invention.

To export Orion mission information, click File→Export Mission. The Export Summary dialog 130, FIG. 13, is displayed upon completion of export indicating the status of each component.

Click the Close button to close the dialog. The appropriate file(s) is created in the export folder under the main mission folder as illustrated in FIG. 14.

Mission Storyline

Figure 15:
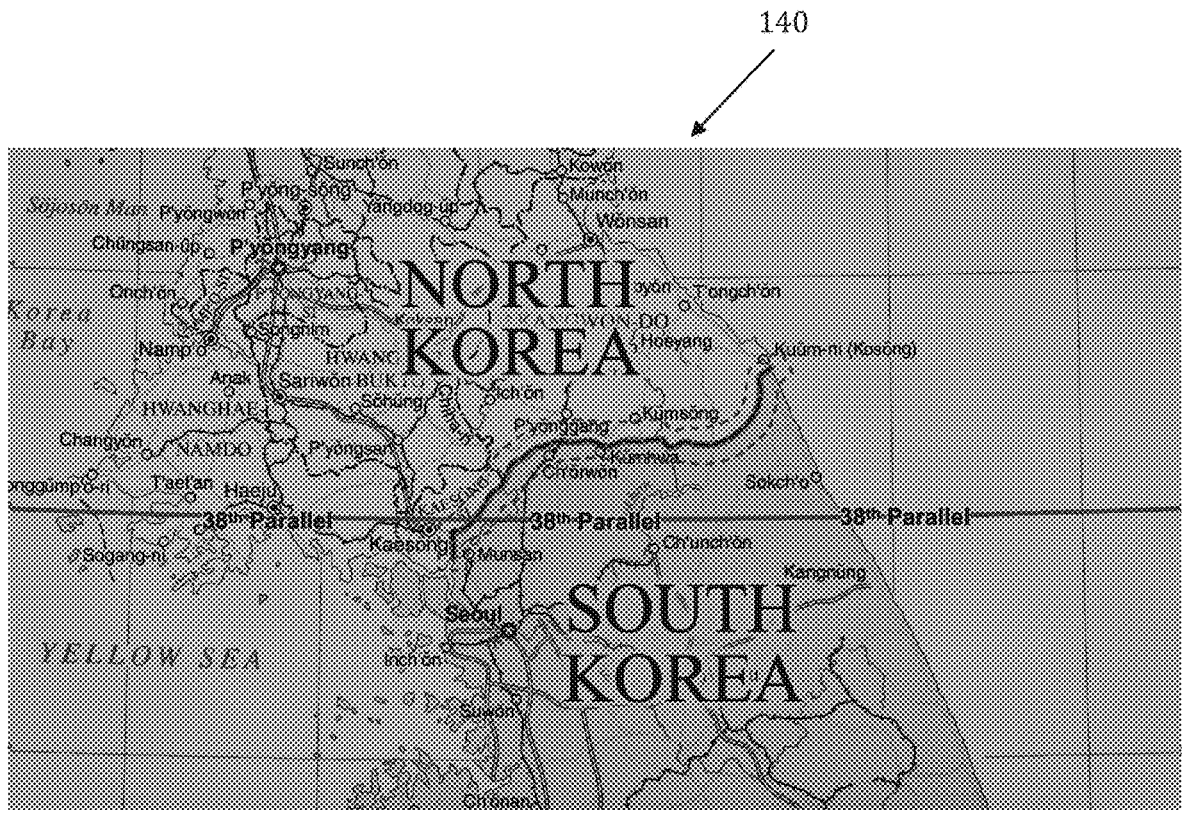
FIG. 15 illustrates a storyline video or text according to embodiments of the present invention.

The storyline component or backstory of the system (an introduction to the user or player of the mission which provides them information regarding the mission, such as a background or plot for the mission) may include a video 140 as depicted in FIG. 15 and/or text which describes the background for the mission as the introduction when the mission is selected.

To access the Storyline, click on the Storyline tab in the interface of FIG. 1.

Storyline Menu Items

Figure 16:
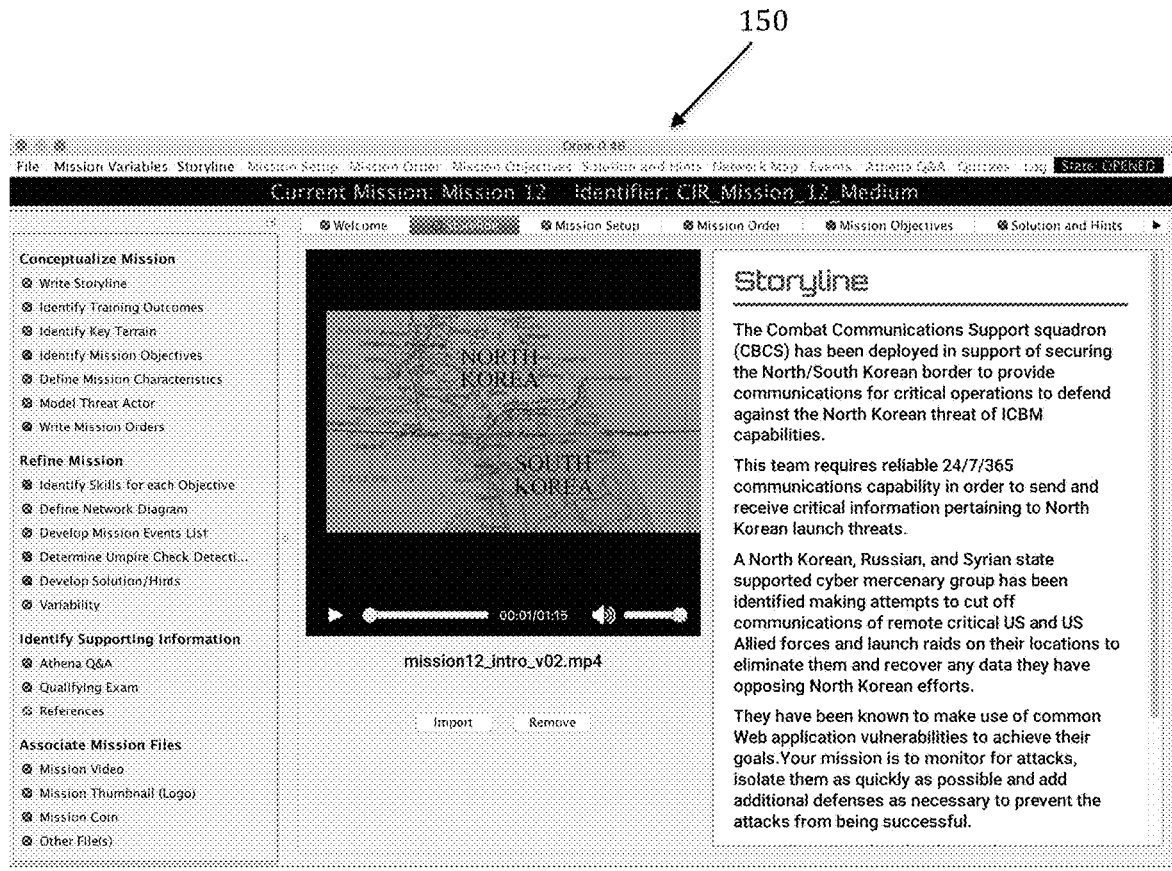
FIG. 16 illustrates a storyline interface according to embodiments of the present invention.

When the Storyline tab is selected, the items under the Storyline Menu 150 at the top of the page are available as shown in FIG. 16.

Import Video

To import a video for the mission,

Click Storyline→Import Video File . . . to bring up an Open dialog. (Clicking the Cancel button will close the dialog and without continuing the import process.)

Browse to the folder containing desired video file.

Select the video file and click the Open button. The video is imported to the mission and displayed/started in the Video Player area of the tab.

Click the Cancel button to exit the dialog without importing a video file.

Remove Video

To remove a video from the mission,

Click Storyline→Remove Video File as shown in FIG. 16 to bring up a Remove Video File? dialog.

Click the Yes button to remove the video. The video is removed from the mission. (Or click the No button to cancel removal.)

Save Storyline

Click Storyline→Save Storyline Data to save the current information on this tab for the mission.

Defining the Storyline

The storyline gives the context for the mission in the form of introductory video and or text depicted in FIG. 16.

Video Player Area

The Video Player area is where the mission video can be viewed.

Click the Play/Pause icon to play or pause the video.

The Now Playing area provides information about the location/size/duration of the video.

Storyline Text

Enter any desired storyline text into the text area.

Mission Order

Figure 17:
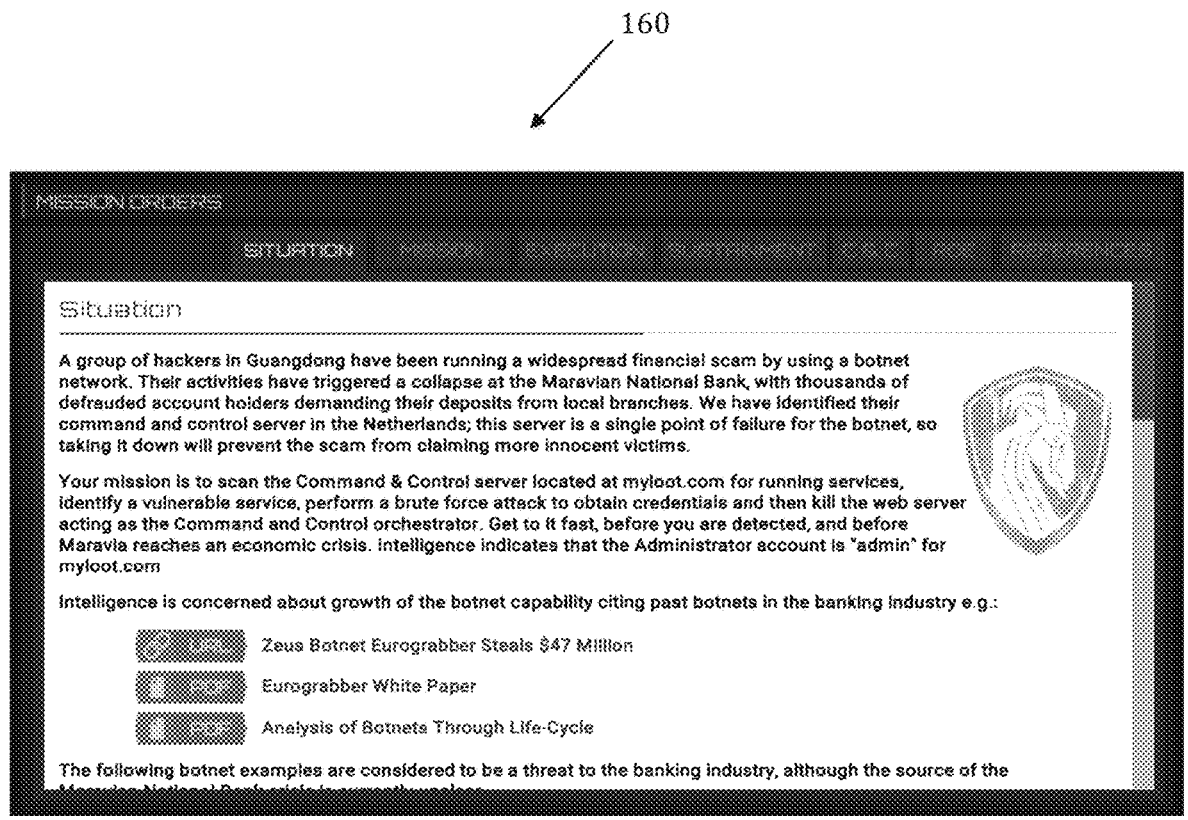
FIG. 17 illustrates a mission orders interface in a game environment according to embodiments of the present invention.
Figure 18:
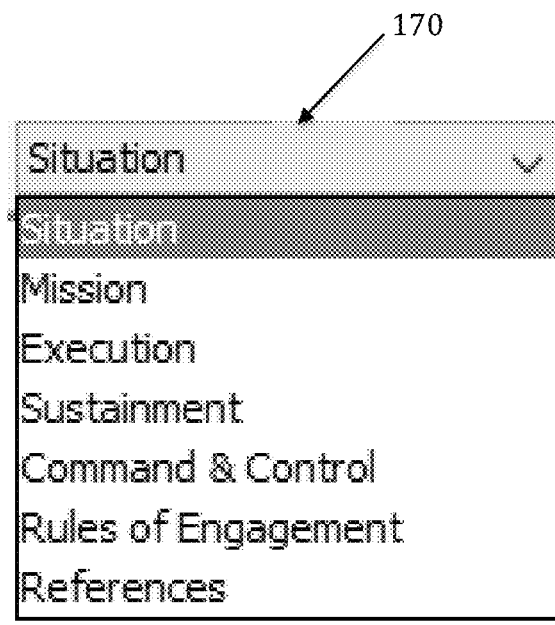
FIG. 18 illustrates a define mission order dialog according to embodiments of the present invention.

The Mission Order component may define the following areas for the mission as depicted in the mission orders menu 160 of FIG. 17 and the dialog 170 of FIG. 18:

(1) Situation—Describe overall scenario and threat intelligence information (2) Mission—Describe the specific mission and skills or core competencies required to go on mission (3) Execution—Describe the purpose, key tasks, end state and concept of operations to include user credentials and tools (4) Sustainment—Describe how long the mission should take and any requirements on the end of the mission (5) Command and Control (C&C)—Describe who commands this mission above the Team Lead and any reporting requirements (6) Rules of Engagement (ROE)—Describe any rules about the virtual environment to include out-of-bounds list, tools, traffic generation and key services that must be maintained (7) References—for each mission objective or task in the Execution description above, provide a list of references that players should read.

These orders are shown in the game environment, such as in the format illustrated in FIG. 17, preferably prior to playing the game.

To access Mission Orders, click on the Mission Orders tab of FIG. 1.

Mission Order Menu Items

When the Mission Orders tab is selected, the items under the Mission Order Menu at the top of the page are available.

Save Mission Order

Click Mission Order→Save Mission Order to save the current information on this tab for the mission.

Import Mission Order

To import the Mission Order from another mission,

Click Mission Order→Import Mission Order from the game environment to bring up an Open dialog. (Clicking the Cancel button will close the dialog and without continuing the import process.)

Browse to the folder containing desired mission orders.xml file.

Select the desired file and click the Open button. Any current mission order information is replaced with information from the selected file.

Click the Cancel button to exit the dialog without changing the current mission order information.

Export Mission Order

Click Mission Order→Export Mission Order to save the current Orion Mission Order in the correct format. An Export Successful dialog is presented The orders.xml file is saved in the Assets folder within the export folder under the main mission folder.

Defining the Mission Order

Select the desired area from the list in the toolbar 170, such as illustrated in FIG. 18, for which to define the mission order. The appropriate "page" of data is displayed with any current text.

Figure 19:
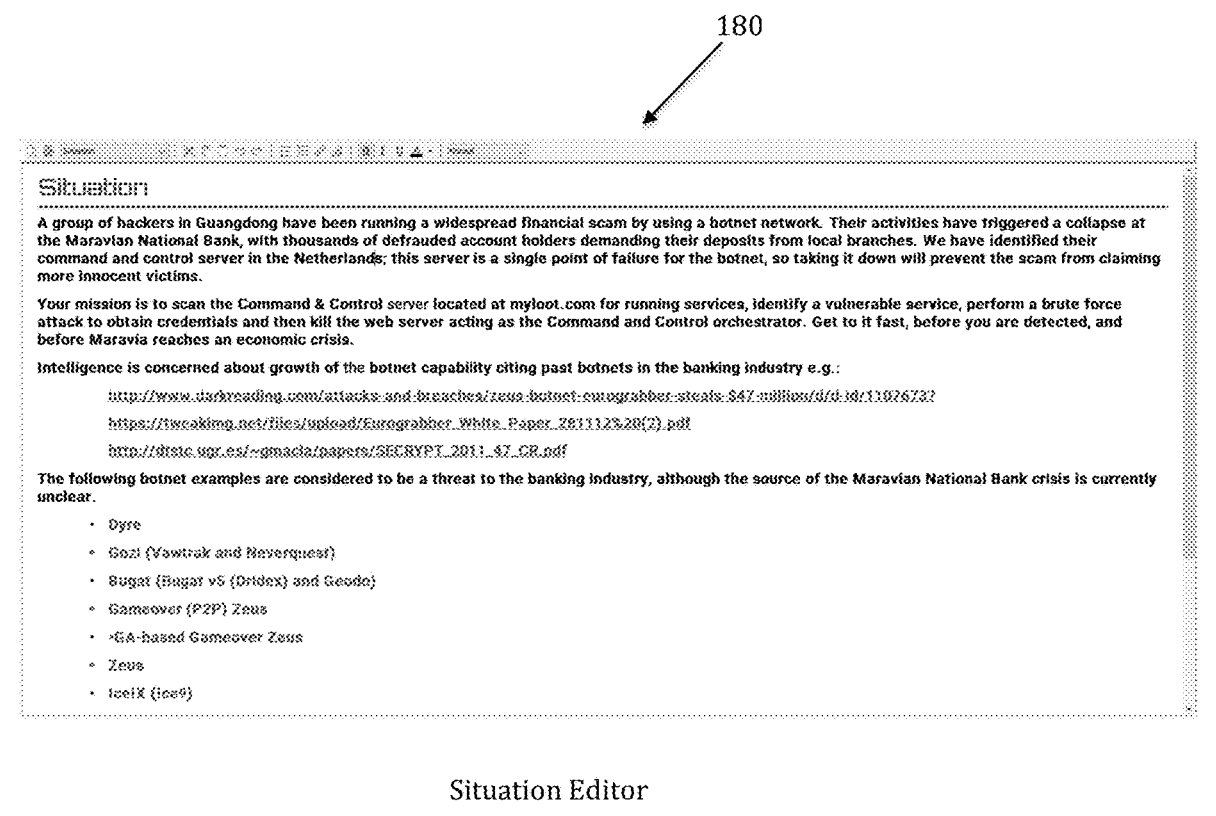

Use the edit area to describe this area of the mission order as depicted in FIG. 19 by using the Orion situation editor 180 as described later in this document.

Mission Order Page Settings

Mission Order Page Settings provides access to settings for the Mission Order page. Currently the Image Type may be set.

Figure 20:
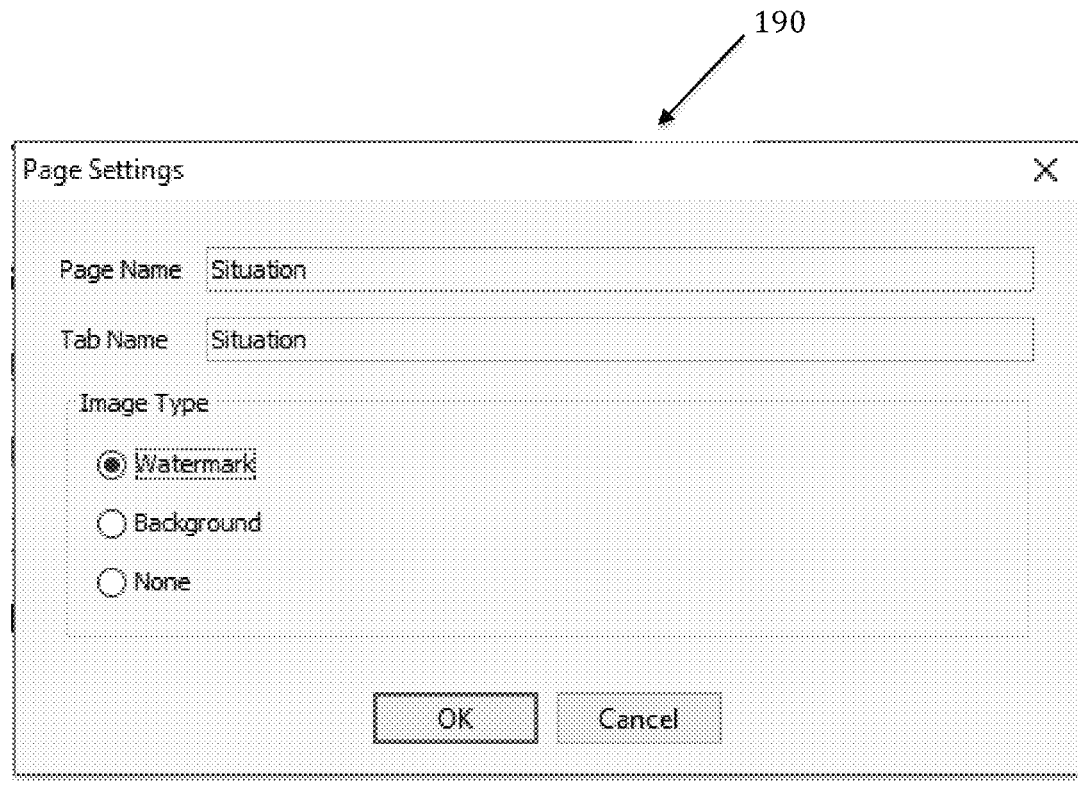
FIG. 20 illustrates a mission order page settings dialog according to embodiments of the present invention.

Click the Settings icon to bring up the Page Settings dialog 190, FIG. 20.

Select the image type among the choices watermark, background and none for this page and click the OK button. The settings are changed and stored with the Mission Order page.

Click the Cancel button to close the dialog without making any changes.

Mission Objectives

The Mission Objectives component defines the objectives for the mission and associated badges/skills and umpire checks along with relative scoring.

Figure 21:
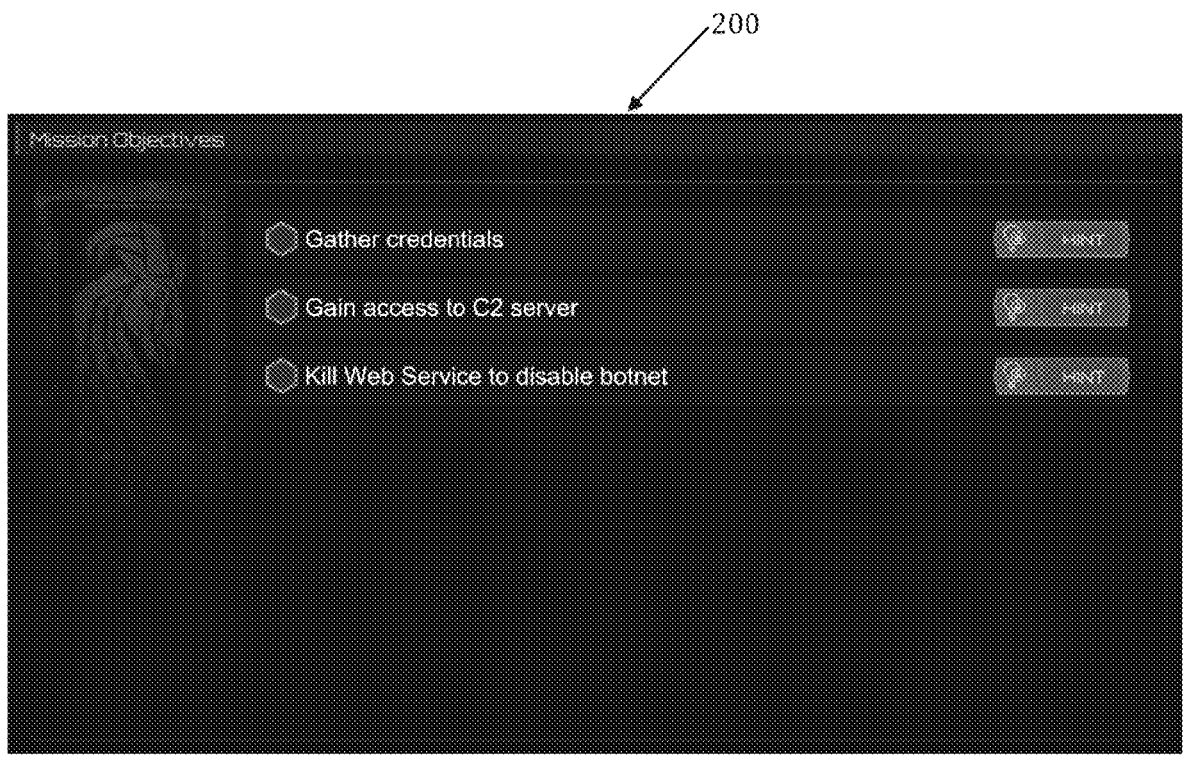
FIG. 21 illustrates a mission objectives interface according to embodiments of the present invention.

Mission objectives may be viewed in the game environment while playing the game as shown in the mission objectives interface of FIG. 21. Points are associated with each objective/skill.

To access the Mission Objectives, click on the Mission Objectives tab of FIG. 1.

Mission Objectives Menu Items

Figure 22A:
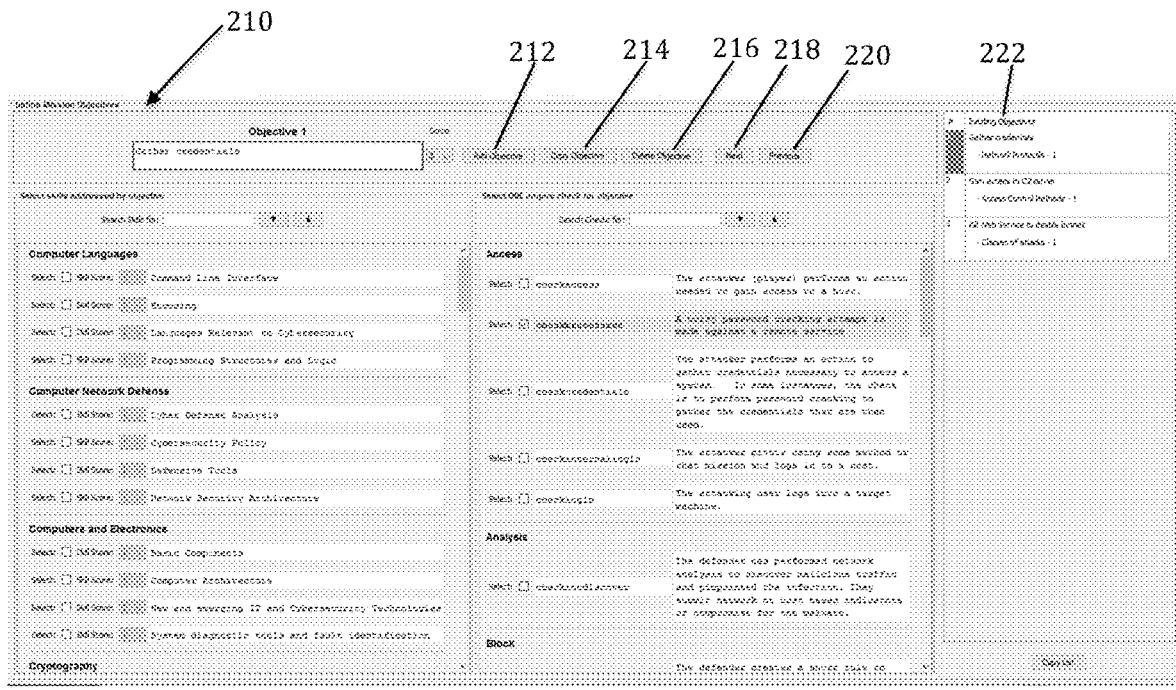
FIG. 22A illustrates a mission objectives graphic user interface or tab according to embodiments of the present invention.

When the Mission Objectives tab is selected, the items under the Mission Objectives Menu 210 of FIG. 22A at the top of the page are available.

Save Mission Objectives

Click Mission Objectives→Save Mission Objectives to save the current information on this tab for the mission.

Import Mission Objectives

To import mission objectives and associated skills and umpire checks, solutions and hints from an existing mission (or previously saved/exported Orion mission data), Click Mission Objective→Import Objectives. This brings up an Import Objectives confirmation dialog warning about data replacement.

Click the OK button to bring up an Open dialog. (Clicking the Cancel button will close the dialog and without continuing the import process.)

Browse to the folder containing desired mission services_0.yaml file.

Select the desired file and click the Open button. Any current mission objectives and associated information is replaced with information from the selected file.

Click the Cancel button to exit the dialog without changing the current objective information.

Export Mission Objectives

Click Mission Objective→Export Objectives to save the current Mission Objectives and associated skills and umpire checks, solutions and hints in the correct format. An Export Successful dialog is presented showing that the services_0.yaml file has been saved in the export folder under the main mission folder. Click the OK button to acknowledge and close the dialog.

Defining the Mission Objectives

The Mission Objectives tab illustrated in FIG. 22A is divided into the following areas and described below: (1) Objective definition and navigation; (2) Skills addressed by objective; (3) Umpire check associated with objective; and (4) List of Existing Objectives (with associated skills).

Define Objective Name

The objective name may be edited at any time in the Objective field at the top of the tab. The current objective number is shown above the field.

Assign Objective Score

The objective score may be chosen at any time by selecting the desired value from the Score dropdown at the top of the tab. The score could be based on "How hard is this objective on a scale of 1 to 10?".

Add Objective

To add an objective, click the Add Objective button 212 at the top of the tab. This will increment the objective count and provide a blank objective/set of skills and umpire checks for definition of a new objective. It will also add a "blank" objective to the Existing Objectives list.

Fill in the Objective name, Score, and associate appropriate Skills and Umpire Check.

Copy Objective

To copy the currently displayed objective

Click the Copy Objective button 214 at the top of the tab. This will add an objective with a blank name to the end of the list with the same skill(s), umpire check and score as the current objective.

Fill in the objective name.

Reorder objectives if needed.

Delete Objective

To delete the currently displayed objective, click the Delete Objective button 216 at the top of the tab. This brings up the Delete Objective dialog.

Click the OK button to delete the objective (or click the Cancel button to close the dialog without deleting the objective). The currently displayed objective and associated skills and umpire check is removed and remaining objectives renumbered appropriately.

Next Objective

To display the next objective, click the Next button 218 at the top of the tab. The information for the next objective is displayed.

Previous Objective

To display the previous objective, click the Previous button 220 at the top of the tab. The information for the previous objective is displayed.

Select Existing Objective to Display

To display a specific objective, click on the row in the Existing Objectives list 222 and the objective information for that objective is displayed.

Reorder Objectives

To reorder an objective, select an objective in the Existing Objectives list 222 and drag up or down the list to desired location. The objectives are renumbered automatically.

Objective Skills

Associate Skills

To associate skill(s) with an objective:

(1) Select the desired objective in the list of objectives. The list of skills available are displayed in the skills interface 230 of FIG. 23.

(2) Click the Select checkbox 232 next to desired skill(s) OR click in the associated skill text field. The associated skill is highlighted and the score selection box is enabled.

(3) Select the desired Skill Score 234 from the list (how hard is this skill on a scale of 1 to 10?).

To disassociate the skill, click on the checkbox (OR associated skill text field) again to clear it.

Search for Skill

Figure 22B:
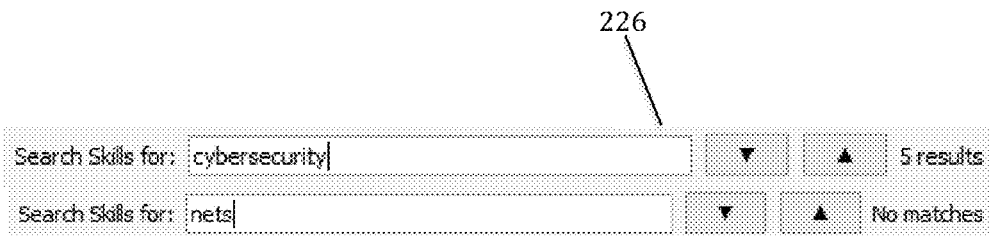
FIG. 22B illustrates a search for skill interface according to embodiments of the present invention.

To search for specific skill, enter text to search for in the Search for Skills dialog in FIG. 22B. The number of results (if any) is shown to the right in FIG. 22B.

Figure 23:
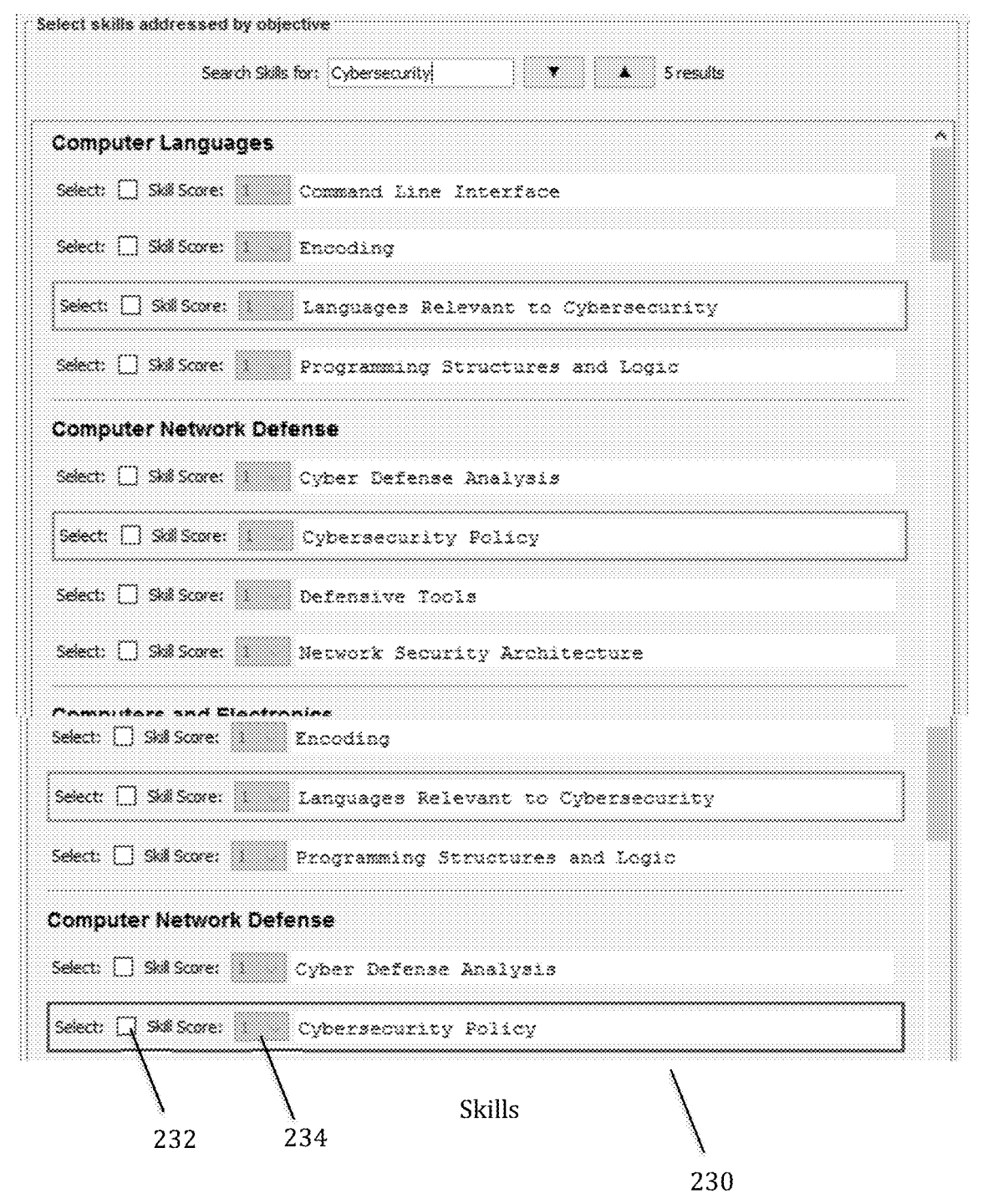

Each skill that matches the entered text is outlined as shown in FIG. 23.

Use the Down Arrow and Up Arrow buttons to scroll to next/previous occurrence of the entered text. The one that is scrolled to is outlined with a slightly darker outline.

Objective Umpire Checks

Umpire checks form the basis of automated scoring and are required for each mission objective.

Associate Umpire Check

Figure 24:
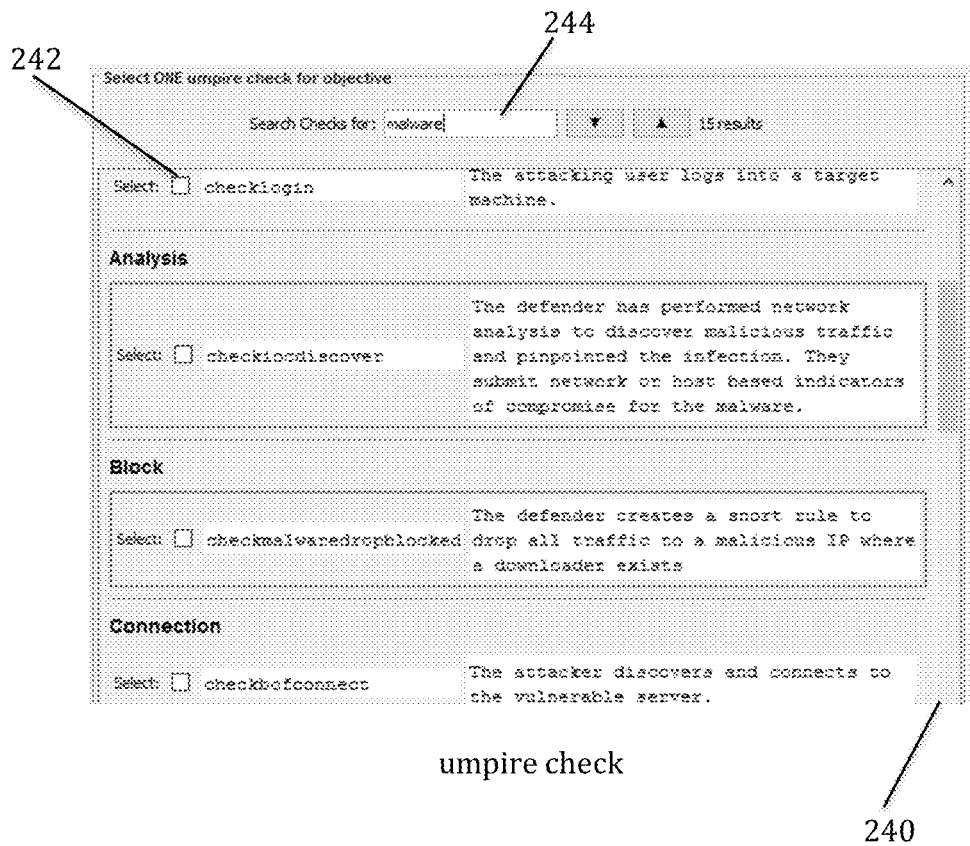
FIG. 24 illustrates an umpire check dialog according to embodiments of the present invention.

To associate a single umpire check with an objective:

(1) Select the desired objective in the list of objectives in FIG. 24. The list of umpire checks available are displayed in the umpire check dialog 240.

(2) Click the Select checkbox 242 next to desired umpire check OR click in one of the associated umpire check text fields. The associated umpire check is highlighted.

To disassociate the umpire check, click on the checkbox (OR associated umpire check text field) again to clear it. Selecting a different umpire check will also clear the previously selected one.

Search for Umpire Check

To search for specific umpire check, enter text to search for in the Search Checks for: field 244. The number of results (if any) is shown to the right.

Each umpire check whose description and/or name matches the entered text is outlined as shown in FIG. 24.

Use the Down Arrow and Up Arrow buttons to scroll to next/previous occurrence of the entered text. The one that is scrolled to is outlined with a slightly darker outline.

Solutions and Hints

The Solutions and Hints component defines the solution and associated hint(s) for each mission objective. The solution walks the player through the objective. The hints provide multiple statements to lead the player to the solution.

Figure 25:
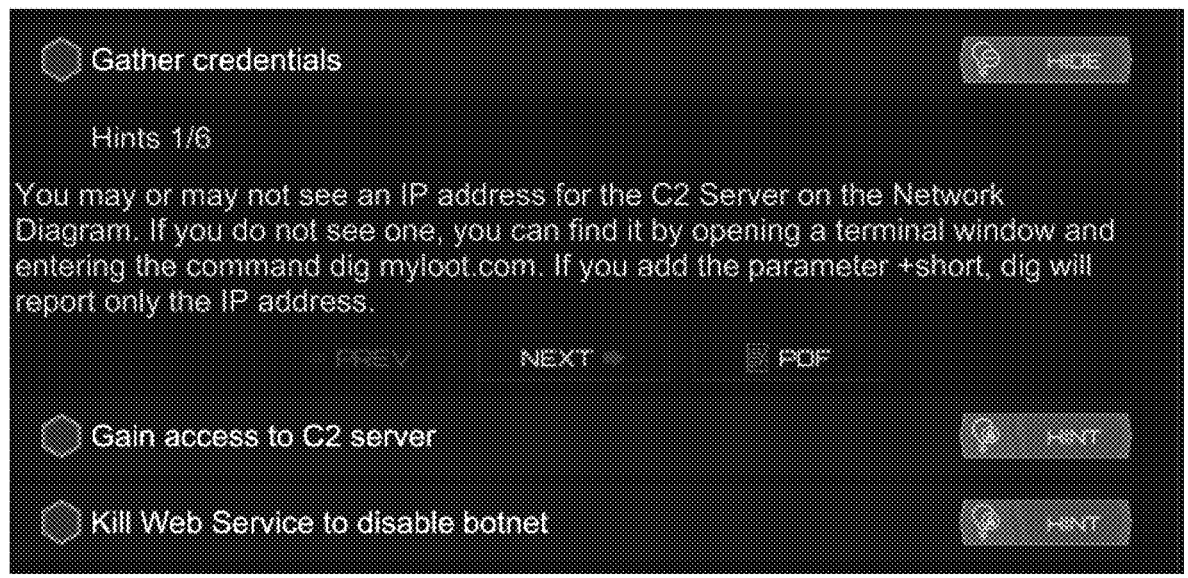
FIG. 25 illustrates a solutions and hints user interface according to embodiments of the present invention.

Viewing hint(s) will result in loss of points. The PDF link under the set of objective hints provides the solution for that objective as depicted in FIG. 25.

To access the Solutions and Hints, click on the Solution and Hints tab from FIG. 1.

Solution and Hints Menu Items

When the Solutions and Hints tab is selected, the items under the Solution and Hints Menu at the top of the page are available. The interface of FIG. 26 may be available, which allows scrolling through hints.

Save Mission Solution

Click Solution and Hints→Save Mission Solution to save the current information on this tab for the mission.

Defining the Solutions and Hints

Figure 26:
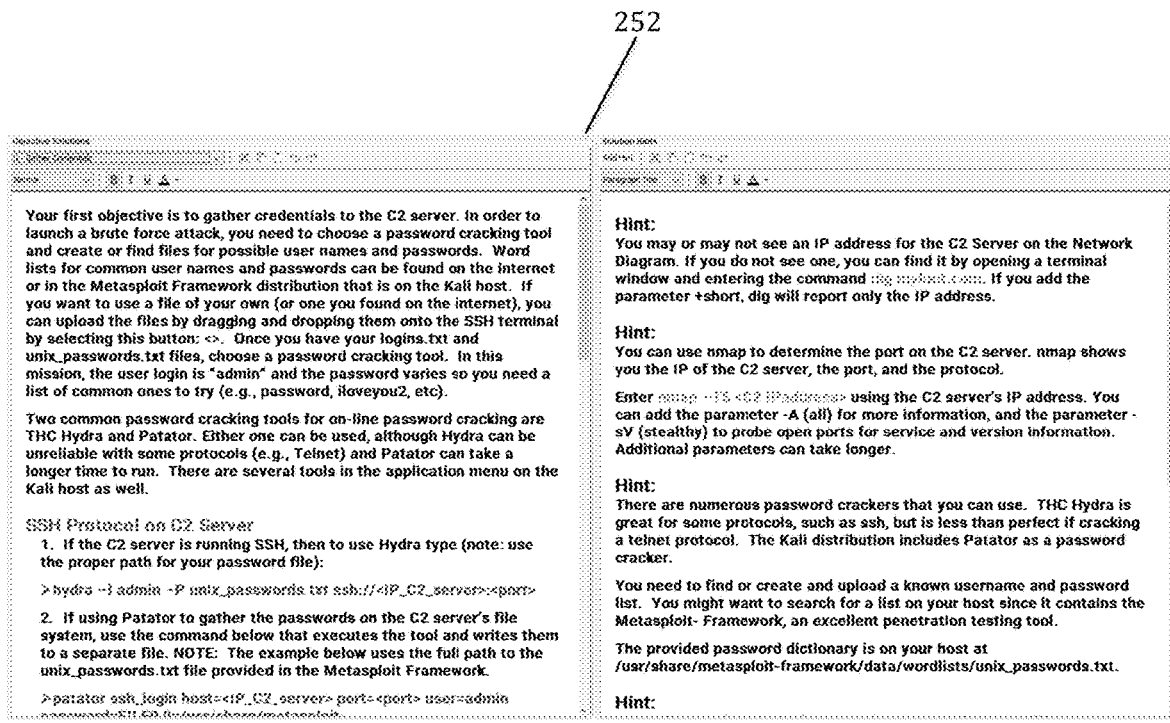
FIG. 26 illustrates a screenshot defining solutions and hints according to embodiments of the present invention.

Defining the Solutions and Hints is illustrated in interface 252 of FIG. 26.

Select Objective

To choose an objective, select the desired one from the drop down list of names at the top of the tab. The Solution and Hints area will automatically be filled in with any existing information for that objective.

Define Solution

Figure 27:
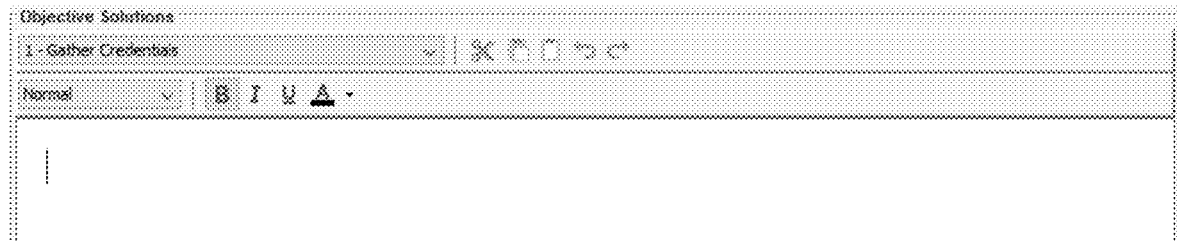
FIG. 27 illustrates a define solution interface according to embodiments of the present invention.

Use the Solution area shown in FIG. 27 to type in the information needed to walk the player through this objective.

Add Hint

Figure 28:
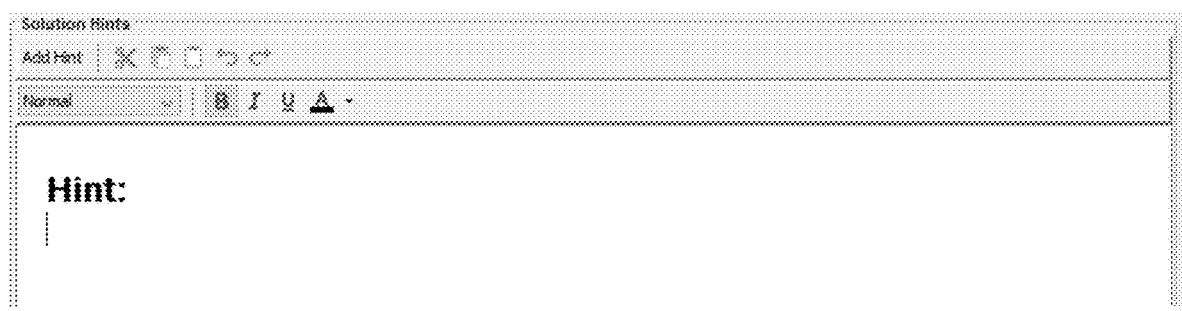
FIG. 28 illustrates an add hint interface according to embodiments of the present invention.

Initially there is a "blank" Hint shown for which text can be entered as illustrated in FIG. 28. To add another Hint, click the Add Hint button. A Hint header is added to the hint editing area. Type the desired text in for the hint.

Typically, the full solution is written and then pieces of it are used as hint(s).

Network Map

Figure 29:
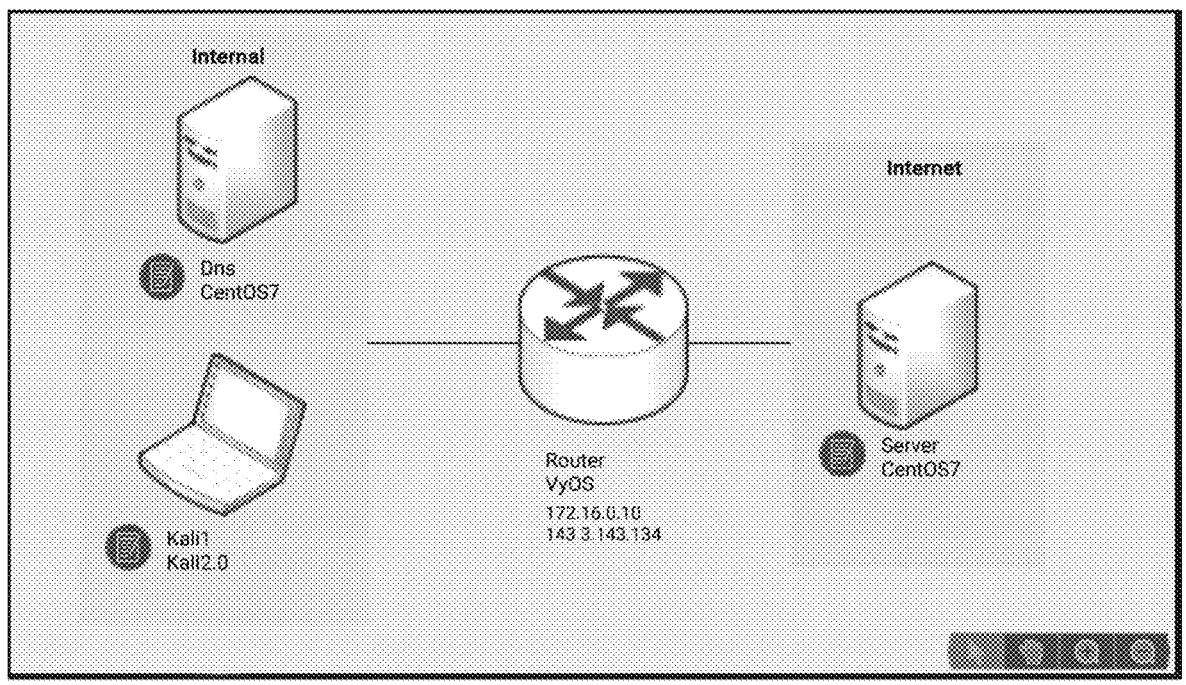
FIG. 29 illustrates a network map screenshot according to embodiments of the present invention.

The Network Map component shown in FIG. 29 defines the network to be used for the mission. In game environment, the Network is one of the main components which needs to be solved. To access the Network Map, click on the Network Map tab of FIG. 1.

Network Map Menu Items

When the Network Map tab is selected, the items under the Network Map Menu at the top of the page are available.

Save Network Map

Click Network Map→Save to save the current information on this tab for the mission.

Import Network Map

Click Network Map→Import . . . to browse to and open a previously saved Orion Network Map. The network data is filled in on the map.

Export Network Map

Click Network Map→Export to save the current Orion Network Map in the correct format for game environment. An Export Successful dialog is presented showing that the out.xml file has been saved in the Network_Map folder within the export folder under the main mission folder. Click the OK button to acknowledge and close the dialog.

Clear Drawing

Click Network Map→Clear Drawing to remove ALL items from the current network map.

If changes have been made to the network map which have not been saved, the Discard Changes dialog is displayed.

Click the Yes button to close the dialog and remove ALL items from the current network map OR click the No button to close the dialog without clearing the network map.

Duplicate

Click Network Map→Duplicate to make a copy of the currently selected node on the network map. All associated attributes (name, IP Address, OS, services . . . ) are also copied.

Zoom to Fit

Click Network Map→Zoom to Fit to zoom in to whatever resolution necessary to show ALL items in the network map area.

Snap to Grid

Click Network Map→Snap to Grid to toggle the alignment of nodes to the grid as they are dragged on the network map. Checkmark indicates the feature is turned on.

Snap Size

Click Network Map→Snap Size to adjust the size of the grid. The current size is shown on the menu.

Options

Figure 30:
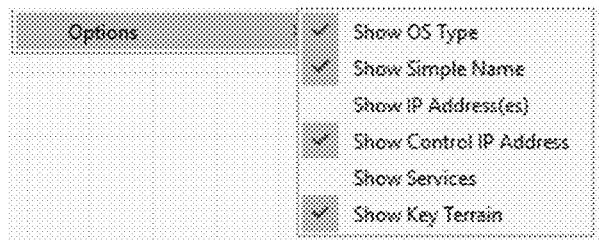
FIG. 30 illustrates a network map options interface according to embodiments of the present invention.

Click Network Map→Options to toggle the viewing of various details on the network map as shown in FIG. 30. Checkmark indicates the feature is turned on as shown in FIG. 30.

Show OS Type—view the operating system (OS) for the node(s) on the network map.

Show Simple Name—view the name assigned to the node(s) on the network map.

Show IP Address(es)—view all non-control IP Addresses assigned to the node(s) on the network map.

Show Control IP Address—view the control IP Address assigned to the node(s) on the network map ("Control:" is prepended to the address).

Show Services—view the service(s) assigned to the node(s) on the network map.

Figure 31:
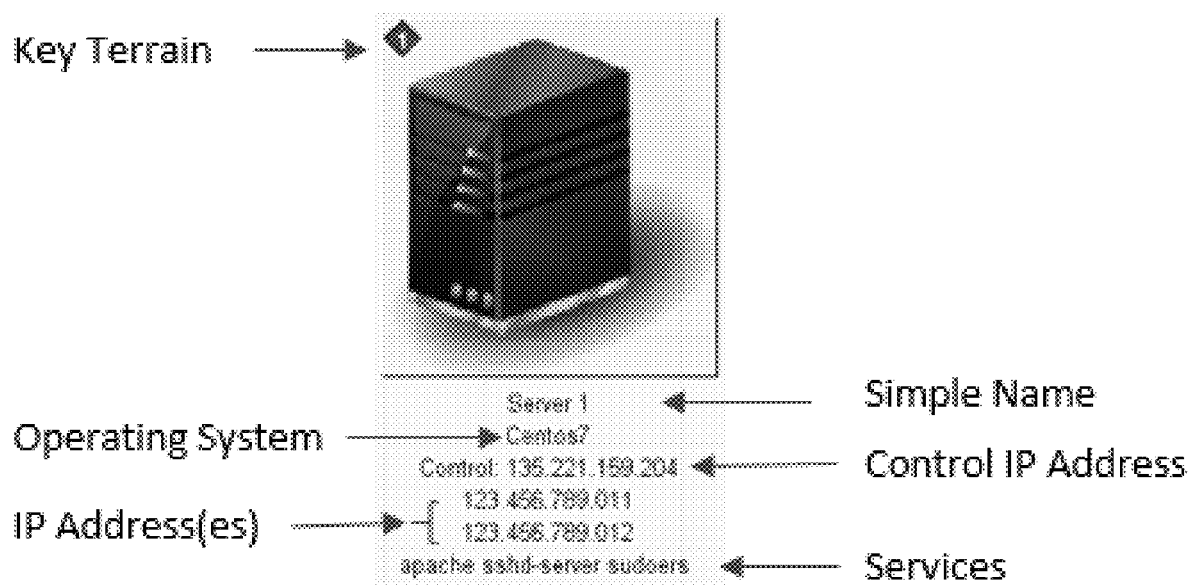
FIG. 31 illustrates a screenshot of key terrain according to embodiments of the present invention.

Show Key Terrain—view indication as depicted in FIG. 31 of Key Terrain designation assigned to the node(s) on the network map (1→High, 2→Medium, 3→Low).

Network Map Toolbar

The Network Map Toolbar provides quick access to items for working with the network map of FIG. 29.

The Select icon is the default and allows for selections on the network map.

The Camera icon provides a means to capture and save an image of the current network map. Click this icon to bring up a Save dialog. Browse to desired location, name the file and click the OK button. Click the Cancel button to close the dialog without saving.

Figure 32:
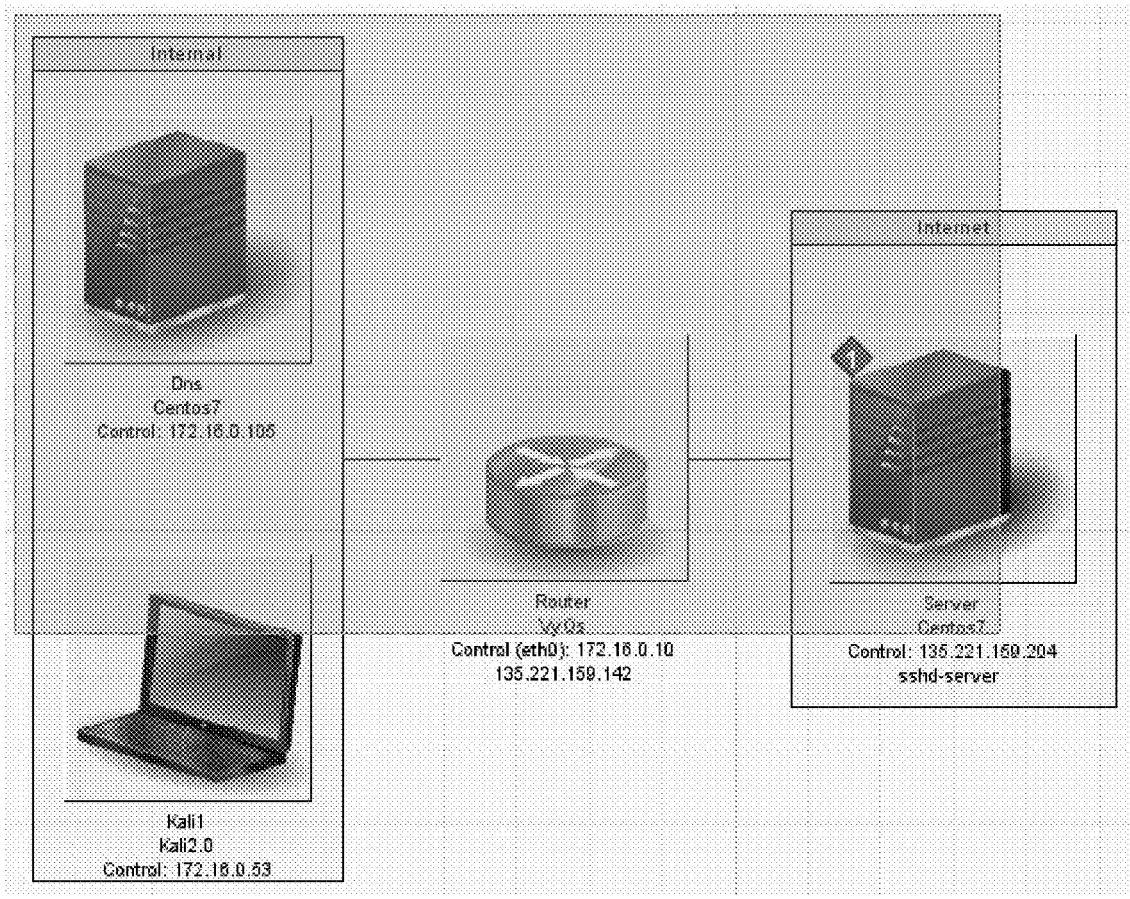
FIG. 32 illustrates a screenshot of a rubberband zoom according to embodiments of the present invention.

The Rubberband Zoom icon shown in FIG. 32 provides a means to zoom in to a specific desired area, see FIG. 32. Click this icon, then click on the network map, hold and drag the cursor to desired rectangular area and release. Network map is zoomed to view only this area.

The Zoom In icon increases the size of displayed items viewed on the network map.

The Zoom Out icon decreases the size of displayed items viewed on the network map.

The Undo Previous Zoom icon reverses the last zoom action performed.

The Panning icon provides a means to manually move the viewing area of the network map. Click on this icon and then click and hold on the map while moving the cursor to desired viewing area.

The Re-center icon provides a means to manually center the viewing area of the network map at a particular point. Click on this icon and then click on desired center point on the network map.

The Restore Original Zoom icon resets the zoom level of the network map to the default size.

The Refresh icon redraws the page.

The Node Box icon provides a means to encapsulate a set of node(s) within a defining box. Click this icon, then click on the network map, hold and drag to enclose desired node(s) and release (the box can be renamed).

The Connector icon provides a means to connect two items (nodes or boxes) on the network map with a straight line. Click this icon, then click the first item to be connected on the network map and click the second item to be connected. A straight-line connector is shown between the two items.

The Elbow Connector icon provides a means to connect two items (nodes or boxes) on the network map with a right-angled connector. Click this icon, then click the first item to be connected on the network map and click the second item to be connected. A right-angled set of line segments is show between the two items (if the two items are in line with each other—horizontally or vertically—a straight line is shown).

The Delete icon deletes any selected items on the network map. If a selected item has connector(s), the connector(s) will also be deleted.

Network Map Components

The left panel of the Network Map tab provides elements to define and identify information for items on the network map.

Nodes Palette

Figure 33A:
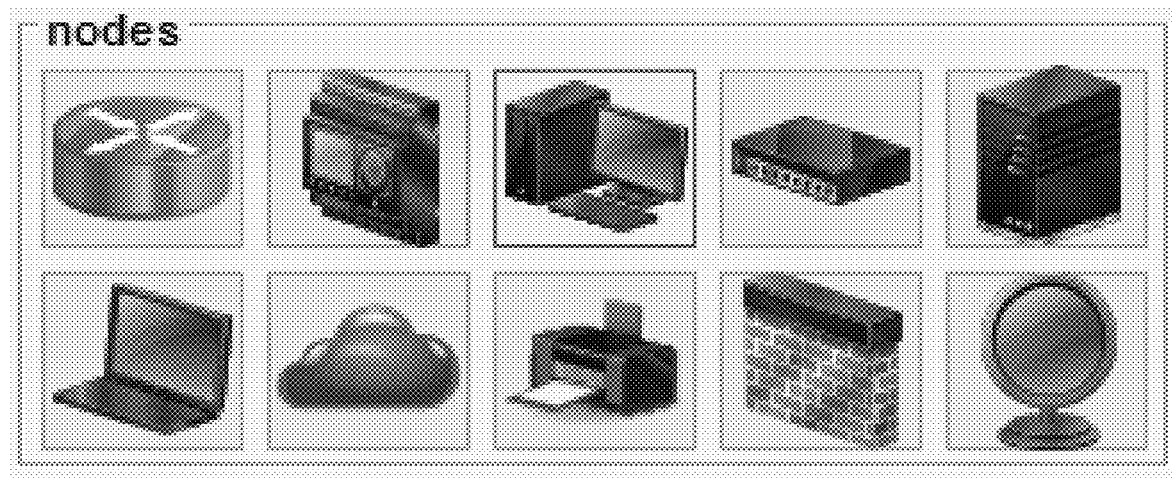
FIGS. 33A and 33B illustrate icons that can be added to the network map according to embodiments of the present invention.

The Nodes palette as shown in FIG. 33A provides icons depicting the various types of nodes which may be added to the network map. Click on one of the icons and then click on network map at desired location. The node is added to the network map.

Attributes Palette

Figure 33B:
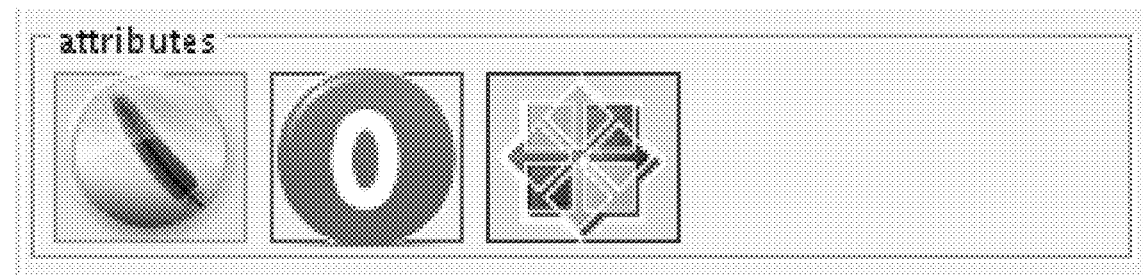

The Attributes palette shown in FIG. 33B provides (changing) icons depicting types of attributes which may be assigned to a node on the network map.

The Services icon is the first icon in the set.

Click on this icon and then click on the node on the network map for which service(s) are to be assigned. This will bring up the Services dialog.

Select the desired service(s) by selecting them in list. To select multiple, hold down shift key (for multiple in succession) or ctrl key (for separate items). Unselecting a service removes its association with the node.

Click the OK button to apply the services to the selected node (or click the Cancel button to close the dialog without changing).

The Key Terrain icon is the second icon in the set.

Click on this icon and then click on the node on the network map for which key terrain value is to be (un) assigned. This will bring up the Key Terrain dialog.

Select the desired value.

Click the OK button to apply the level to the selected node (or click the Cancel button to close the dialog without changing).

The Operating System icon is the third icon in the set.

Click on this icon and then click on the node on the network map for which the operating system is to be assigned. This will bring up the Operating System dialog.

Select the desired operating system. Unselecting the operating system removes its association with the node.

Click the OK button to apply the operating system to the selected node (or click the Cancel button to close the dialog without changing).

Mouseover Feedback

Figure 34:
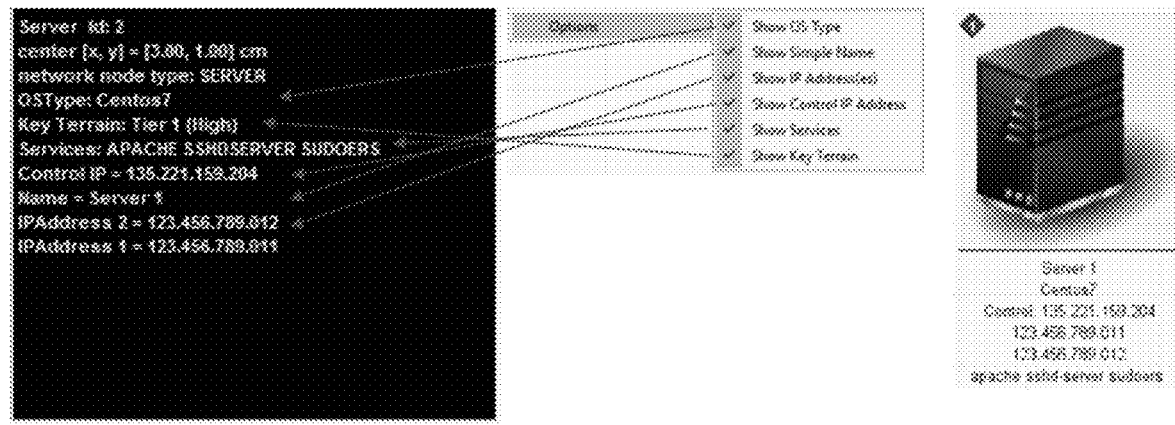
FIG. 34 illustrates a mouseover feedback interface according to embodiments of the present invention.

The Mouseover Feedback area shown in FIG. 34 displays all of the current attributes/properties/connections/boxes for the network map item over which the cursor is currently "hovering" whether or not the Network Map→Options menu item is checked for that property.

Editable Properties

Figure 35:
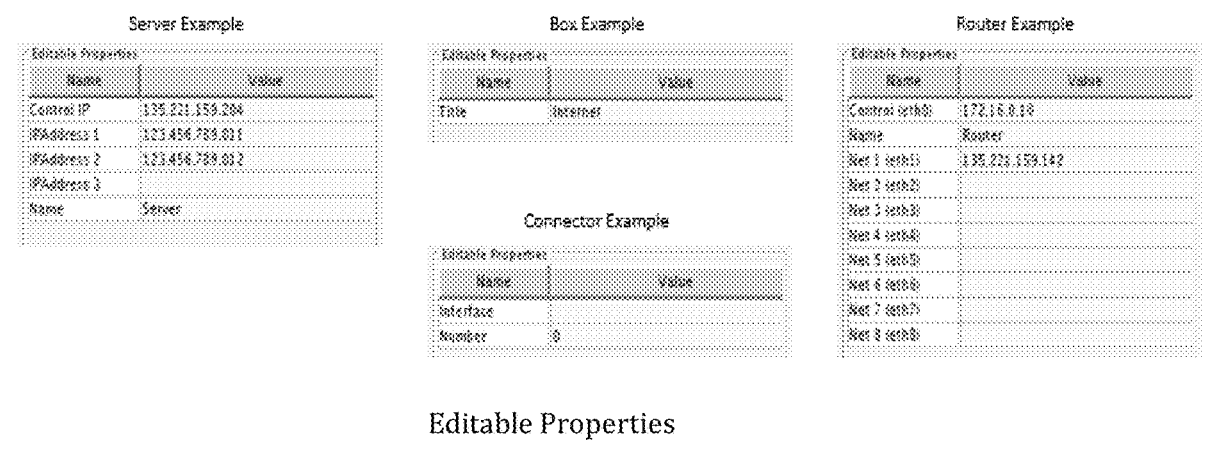

The Editable Properties area shown in FIG. 35 provides the means to edit the properties (such as name, addresses, operating system) appropriate to an item selected on the network map. Enter values in appropriate fields.

Network Map Graph Area Actions

This section describes the various actions which can be taken on the Network Map Graph Area while defining the network.

Position Items on Network Map

Nodes and Boxes may be moved on the network map.

Click on the item to be moved (hold down mouse button and drag to encompass an area with multiple items).

Click again on selected item/area and drag to desired location.

Arrange Item

Nodes and Boxes may be arranged in a specified order for viewing. This is important when two or more items overlap because it determines which one(s) are in front or back.

Figure 36A:
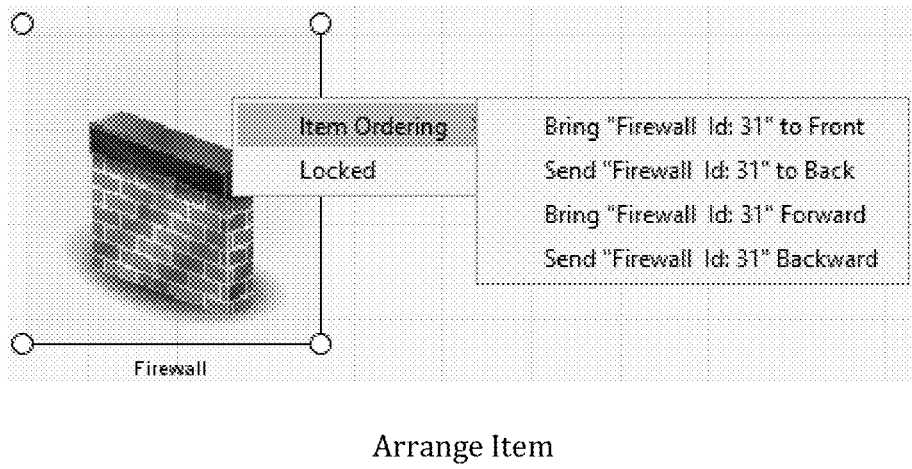
FIG. 36A illustrates an arrange item interface according to embodiments of the present invention.

Right Click on the item shown in FIG. 36A to be arranged and select the desired Item Ordering option. The item is moved forward or backward as appropriate.

Lock Item

Nodes and Boxes may be "locked" so that they cannot be selected, edited or moved within the network map.

Figure 36B:
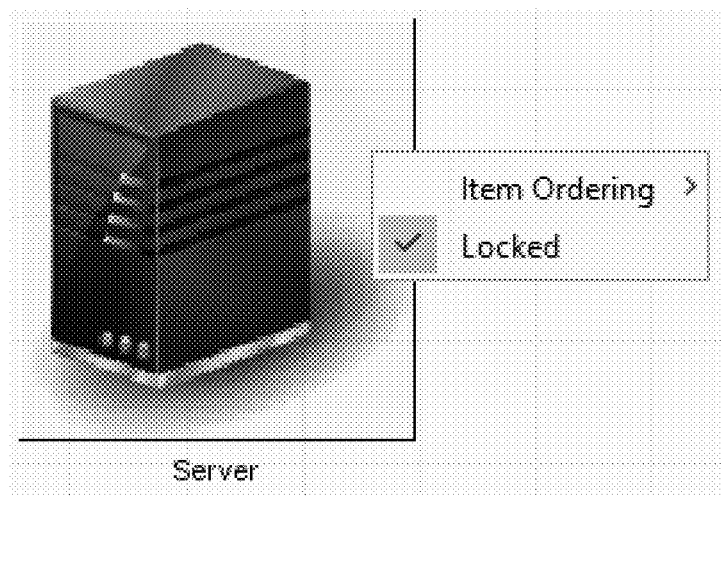
FIG. 36B illustrates lock item interface according to embodiments of the present invention.

Right Click on the item to be locked and select Locked as shown in FIG. 36B. A checkmark will appear beside the option and the item cannot be selected, edited or moved. Properties will still be shown in Mouseover Feedback area when hovering over the item.

Right Click on the item and select this option again to unlock the item as shown in FIG. 36B.

Defining the Network Map

Figure 37:
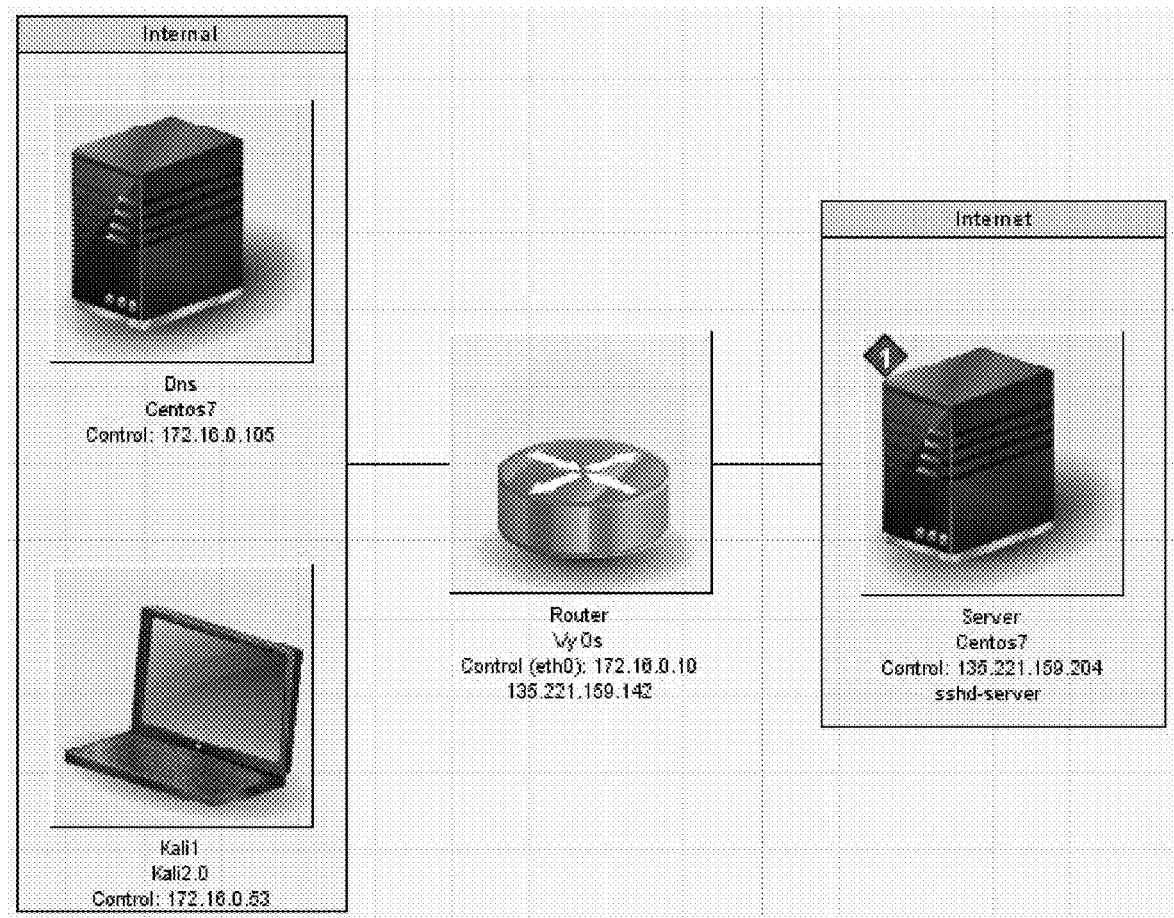
FIG. 37 illustrates a network graph map area according to embodiments of the present invention.

Use the Network Map Graph Area to define the network map for the mission as shown in FIG. 37.

Select from various node types and add to the network map (see Nodes Palette section).

Select from various attributes and apply to each node on the map (see Attributes Palette section).

Connect nodes on the map (see Network Map Toolbar section).

Use boxes to group nodes on the map (see Network Map Toolbar section).

Enter the appropriate properties for each item on the map (see Editable Properties section).

Events

The Events component include a list of various events for the mission.

To access the Events, click on the Events tab of FIG. 1.

Events Menu Items

Figures 38A, 38B:
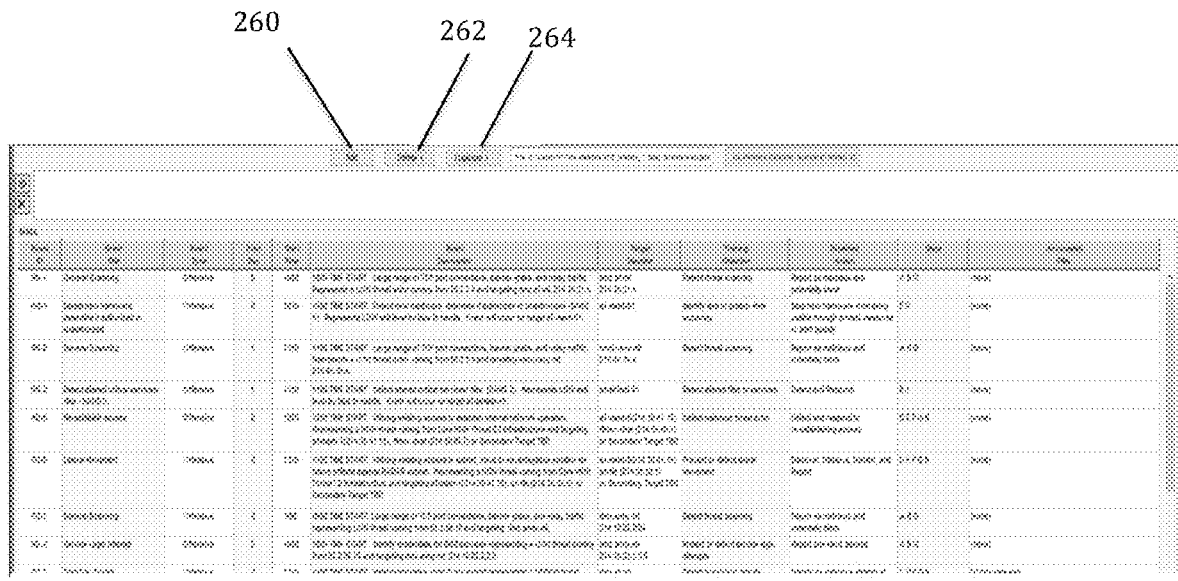
FIG. 38A illustrates a defining events interface according to embodiments of the present invention.
FIG. 38B illustrates an add events interface according to embodiments of the present invention.

When the Events tab is selected, the items under the Events Menu at the top of the page of FIG. 38A are available.

Save Events

Click Events→Save . . . to save the current information on this tab for the mission.

Import Events

To import events for the mission,

Click Events→Import . . . to bring up an Open dialog. (Clicking the Cancel button will close the dialog without continuing the import process.)

Browse to the folder containing desired event file.

Select the event file and click the Open button. The event information is imported into this mission.

Click the Cancel button to exit the dialog without importing the events.

Export Events

Click Events→Export . . . to save the current event information in the correct format for the game environment. An Export Successful dialog is presented showing that the msel.json file has been saved in the Events folder within the export folder under the main mission folder. Click the OK button to acknowledge and close the dialog.

Defining Events

Defining Events as shown in FIG. 38A.

Add Event

Initially there are several "blank" events shown in the event list with a default Event ID as shown in FIG. 38B.

To add additional Event(s), click the Add button 260 at the top of the page of FIG. 38A. Another "blank" row is added to the event list, with the Event ID defaulted to the number events now in the list.

Delete Event

To delete an Event,

Select one of the text fields in the row to be deleted. The Delete button 262 will show the Event ID of the row selected.

Click the Delete button. The row is removed from the list.

Duplicate Event

Select one of the text fields in the row to be duplicated. The Duplicate button 264 will show the Event ID of the row selected.

Click the Duplicate button. The row is duplicated as an additional row is added to the list.

Edit Event Field

General Text Fields

For most fields in the list,

Select the field in the list. This will place any current text in the edit box above the list.

Make changes to the text and click the accept icon. The text is now updated in the list. (Click the cancel icon to clear the edit box and leave the field as it was in the list.)

Note: Select the field in the list again in order to edit.

Event Type Field

To edit the Event Type,

Click in the Event Type field for the event to be defined/changed. This will bring up the Type dialog with the Event ID shown in the title.

Select the desired Event Type and click the OK button. The dialog closes and selected Event Type is shown in the list. (Click the Cancel button to close the dialog without making any change.)

Steps Field

Figure 39:
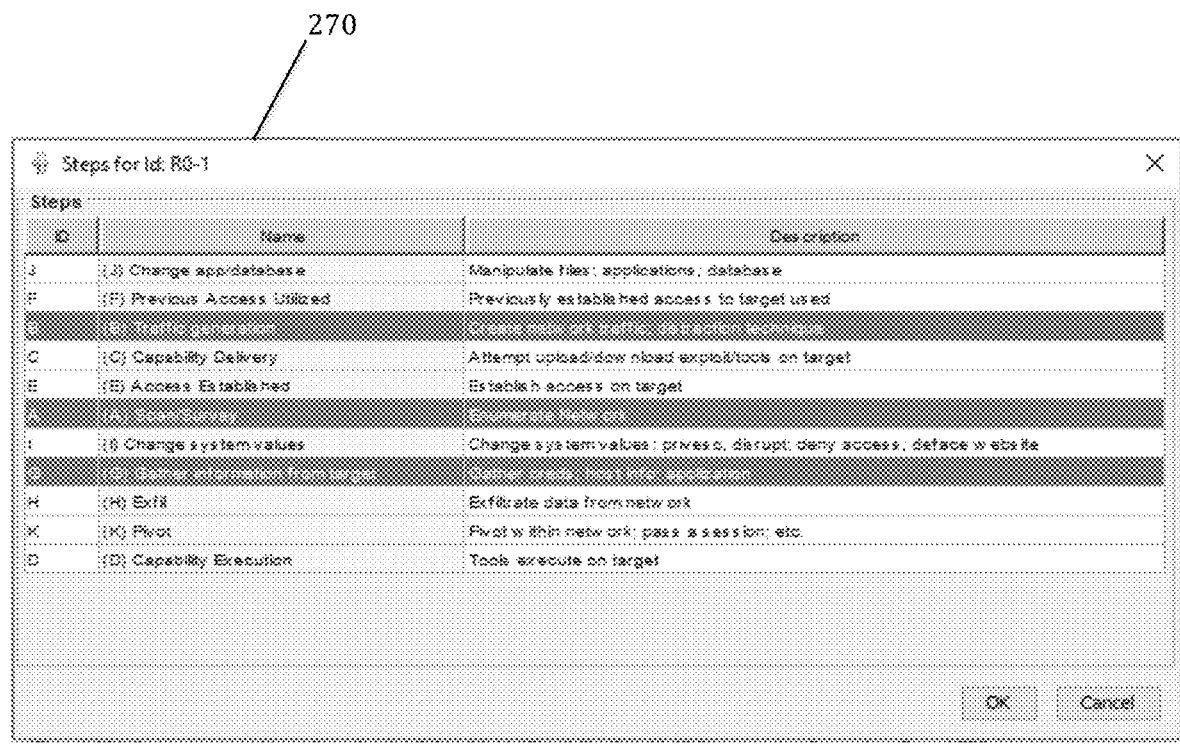
FIG. 39 illustrates a step for id dialog according to embodiments of the present invention.

To edit the Steps,

Click in the Steps field for the event to be defined/changed. This will bring up the Steps for id dialog 270 as shown in FIG. 39 with the Event ID shown in the title.

Select the desired Step(s) in the list—using shift key to select consecutive rows or ctrl key to select multiple/disjoint rows.

Click the OK button to close the dialog and apply the steps to the event. (Click the Cancel button to close the dialog without changing the event.)

To "reorder" the Steps,

Click in the Steps field for the event to be defined/changed.

Click the Cancel button the Steps dialog to close the dialog.

Now use the edit box above the list to enter/reorder the steps—they must be separated by a space.

Associated Files Field

To view/edit the Associated Files:

Click in the Associated Files field for the event being defined/edited. This brings up the Select Associated Files for: id dialog.

To add a file to the list,

Click the Add icon at the top of the dialog. This brings up an Open dialog.

Browse to/select the desired file.

Click the OK button to close the dialog. The file is listed in the Select Associated Files for: id dialog. (Or click the Cancel button to close the dialog without adding a file.)

Repeat steps a-c to add additional file(s).

Click the OK button. The dialog closes and the first associated file is shown in the list.

To see multiple associated files, click in the Associated Files field again to bring up dialog/view the list in edit box at top of page.

To delete a file from the list,

Select the file(s) to be deleted in the dialog list

Click the Delete icon at the top of the dialog. The file(s) are removed from the list Click the OK button. The dialog closes and the deleted file(s) are no longer associated with the event.

Sorting Events

To sort the event list by Event ID, click on the Event ID table header for the list. The events are sorted in ascending alphabetic order. Click the header again to sort in descending alphabetic order.

Quizzes

Figure 40A:
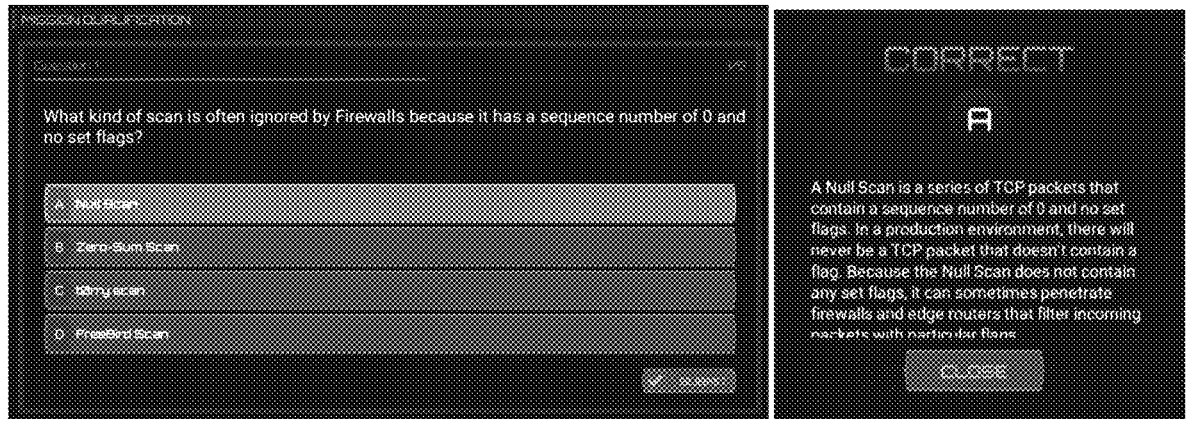

The Quizzes as shown in FIG. 40A define a set of questions to be used in "qualifying" for the mission. The questions are multiple choice in nature, may be associated with multiple missions, and optionally provide Key Words.

Figure 40B:
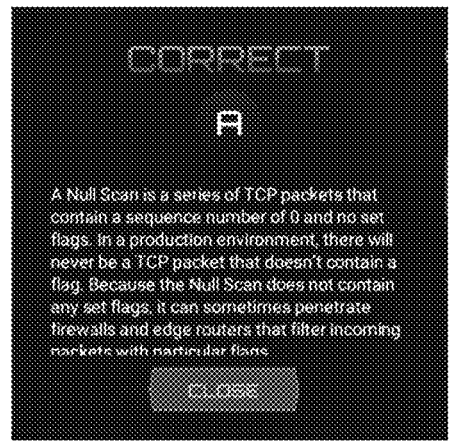

To qualify for a mission in the game environment, the player must first answer several quiz questions as depicted in FIG. 40A and FIG. 40B.

To access the Quizzes, click on the Quizzes tab.

Quizzes Menu Items

When the Quizzes tab is selected, the items under the Quizzes Menu at the top of the page are available.

Save Quizzes

Click Quizzes→Save Quizzes to save the current information on this tab for the mission.

Search for Questions

There is a "master" list of quiz questions delivered with Orion. These questions may be searched for relevancy to the current mission and included/modified as desired.

Click Quizzes→Search for Questions to bring up the Search for Questions dialog.

Enter the desired criteria to search by (any combination):

Difficulty Level (Any does not constrain the search)

Key Word(s) (specific key words with which question(s) may have been tagged)

Question Content (a string of text to be found in the question)

Answer Content (a string of text to be found in any answer field—correct, wrong options, or detailed answer)

Mission(s) (specific mission(s) for which question(s) may have been tagged).

Skill Content (a string of text to be found in any skill associated with the question(s)).

Click the Search button to review results (or click the Cancel button to close dialog without searching).

If no results are found, No Results Found confirmation is displayed—click the OK button to close the confirmation dialog.

Figure 40C:
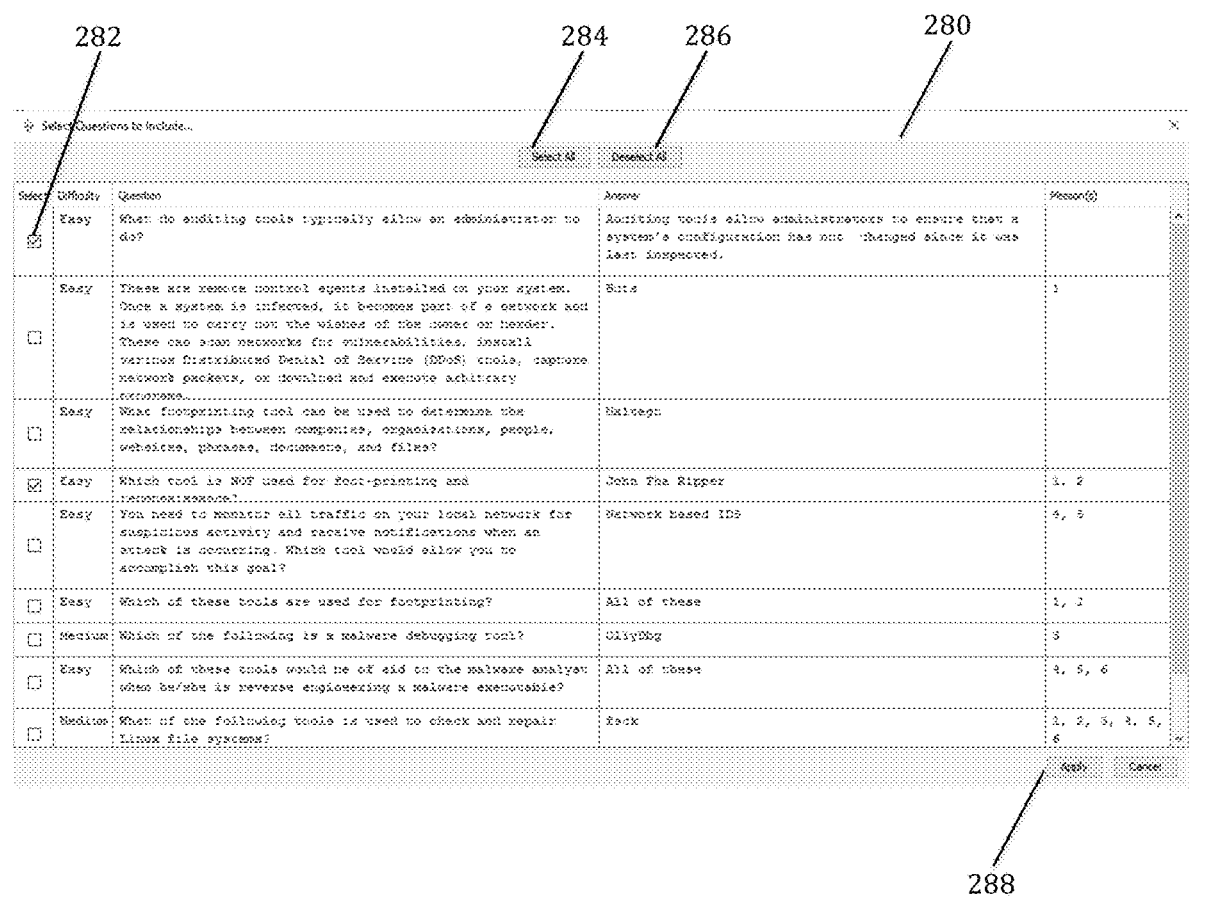

Otherwise, the Select Questions to Include . . . dialog is displayed as shown in FIG. 40C.

Select the desired question(s).

To select ALL of the questions click the Select All button 284 at the top of the dialog. All Select boxes are checked.

To deselect ALL of the questions click the Deselect All button 286 at the top of the dialog. All Select boxes are unchecked.

To select individual question(s), click the Select box 282 by the desired question(s). Click the box again to unselect.

Click the Apply button 288 to include the selected question(s) in this mission (or Cancel to close the dialog without including any of the questions). Any questions included are automatically added to the quiz question list for the mission.

Export Quiz Questions

Click Quizzes→Export Quiz Questions to export any entered quiz question(s) in the correct format for game environment. An Export Successful dialog is presented showing that the questions which have been defined within this mission have been saved as the Quiz Q&A.csv file in the export folder under the main mission folder.

If there are no quiz questions defined in this mission, an Export Quiz Questions dialog is brought up.

Click the OK button to acknowledge the information. No export file is created.

Defining the Quizzes

Figure 40D:
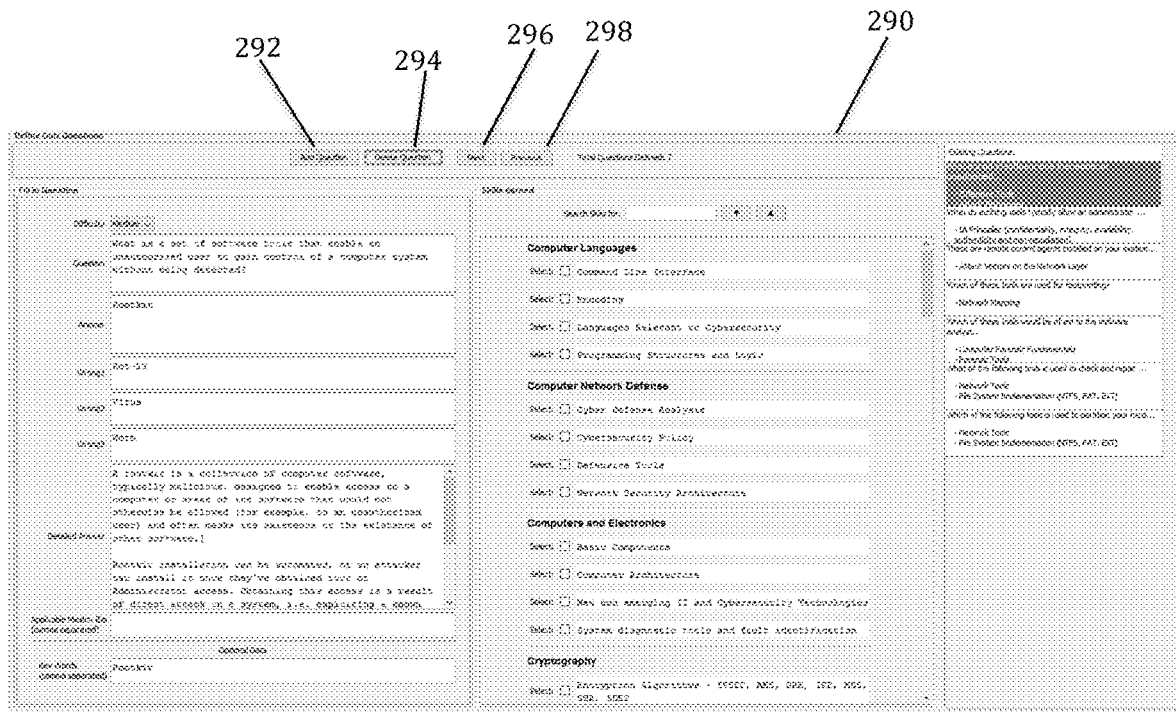

The Quizzes tab 290 as illustrated in FIG. 40D is divided into the following areas and described below.

Question navigation

Question entry

Associated Skills

List of Existing Questions (with associated skill(s))

Assign Question Difficulty

The question difficulty may be chosen at any time by selecting the desired value from the Difficulty drop down. If the question could apply to multiple difficulty levels, choose "Any".

Define Question

Enter text for the Question, multiple choice answers (Answer, Wrong1, Wrong2, Wrong3), Detailed Answer (explanation), Applicable Mission IDs, and Key Words for the question displayed. The total number of questions currently defined for the mission is displayed at the top of the page.

Quiz Question Skills

Associate Skill(s) with Question

To associate skill(s) with a question

Select the desired question in the list of questions. The list of skills available are displayed.

Click the Select checkbox next to desired skill(s) OR click in the associated skill text field. The associated skill is highlighted.

To disassociate the skill, click on the checkbox (OR associated skill text field) again to clear it.

Search for Skill

To search for specific skill, enter text to search for in the Search Skills for: field. The number of results (if any) is shown to the right.

Each skill that matches the entered text is outlined.

Use the Down Arrow and Up Arrow buttons to scroll to next/previous occurrence of the entered text. The one that is scrolled to is outlined with a slightly darker outline.

Add Question

To add a question, click the Add Question button 292 at the top of the tab. This will provide a blank question entry area for defining the new question. It will also add a "blank" question to the Existing Questions list. Fill in the fields for this new question.

Delete Question(s)

To delete the currently displayed question, click the Delete Question button 294 at the top of the tab. This brings up the Delete Quiz Question dialog.

Click the OK button to delete the question (or click the Cancel button to close the dialog without deleting question). The currently displayed question is removed.

Next Question

To display the next question, click the Next button 296. The information for the next question is displayed.

Previous Question

To display the previous question, click the Previous button 298. The information for the previous question is displayed.

Select Existing Question to Display

To display a specific question, click on the row in the Existing Questions list and the question information for that question is displayed.

In addition, if the question text is too long to fit in the list, it will end with " . . . " and holding the cursor over that row will provide a tool tip with the entire text of the question.

Checklists

Figure 41:
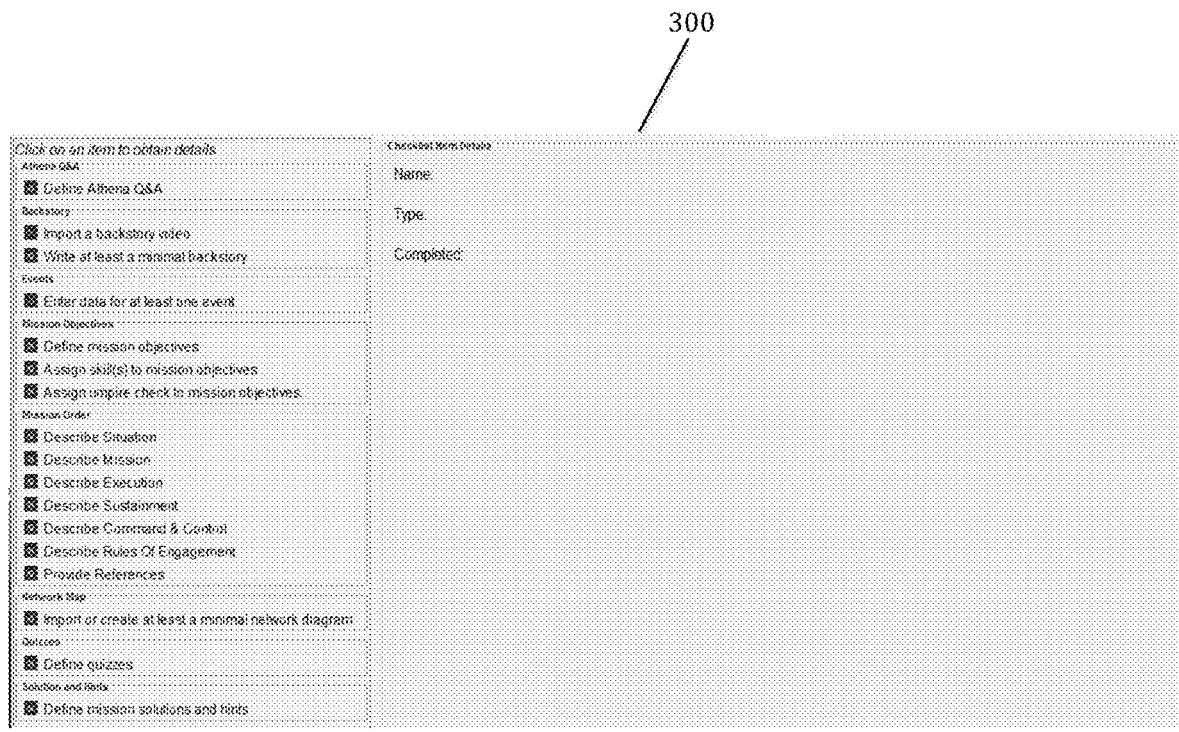
FIG. 41 illustrates a checklist tab or interface according to embodiments of the present invention.

The Checklists tab 300 as shown in FIG. 41 provides a convenient look at what is left to do in order to construct a complete mission.

The checklist on the left shows each of the Orion components with their status(es).

Green icon—completed

Red icon—not completed

Click on an item in the left list to view a description of what needs to be done for that item to be complete. For example—Clicking on Mission Order—Describe Situation may show what needs to be done for Mission Order.

Detailed System Design

Main Window

The java application is a single window with a tabbed pane, one tab for each key item (plugin). The title contains the name of the current mission.

The main menu may include one or more of the following elements:

(1) File
(2) New Mission . . . (to create a new mission—define organization, title, description, number, level of difficulty)
(3) Open Mission . . . (to open an existing mission)
(4) Save Mission (to save all data for the currently selected mission)
(5) Save Mission As . . . (to save the currently selected mission as a different mission allowing change of the parameters similar to New Mission . . . )
(6) Verify Mission Data . . . (to verify completion status of mission data)
(7) Advanced Mission Settings . . . (to maintain various mission settings not specific to a plugin)
(8) Export Mission for game environment (saves mission and then exports all available mission data in game environment format to export folder under the mission)
(9) View Orion Users Guide (provide link to view user's guide)
(10) About Orion . . . (provide Orion version/licensing information)
(11) Quit (exit the application)
(12) Menu items for each plugin (only accessible when the tab for that plugin is selected)—see individual plugins for details.

Defining a New Mission

Figure 42:
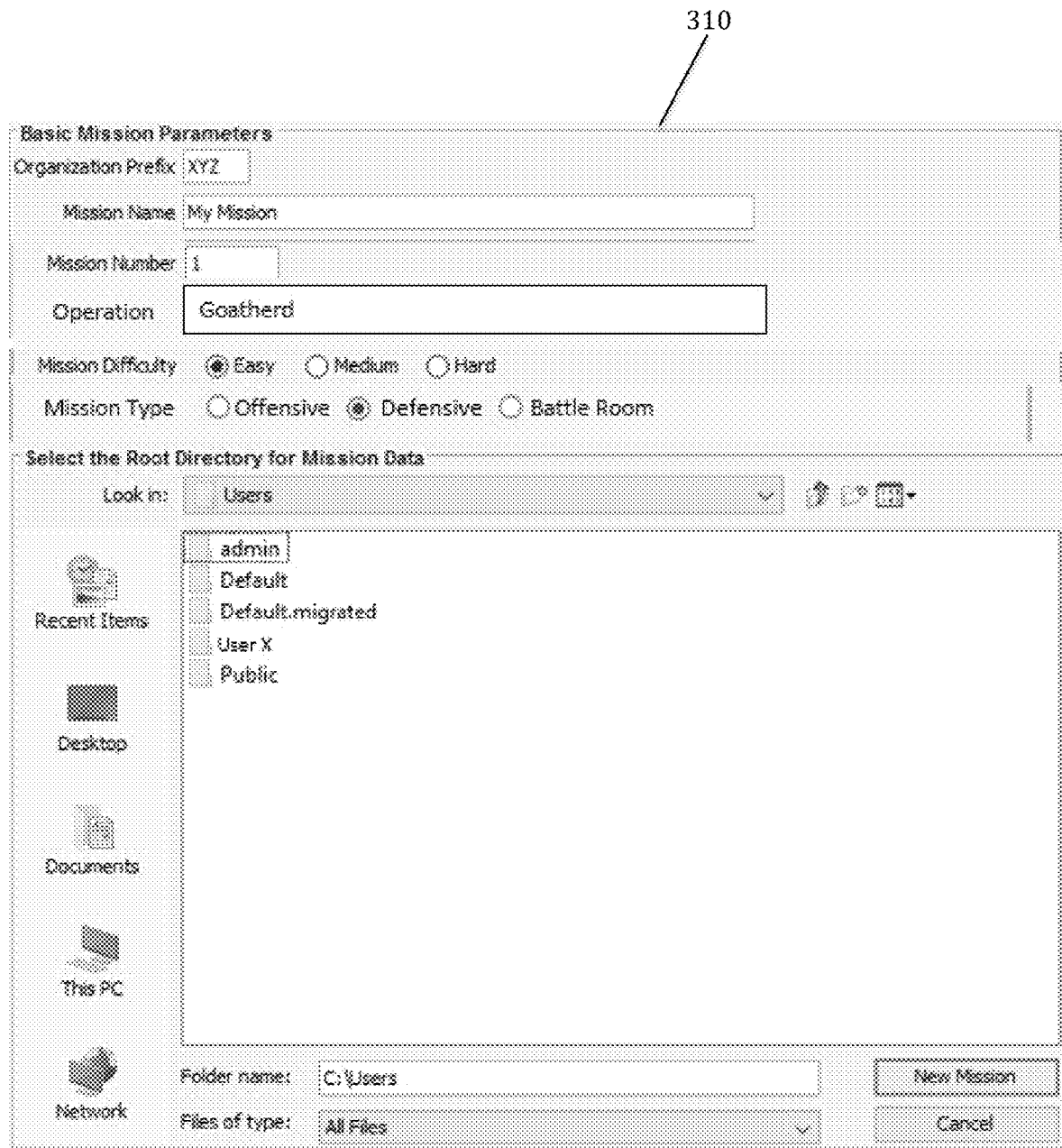
FIG. 42 illustrates a define mission dialog according to embodiments of the present invention.

File→New Mission . . . brings up a dialog shown in FIG. 42 where the user can define the basic information for the mission, such as one or more of:

(1) Organization
(2) Mission Name
(3) Mission Number
(4) Operation
(5) Mission Level of Difficulty (Easy, Medium, or Hard)—default=Easy
(6) Mission Type (Offensive, Defensive, Battle Room)—default=Defensive Once defined, the user is provided a way to save the mission to a user-selected directory. A subdirectory named <ORG>_Mission_<Difficulty Level> is created with data directories underneath for each plugin and for exporting the mission to game environment.

Opening an Existing Mission

File→Open Mission . . . brings up a file selector dialog to browse to and select the desired mission.

Saving a Mission as Another

File→Save Mission As . . . brings up a dialog similar to defining a new mission for the user to update basic information for the mission and select where to save it. The same naming conventions for the mission is followed and all current mission data is copied to the new mission.

Verify Mission Data

File→Verify Mission Data will examine the current mission data and present a dialog indicating the completeness and consistency of the data. The verification will include Verify mismatches in exported files (run "orchestration script" to verify files are complete/consistent)

Verify all required pieces for the Mission have been defined

Figure 43:
FIG. 43 illustrates a mission verification summary dialog according to embodiments of the present invention.

FIG. 43 is one example of how the dialog 320 may appear.

Advanced Mission Settings

Figure 44:
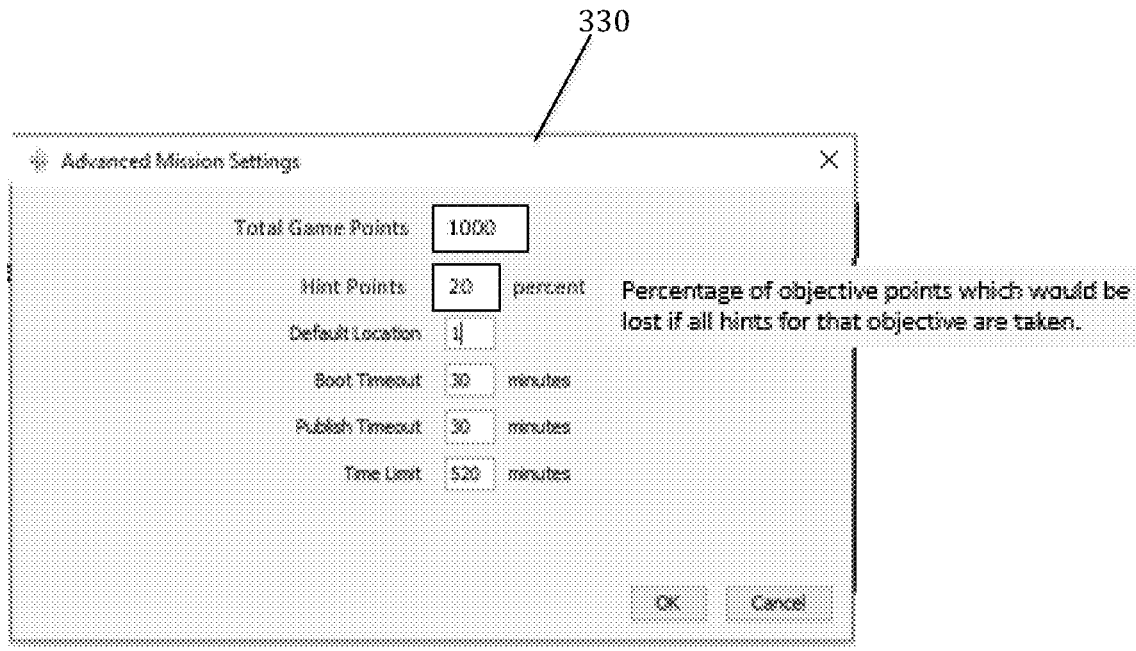
FIG. 44 illustrates an advanced mission settings dialog according to embodiments of the present invention.

File→Advanced Mission Settings . . . brings up a dialog 330 to allow update of mission settings (which are defaulted as shown in FIG. 44) including:

Total Game Points—default to 1000 for Easy, 2000 for Medium, 3000 for Hard

Hint Points—default to 20%

Default Location—default to 1

Boot Timeout—default to 20 minutes

Publish Timeout—default to 40 minutes

Time Limit—default to 480 minutes

Tooltips is provided for each item.

Export Mission for Game environment

Figure 45:
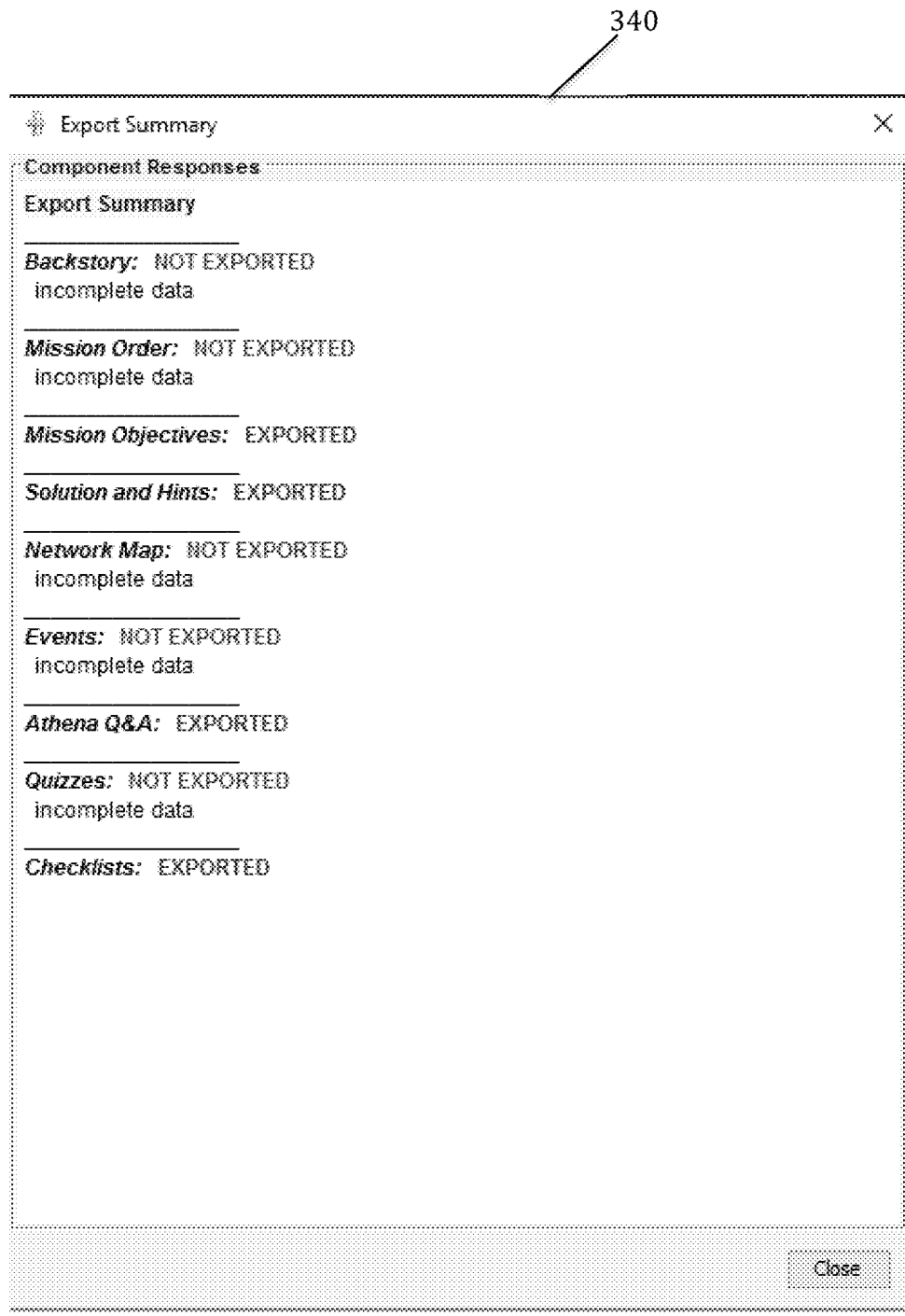
FIG. 45 illustrates an export summary dialog according to embodiments of the present invention.

File→Export Mission for game environment writes out the appropriate mission files in format for the target game environment. The user is then presented with a dialog 340 as depicted in FIG. 45 indicating the success of the export.

View Orion User's Guide

File→View Orion User's Guide will bring up the document in a browser window.

About Orion

File→About Orion . . . brings up a dialog with information about Orion including:

Orion version number

Owner copyright information

Any End User License Agreement (EULA) information required

Link to Orion User's Guide

Quit

File→Quit exits the Orion application. The mission designer is warned if there is any unsaved data.

Mission Development Methodology Walkthru

Figure 46:
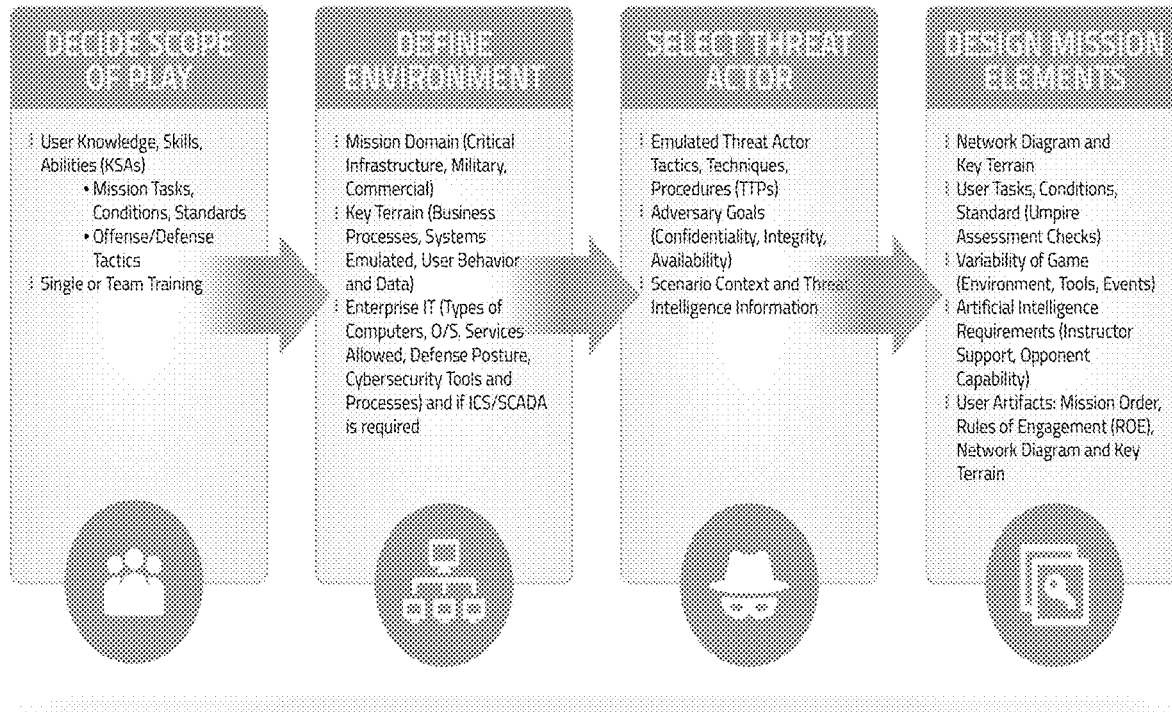
FIG. 46 illustrates a mission development methodology walkthrough according to embodiments of the present invention.

Central to the use of Orion is the Mission Development Methodology Walkthru pane showing in FIG. 46 the order of how to develop a mission correctly. The pane is always available with status of where the mission designer is for each step. The pane is also able to be hidden.

An example of what the Mission Development Walkthru may look like is shown in FIG. 47. This panel is the Orion implementation of the Mission Design process.

Red/Green lights indicate the status of each step. The arrow icon to the right of the pane allows the pane to be "hidden" (collapsed). While collapsed the arrow icon allows the pane to be displayed (expanded) again.

Welcome Page

Figure 48:
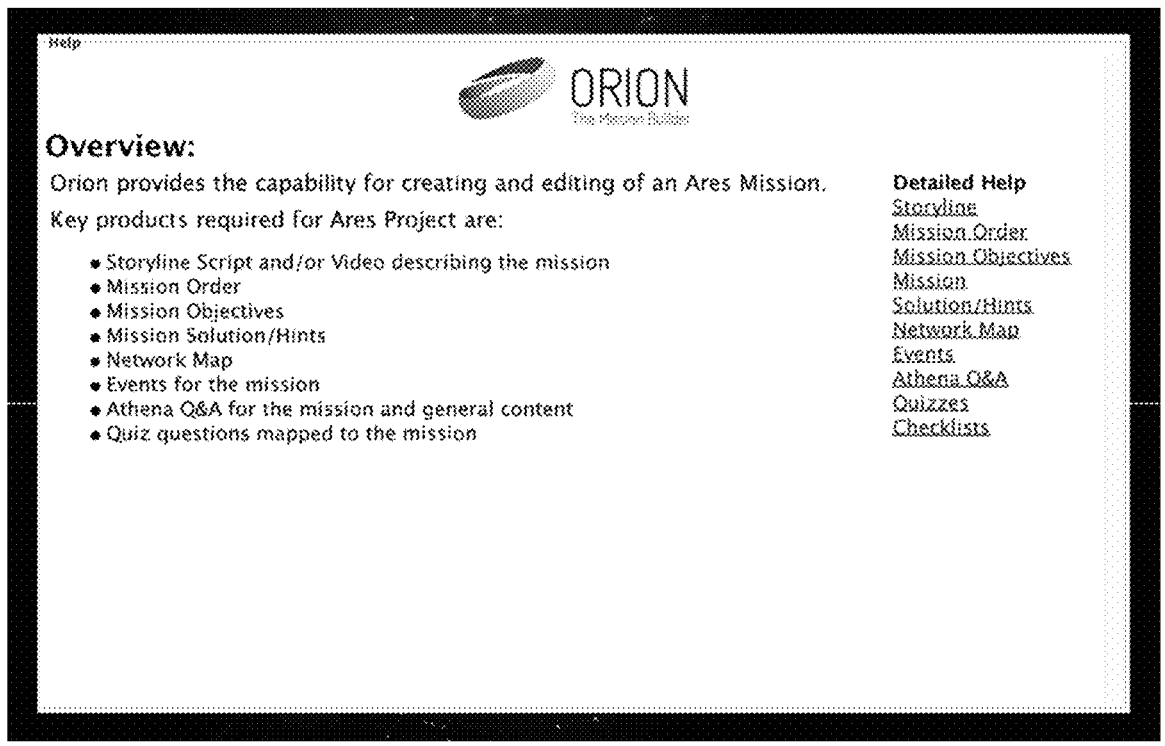
FIG. 48 illustrates a welcome page according to embodiments of the present invention.

The main "Welcome" page as depicted in FIG. 48 for Orion provides help information overview as well as detailed information on each of the plugins. This information is maintained as html files for each item (overview/plugin).

Mission Setup Plugin

Information is gathered at the beginning of mission definition that defines what the mission is about. The Mission Setup Plugin has several tabs allowing the mission designer to define various aspects of the mission, such as one or more of:

(1) User Pre-requisites
(2) Key Terrain
(3) Mission Characteristics
(4) Training Outcomes
(5) Associate Mission Related File(s)

Mission Setup Menu Items

Print Mission Setup—brings up a print dialog with available printer(s) and print text to selected printer.

Figure 49:
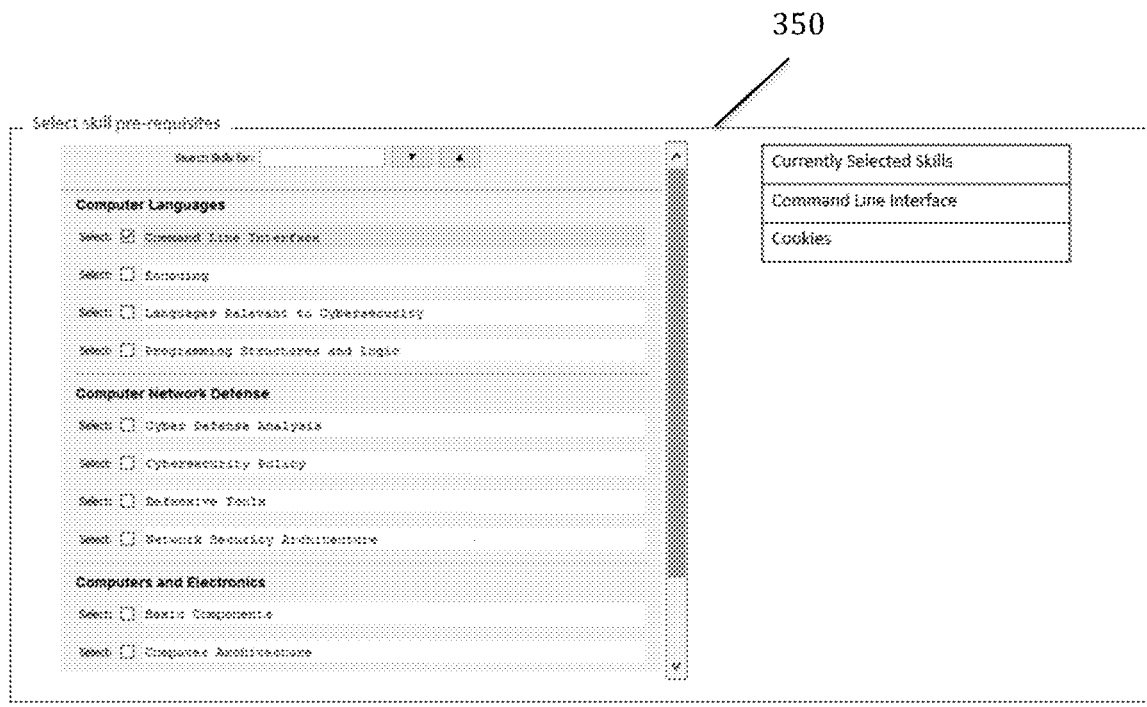
FIG. 49 illustrates a user pre-requisite skills interface according to embodiments of the present invention.

Example of concept:
Mission:
Name: Disable Botnet
Number: 1
Operation: Goatherd
Difficulty: Easy
Type: Offensive
Mission Files:
Mission Storyline: Mission_1_Storyline.docx
Mission Video: Mission1_intro.mp4
Mission Thumbnail: mission1.thumb
Mission Coin: GoatherdInsignia.png
Other Mission Info:
Mission 1 Design.pptx
Mission_1_Easy_Solution.docx
User Pre-requisites:
Computer Languages
   Command Line Interface
Key Terrain:
Cyber Key Terrain: Maravian National Bank
Protocols: telnet, vnc, ssh
Systems/Data: Command and Control Server
Baseline Flows:
Defensive Posture:
Mission Characteristics:
Summary: Infiltrate the enemy's environment and disable the command and control web server responsible for thousands of defrauded victims.
Purpose: The purpose of Mission 1 is to have a basic offensive mission where early users can get used to Athena and how the game environment works. They will learn skills applicable to Certified Ethical Hacking (CEH).
Certification: CEH
Domain: Commercial
Type of Play: One-Sided
Number of Players: One or more Players
   Max Players: 10
   Max Trainers: 5
Network Size: Small (~10 VMs)
Network Complexity: Basic
Location: 23.3790 N/113.7633 E
Training Outcomes:
Learn about password cracking techniques
Manage firewall rules
Identify Industrial Control Systems ("ICS")
Mission Setup Plugin Tab
User Pre-requisites This subtab 350 shown in FIG. 49 allows the mission designer to select which skills a player should have prior to playing the mission.

A search capability is provided for finding skills in the list.
All currently selected skills are displayed in a list to the right.

Key Terrain

This subtab 360 shown in FIG. 50 provides for entry of data which define the key terrain of the mission.

Mission Characteristics

Figure 51:
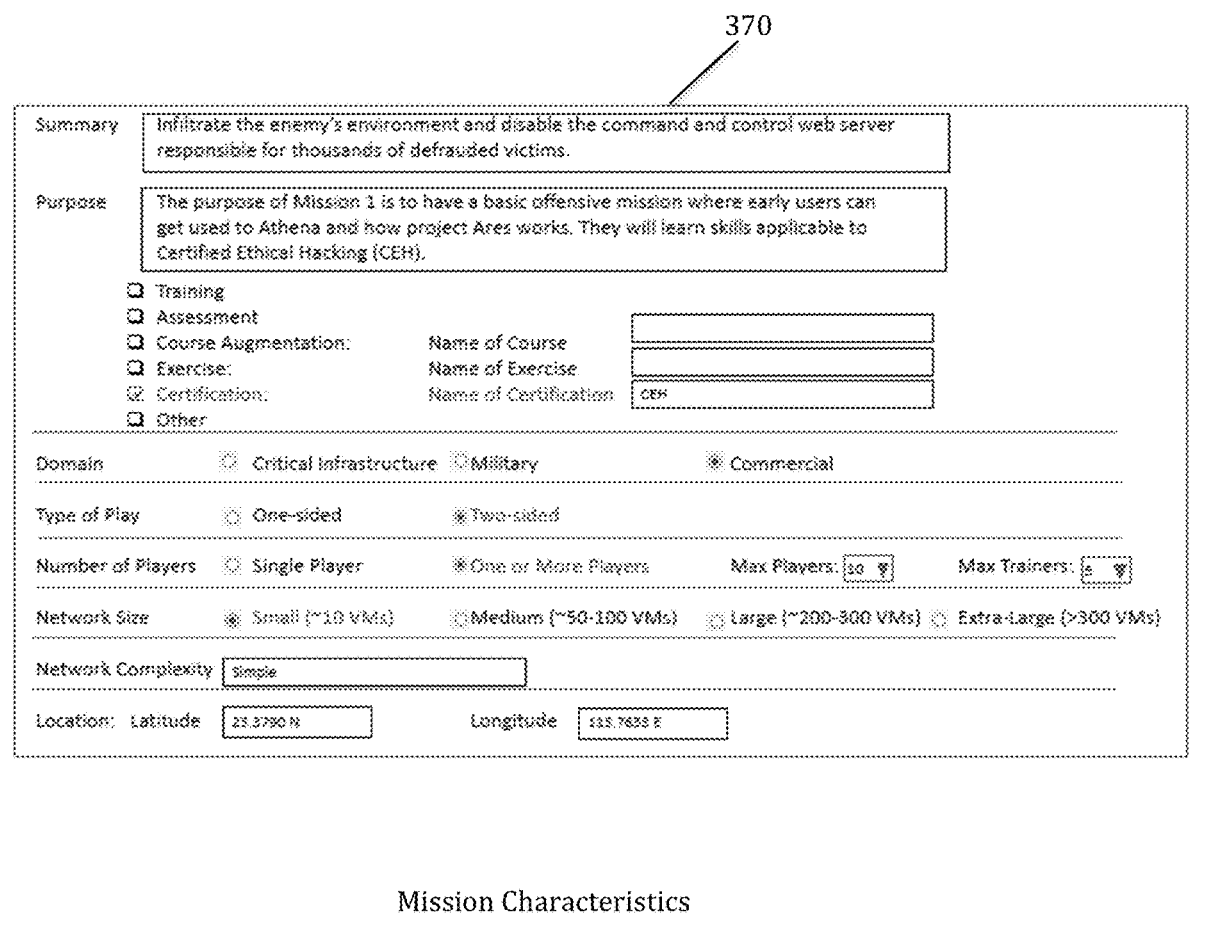

This subtab 370 shown in FIG. 51 provides for entry of data which define the general characteristics of the mission.

Figure 52:
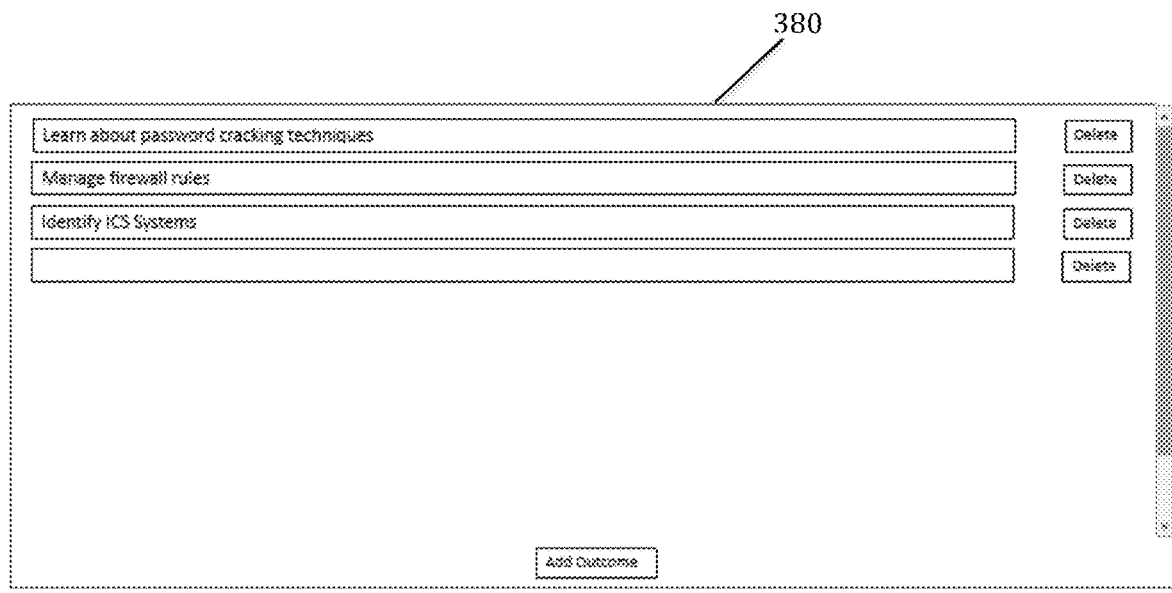
FIG. 52 illustrates a training outcomes interface according to embodiments of the present invention.

Selected items are "highlighted" and fields default as follows:
Domain—Critical Infrastructure
Type of Play—Two-sided
Number of Players—One or More Players
Max Players—5/Max Trainers—3
Tactics—Offensive
Network Size—Small Training Outcomes Tab This tab 380 shown in FIG. 52 allows the mission designer to define training outcomes for the mission.

Associate Mission Related File(s)

Figure 53:
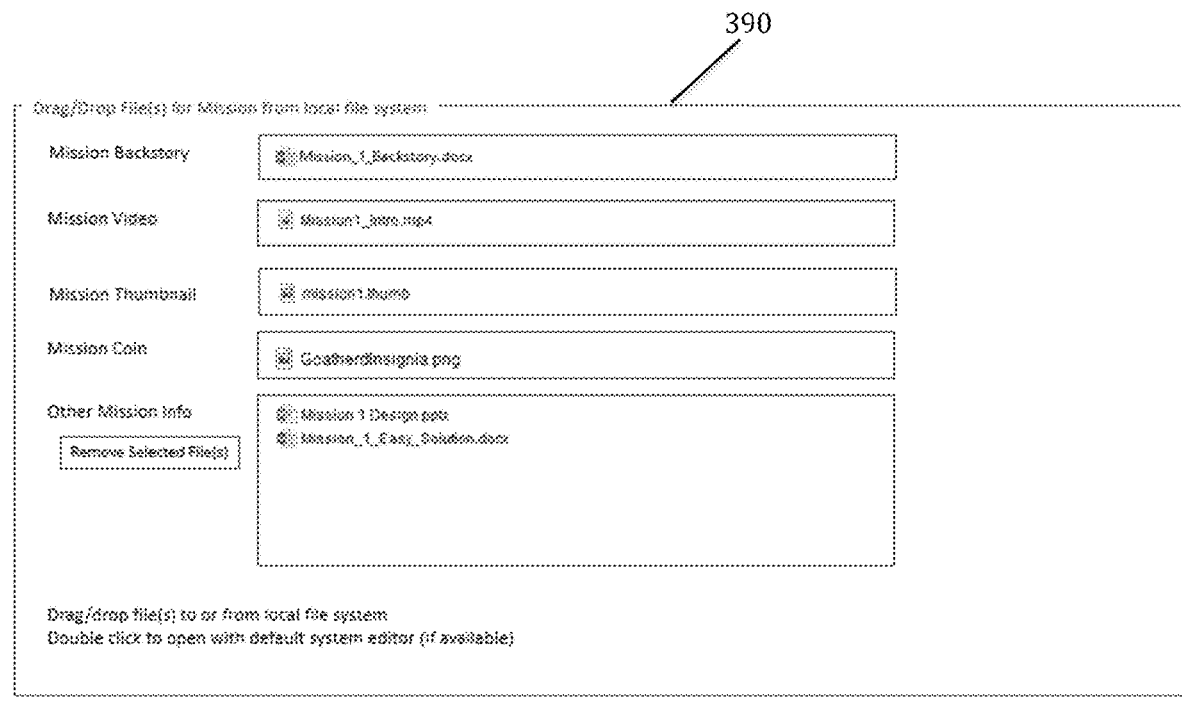
FIG. 53 illustrates an associated mission files interface according to embodiments of the present invention.

This tab 390 shown in FIG. 53 allows the mission designer to associate file(s) with the mission. Some files are known/required while others are optional information.

Mission Order Plugin

The Mission Order Plugin provides the capability to define information for the mission, such as one or more of:

(1) Situation (overall scenario and threat intelligence information)
(2) Mission Core Competencies (required to go on mission)
(3) Execution Instructions: User Credentials and Tools
(4) Sustainment (how long mission should take and requirements on the end of the mission)
(5) Command & Control (who commands the mission above the Team Lead and any reporting requirements)
(6) Rules of Engagement (ROE)
(7) References Mission Order Menu Items Save Mission Order (save data for this plugin in the associated data folder under the mission)

Import Mission Order from game environment (browse to select existing mission order file from game environment)

Export Mission Order to game environment (export mission order in game environment format to export folder under the mission)

Mission Order Plugin Tab

Figure 54:
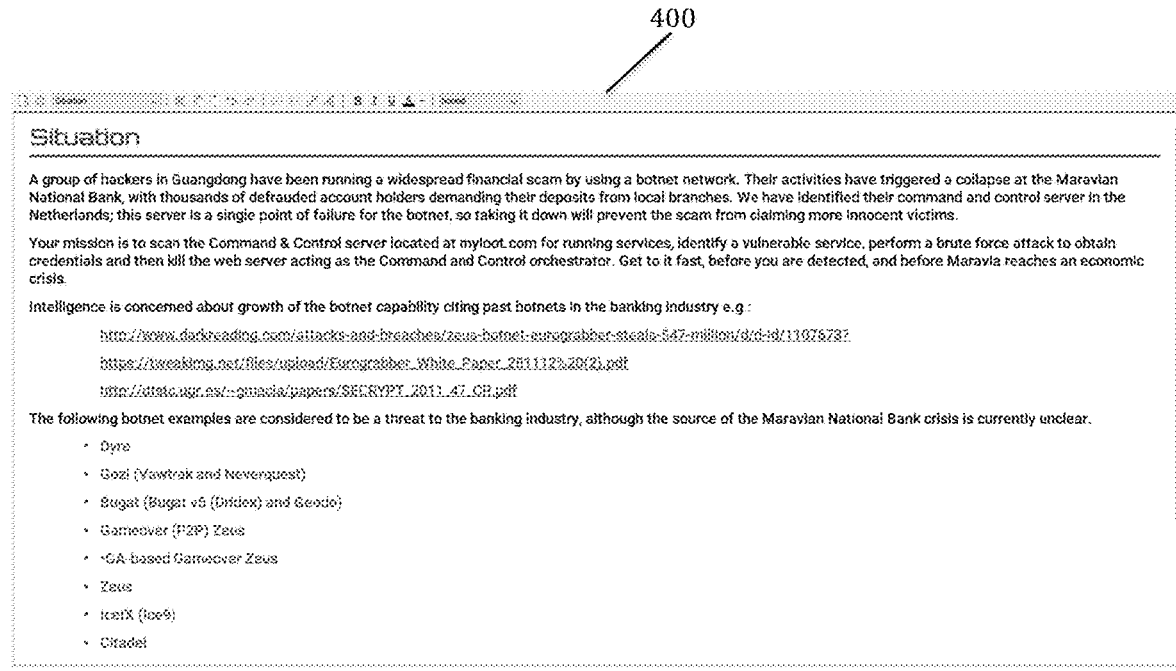
FIG. 54 illustrates a mission order page interface according to embodiments of the present invention.

The Mission Order plugin tab 400 provides a styled editor depicted in FIG. 54 for entering the various components of the Mission Order as "Pages" within the tab.

The mission designer is able to switch between the pages by selecting the desired page to be displayed.

A styled editor is implemented to provide tools to edit/format the text for the Mission Order. Capabilities include:
Basic operations: cut, copy, paste, undo, redo
Lists: bulleted and numbered lists
Hyperlinks: insert/edit/delete a hyperlink
Paragraph styles
Character styling: Bold, Italic, Underline, Color Mission Objectives Plugin The Mission Objectives plugin provides the capability to define Mission Objectives, associated badges/skills and umpire detections.

Mission Objectives Menu Items

Save Mission Objectives (save data for this plugin in the associated data folder under the mission).

Import Objectives from Game environment (browse to select existing mission objectives (objectives.yaml) file from Game environment—the file contains associated solutions/hints and umpire detections as well).

Export Objectives to Game environment (export mission objectives in Game environment format (objectives.yaml) to export folder under the mission—the file contains associated solutions/hints and umpire detections as well). The umpire check tag will automatically be assigned a value of "objective<#>" for each objective where <#> is the objective number. See Export Objective Scoring section for details on formatting scores for Game environment.

Export Objective Scoring

Orion Objective Scoring and GAME ENVIRONMENT Objective Game Points are two separate entities. In one embodiment, Orion Objective Scores for "normal" Missions need to be a percentage of total game points (adding up to 100%). This total number plus the Objective % points is used to determine the game points for the objective.

$$\text{objective game points} = (\text{percentage\_points} * \text{total\_game\_points})/100$$

For Battle Room Missions, there may be a large number of objectives (30+) which are not necessarily related to each other, so Orion maintains the concept of just a relative score (i.e. 1-10) rather than a percentage. This number is used (as a "percentage" of objective points) along with the total number of points for the game to determine the game points for the objective.

$$\text{objective game points} = (\text{battle\_room\_score} * \text{total\_game\_points})/\text{sum}(\text{all battle\_room\_score})$$

Hint/Solution points is determined based on a total hint percentage—the percentage of points of objective that would be lost if ALL hints for that objective were taken.

$$\text{hint score} = ((\text{hint\_percentage} * \text{objective game points})/100)/\text{number of hints for that objective}$$

"Normal" Mission Example

This is an example based on mission 1 easy (services_0.yaml).

Given: (1) total game points of 1000; (2) hint % of 20
    objectives:
    tag: objective1
    description: Gather credentials
    percentage_points: 20
    points: 200
    coreskills:
        points: 1
        name: Command_Line_Interface
        points: 1
        name: O/S_Differences(Windows|Linux_methods)
        points: 2
        name: Offensive_Tools
        points: 1
        name: Network_Services_and_Communication
        points: 1
        name: Pentesting
    hints:
        points: 8
        text: "You may or may not see an IP address . . . \n"
        points: 8
        text: "You can use nmap to find open ports . . . \n"
        points: 8
        text: "You may be awarded Objective 2 early . . . \n"
        points: 8
        text: "For ssh, use one of these commands . . . \n"
        points: 8
        text: "For vnc: Use one of these commands . . . \n"
        points: 8
        text: "For telnet, you can use the following . . . \n"
    tag: objective2
    description: Gain access to C2 server
    percentage_points: 30
    points: 300
    coreskills:
        points: 20
        name: Command_Line_Interface
        points: 20
        name: System_Administration
        points: 20
        name: Network_Tools
    hints:
        points: 0
        text: "Login to the C2 server . . . \n"
    tag: objective3
    description: Kill Web Service to disable botnet
    percentage_points: 50
    points: 500
    coreskills:
        points: 2
        name: Command_Line_Interface
        points: 2
        name: System_Administration
    hints:
        points: 50
        text: "To verify that this machine is acting . . . \n"

Battle Room Mission Example

This is a "partial" example based on battleroom-host easy services_0.yaml.

Given: (1) total game points of 1000; (2) hint % of 20; (3) assume 20 objectives half with a battleroom_score of 2 and half with battle_room_score of 3
    objectives:
    tag: objective1
    description: From the Kali client, use the ping program/utility . . .
    points: 60
    battle_room_score: 3
    prompt: 900
    category: Reconnaissance
    coreskills:
        name: Command_Line_Interface
        points: 1
        name: Core_Cybersecurity_Tools
        points: 1
        name: Network Tools
        points: 1
        name: 0/S_Knowledge_and_Commands
        points: 1
    hints:
        points: 6
        text: ping is the program used to send ICMP diagnostic messages, . . .
        points: 6
        text: ping LinuxServerIP
    tag: objective2
    description: From the Windows client, use the ping program/utility to . . .
    points: 40
    battle_room_score: 2
    prompt: 900
    category: Reconnaissance

```
coreskills:
    name: Command_Line_Interface
    points: 1
    name: Core_Cybersecurity_Tools
    points: 1
    name: Network_Tools
    points: 1
    name: O/S_Knowledge_and_Commands
    points: 1
hints:
    points: 4
    text: ping is the program used to send ICMP diagnostic
        messages, . . .
    points: 4
    text: ping LinuxServerIP
```

Mission Objectives Plugin Tab

Figure 55:
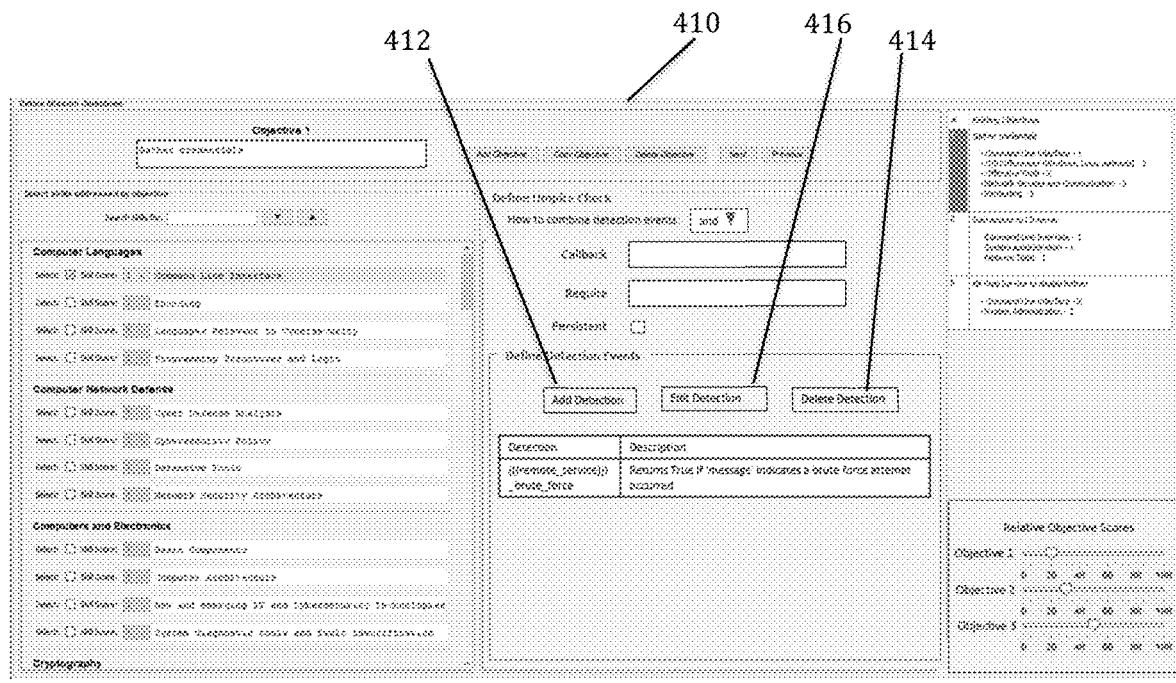
FIG. 55 illustrates a mission objectives interface according to embodiments of the present invention.

The Mission Objectives plugin tab 410 shown in FIG. 55 provides the capability to add, delete, or reorder mission objectives in a list.

The list of current Objective(s) with associated skill(s) is displayed separately on the left side of the plugin tab to allow for easy viewing/switching between objectives.

For each objective:

The mission designer is able to assign score points based on mission type (see below).

A list of available skills is displayed. The mission designer selects skill(s) from the master database list (see Orion—Database IDD) and assign their score (between 1-10).

The mission designer selects Umpire Detection(s) to associate with the objective and assign values to it (see below).

Objective Scoring

Mission scoring is based on the Mission Type.

Mission: The Objective score is relative. The sum of all Objective scores in the mission must add up to 100%. If the user slides one up, the score(s) is adjusted to re-equal 100%.

Battle Room: Each Objective score is independent with a value of 1-10 (10 being most difficult)

Umpire Detections

The mission designer is able to define the Umpire Check associated with the Objective.

Detection events are combined based on the selected value (and, or, data)—default=and.

Optionally, a callback function to be called with the return of any detection events. The "master list" of callback functions is defined in Orion—Database IDD.

Optionally, other Umpire Check(s) which are required to be accomplished prior to this one being activated.

Indicate whether the Umpire Check should be persistent.

Add, Delete or Edit associated umpire detection events.

Add Detection Event

Add Detection by clicking Add Detection button 412. This will bring up a selection list of all detections currently NOT associated with this objective.

Select the desired detection and click OK. This displays a dynamic dialog with the fields associated with the detection for the user to fill in.

Click OK to add the detection (or cancel to exit dialog without adding the detection)

Delete Detection

Delete a detection event by selecting the detection(s) in the list of current detections and clicking the Delete Detection button 414. User is asked to confirm (Are you sure?)

Edit Detection

Edit a detection event by selecting the detection in the list of current detections and clicking the Edit Detection button 416.

This brings up the same dynamic dialog as Add Detection—with current values filled in.

Modify value(s) as desired and click OK to save/Cancel to exit without saving

Mission Solutions and Hints Plugin

The Mission Solutions and Hints Plugin provides the capability to define the mission solution and associated hint(s) for each objective. The hints provide multiple statements to lead the player to the solution. The solution walks the player through the objective.

Mission Solutions and Hints Plugin Menu Items

Save Mission Solutions (save data for this plugin in the associated data folder under the mission)

Mission Solutions and Hints Plugin Tab

Figure 56:
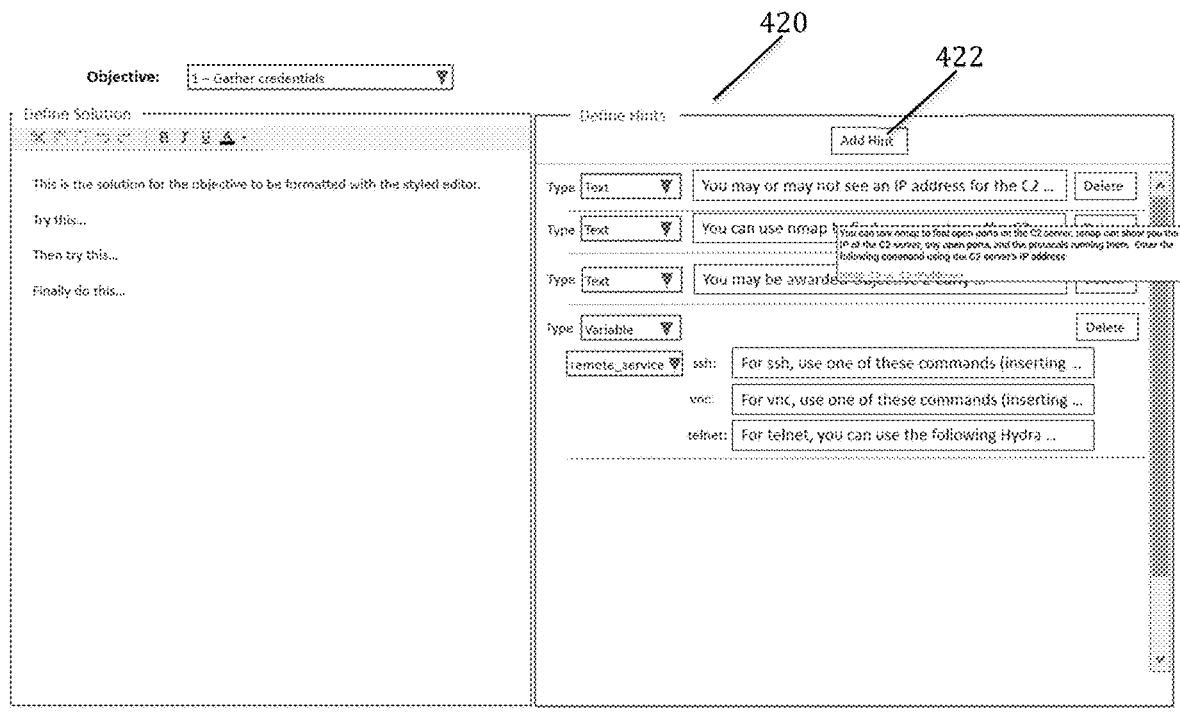
FIG. 56 illustrates a solutions and hints interface according to embodiments of the present invention.

The Mission Solutions and Hints plugin tab 420 depicted in FIG. 56 provide the selection of objective and then defining the solution and associated hints for that objective using a styled editor.

A styled editor is implemented to provide tools to edit/format the text for the Objective Solution/Hint. Capabilities include:

Basic operations: cut, copy, paste, undo, redo

Lists: bulleted and numbered lists

Hyperlinks: insert/edit/delete a hyperlink

Paragraph styles

Character styling: Bold, Italic, Underline, Color

For Hint(s), a list of current hint(s) with first part of the text of the hint are displayed.

To view the full hint without bringing up the editor dialog, hover over the hint text area.

The mission designer is able to add a hint as follows:

Click the Add Hint button 422 which adds another "line" to the list of hint(s).

Choose the type of hint

Text—just text information

Variable—based on a mission variable (e.g. remote service)

Figure 57:
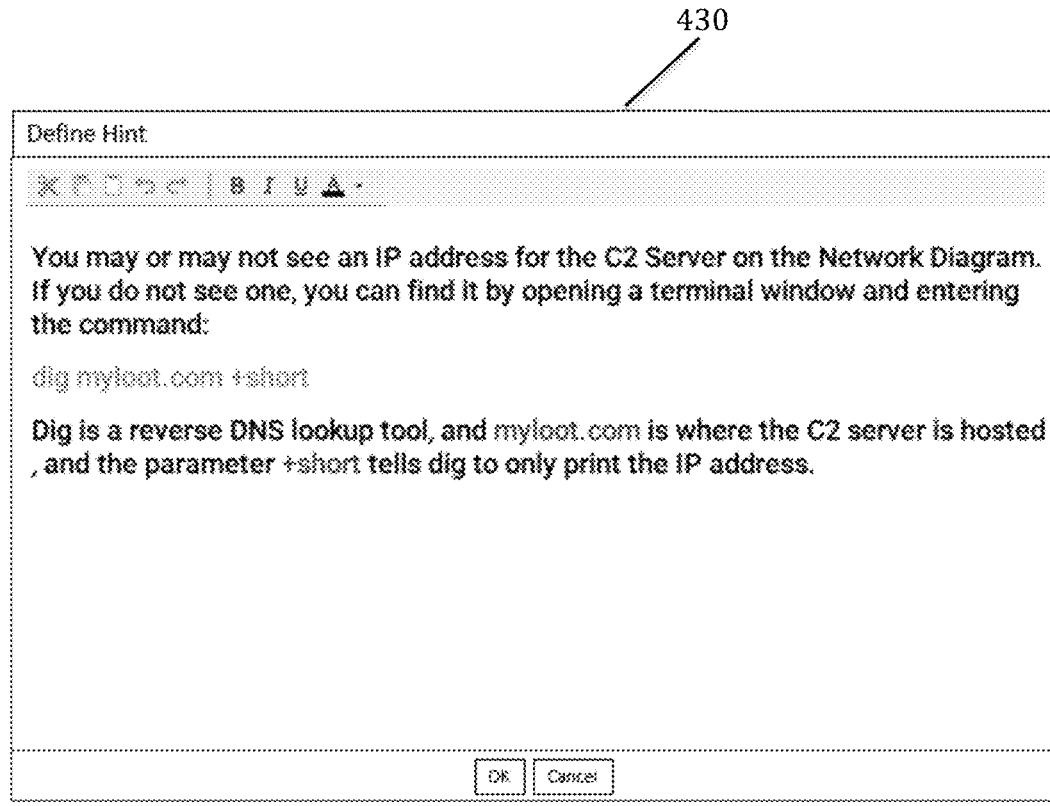
FIG. 57 illustrates an edit text hint interface according to embodiments of the present invention.

For Text hint, a dialog 430 such as shown in FIG. 57 is used:

click on the text area (which will display the first part of existing text for the hint) to bring up the styled editor When completed, click OK (or Cancel to close dialog without saving any changes)

For Variable hint—

Select the appropriate mission variable from list presented (or select+ADD to add a new variable—process described elsewhere)

"Rows" for each of the variable values is shown.

Click on desired text area to bring up styled editor to edit the hint (similar to Text hint)

To delete a hint, click the Delete button next to that hint.

Network Map Plugin

The Network Map Plugin will provide the capability to define the network for the mission.

Network Map Menu Items

Save (save data for this plugin in the associated data folder under the mission)

Create Network Map Report (user readable file with data describing the network—see Network Map Report section below)

Clear Drawing (delete all items on the network map)

Duplicate (make a duplicate of selected item(s))

Zoom to Fit (zoom as necessary to fit ALL nodes on the screen)

Snap to Grid (indicate whether items added to network map will automatically snap to the grid)

Snap Size (provide choice of size—e.g. 1 mm-10 mm)

Options to show various details on the network map

Show OS Type

Show Simple Name

Show IP Address(es)

Show Control IP Address

Show Services

Network Map Report

This report is a file of network map node information including:

Node Name

Node Type

Operating System

IP Address(es)

Service(s) Provided

Tool(s) Installed

Connections

Network Map Plugin Tab

Figure 58:
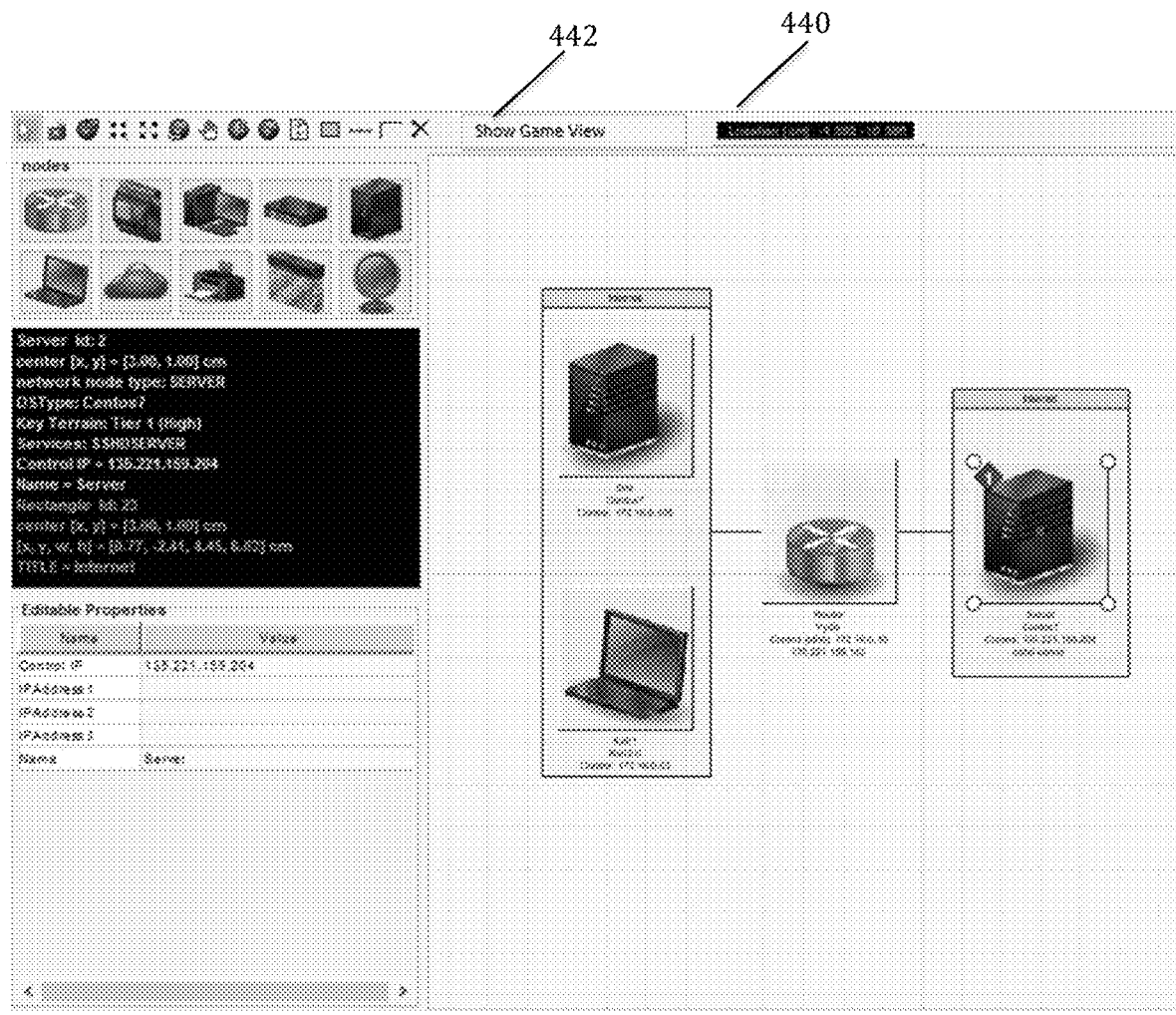
FIG. 58 illustrates a network map page interface according to embodiments of the present invention.

The Network Map plugin tab 440 shown in FIG. 58 provides tools to

Manage the network map layout (select item(s), zoom control, panning control, refresh, delete item(s), move item (s) on the map).

View the network map as it would be seen in the game environment game UI as well as full development mode.

Select from various Node types and add to the network map. These nodes are icons representing the type of node (e.g. server, firewall, printer . . . ).

Apply various attributes to a selected node on the map. The attributes available are based on node type.

Adversary (mark whether this node is an adversary)

Services (list from "master list" as defined in Orion—Database IDD)

Network Interfaces (random vs regular)

Tools (list from "master list" as defined in Orion—Database IDD)

Operating System (OS) (current list of operating systems is provided in Appendix A)

Key Terrain: Not Key Terrain, Tier 1 (High), Tier 2 (Medium), Tier 3 (Low)

Connect nodes on the map.

Select a node or connector on the map illustrated in FIG. 58 and provide a list of properties which can be edited for that item based on the of node. See Appendix B for set of properties per node.

Network Map Viewing Modes

Two modes of network map viewing are available to the mission designer.

Developer View—allows editing of the network map and shows ALL network nodes

Game View—view only mode showing just the nodes which will also be shown in the Game environment Game UI Click on the "Show Game View" button 442 to switch to view-only mode (with "floating" nodes such as Trainer being hidden). The button name will change to "Show Developer View". Clicking the newly named button will switch back to Developer View.

Adversary Node

The mission designer is able to indicate whether a node is an adversary.

Right-click on a node will bring up a popup dialog where Adversary may be (un)checked.

Services for Node

The mission designer is able to manage the service(s) associated with a node on the map.

Right-click on a node brings up a popup dialog to select from options to manage the service(s).

Add . . . brings up the selection list of those services NOT associated with this node yet and they can pick ONE to add (or cancel out of process)

Display field(s) for service (from master service database) and allow user to fill in/edit based on "type" of data for each field.

Click OK to save configuration for this service with the node (or click Cancel to close dialog without saving). Orion will keep track of whether all required fields were filled in—for completeness checks.

Delete—brings up the selection list of those which ARE associated with this node and they can pick multiple and delete (with "are you sure? confirmation)

Configure—brings up the selection list of those which ARE associated with this node and they can pick ONE and configure it with the dynamic dialog as shown for Add . . . .

Network Interfaces for Network

The mission designer is able to manage the network interfaces for a network on the map. This is a key step because the system configures the network and sets up interfaces and IP addresses through this process.

Right-click on a network "box" brings up a popup dialog to define the interface(s). A dialog displaying network interface fields is displayed for the mission designer to define.

Node Tools Installed

The mission designer is able to manage which tool(s) are installed for a node on the map. When a user selects a tool for a host computer on the network diagram, the system sets up all the installation configuration for that to be completely installed.

Right-click on a node brings up a popup dialog to select the tool(s).

Brings up the selection list of tools available (from "master list"—see Orion-Database IDD). Multiple selection is allowed.

Click the OK to associate the tool(s) (or click Cancel to close dialog without selecting the tool(s)).

Node Key Terrain

The mission designer is able to associate a Key Terrain value for a node on the map.

Right-click on a node brings up a popup dialog to select the desired Key Terrain value for this node.

Events Plugin

The Events Plugin provides the capability to define the various events for a mission.

Events Menu Items

Save (save data for this plugin in the associated data folder under the mission)

Events Plugin Tab

The Events plugin tab 450 as shown in FIG. 59 provides tools to define the various events for a mission.

The tab displays the list in time order and provide capability to Add, Edit, Delete events in the list To Add an event:

Click the Add Event button 452. This will bring up the Define Event dialog with blank fields to be selected/filled in.

Select Event Frequency (Run Once, Periodic) and enter start time (and interval if Periodic)

Select Event Type

Select Event Category from dropdown of values from the master Adversary Event list (see Orion—Database IDD)

Once the Category is selected, the Event Technique dropdown is populated with corresponding values from the master list, select value Based on the Category/Technique, appropriate fields are shown for any necessary parameters (from master list). Enter/select values desired.

Click on the Target(s) field to bring up Select Target(s) dialog and choose the desired target(s) from list of appropriate(??) network map nodes and any existing event targets emitted by earlier Delivery events.

Click OK to close target dialog and display selected target(s) for the Event. (Click Cancel to close dialog without making any changes)

Click OK to close dialog and add the event to the Event List in time order (or Cancel to close without adding).

To Edit an existing event:

Double-click on the desired row of the list to bring up the Define Event Dialog with current values filled in.

Make changes desired (similar to Add Event) and click OK to close the dialog and apply the changes to the Event List (or Cancel to close without making changes).

To Delete an existing event:

Click on the desired row to highlight it.

Click the Delete Selected Event button 454 to delete it (with confirmation)

Athena Q&A Plugin

The Athena Q&A Plugin provides the capability to define questions and answers for the Artificial Intelligence (AI) in-game Advisor for Game environment (ATHENA). The types of Q&A include Mission Specific (specific to (the objectives of) this mission)

General Cybersecurity (general offense/defense)

Athena Persona

Athena Q&A Plugin Menu Items

Save Athena Q&A (save data for this plugin in the associated data folder under the mission)

Search for Athena Q&A (search the "master" Athena Q&A data file (see Orion—Database IDD for format) and select which one(s) to include)

Brings up dialog 460 with criteria to search by criteria for search:

Category (Mission Specific, General Cybersecurity, Athena Persona)

Question Content

Answer Content

Mission Objective (if entered, then the current Mission Number is assumed)

Click Search to obtain dialog with list of Q&A matching the criteria entered

Select the desired Q&A and click Apply to bring into the Mission (click Cancel to close dialog without applying any Q&A)

Export Athena Q&A File (export Athena Q&A in Game environment format to export folder under the mission) The format for the file(s) is given in the Orion—Database IDD.

Athena Q&A Plugin Tab

Figure 60:
FIG. 60 illustrates a questions and answers interface according to embodiments of the present invention.

The Athena Q&A plugin tab 460 shown in FIG. 60 provides the capability to Add/Delete/Edit questions of each category type.

Data for each Q&A include:

Category (as indicated by individual tab for each)

Question

Answer

Mission Objective (for Mission Specific category only)

NOTE: for Mission Specific Q&A—the current Mission Number is assumed.

Quizzes Plugin

The Quizzes Plugin provides the capability to pull existing questions from the master quiz database and to define new quiz questions for the mission. The questions are multiple choice in nature, may be associated with multiple missions, and optionally provide Key Words, and a Source for the information.

Quizzes Plugin Menu Items

Save Quizzes (save data for this plugin in the associated data folder under the mission)

Search for Questions (search the "master" quiz data file (see Orion—Database IDD for format) and select which one(s) to include in this mission)

Brings up dialog with criteria to search by criteria for search:

Difficulty Level (Any, Easy, Medium, Hard)

Key Word(s)

Question Content

Answer Content (search in any of the answer fields)

Mission(s)

Skill Content

Click Search to obtain dialog with list of quiz questions matching the criteria entered Select the desired question(s) and click Apply to bring into the Mission (click Cancel to close dialog without applying any questions)

Export Quiz Questions (export Quiz Questions in Game environment format to export folder under the mission)

The format for the file is given in the Orion—Database IDD. (a csv formatted file will also be exported for easier reading by a user.)

Quizzes Plugin Tab

Figure 61:
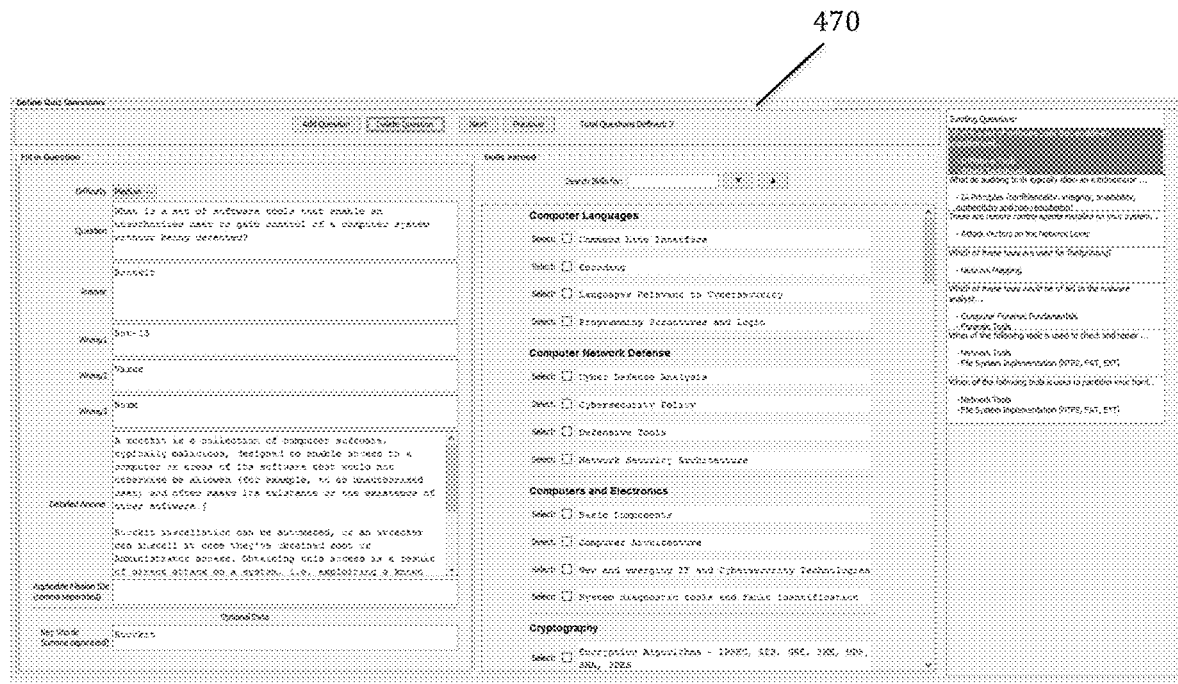
FIG. 61 illustrates a quizzes page interface according to embodiments of the present invention.

The Quizzes plugin tab 470 shown in FIG. 61 provides the capability to Add/Delete/Edit quiz questions.

Data for each question include:

Difficulty Level (Any, Easy, Medium, Hard)

Question

Answer 3 wrong answers

Detailed Answer

Applicable Mission ID(s)

(optional) Key Word(s)

In addition, skills earned for the question may be selected from list of Badges/Skills.

The list of current Quiz Question(s) with associated skill(s) is displayed separately to allow for easy viewing/switching between questions.

Mission Library Plugin

Figure 62:
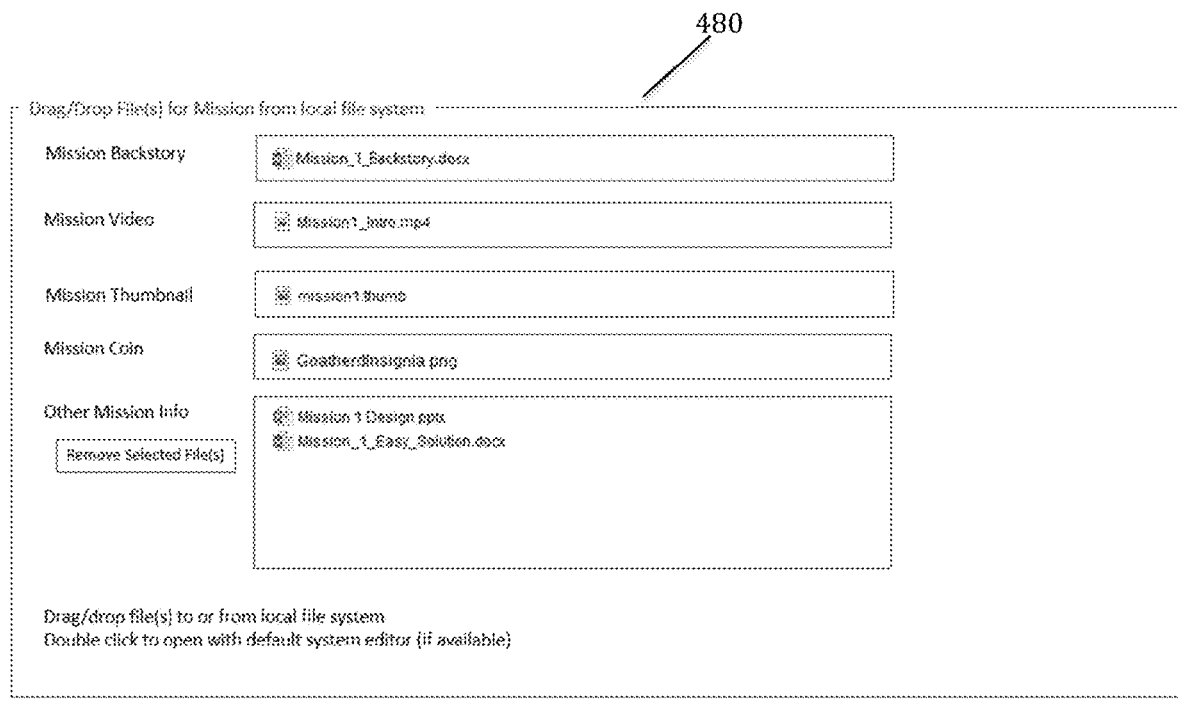
FIG. 62 illustrates a mission library interface according to embodiments of the present invention.

The Mission Library plugin 480 shown in FIG. 62 allows the mission designer to check in/out any of the mission associated files from the repo.

File(s) may be selected on the local file system and drag/dropped into the appropriate field. A file may also be selected on this page and drag/dropped onto the local file system.

The following files are required for the mission to be complete. Only a single file may be selected for these—if another file is selected, then it will replace the existing one (user is warned).

Mission Storyline

Mission Video

Mission Thumbnail

Mission Coin

Other Mission Info is for optional file(s) which the mission designer may want included/saved with the mission. Multiple files may be selected.

To remove file(s) from this list, select desired file(s) in list and click the Remove Selected File(s) button.

Double-click on a file to open it with default system editor (if available).

Battle Room Support

Battle Rooms are places where players can do small technical tasks and reinforce their knowledge in different areas. Missions are end-to-end scenarios where players need to be able to figure out how to solve a problem with a set of tools. As such, Battle Rooms need to be handled differently in some areas. They do not require some of the mission complexity.

The following plugins do not apply for Battle Rooms since they are virtual environments that are used outside of a mission context:
   Storyline
   Mission Setup
   Mission Order
   Athena Q&A
   Quizzes The tabs for these plugins are not be displayed nor considered for checklists/completeness when the mission designer chooses the Mission Type as Battle Room upon mission creation/save as (see screenshot under Defining a New Mission section of this document).

In addition, the following differences might also be considered
   Objective Scoring (see Objective Scoring section of this document)
   Work roles
   VM Construction There are several files which Orion needs to output for the VEM to be able to create/launch a mission. Details of data fields for each file are defined in the Orion—Game environment VEM IDD. These subsections define where the data is derived from within Orion.

Blueprint

The blueprint.yaml file depicted in Table 3 outlines all virtual machines (VMs) to be created by the VEM. The following table shows how/where Orion gets data to write this out.

TABLE 3

| yaml tag | parent tag | Orion Source |
| --- | --- | --- |
| serial_id | — | yymmdd<##> when file is to be written out |
| base_vapp | — | Derived from information on New Mission/Save Mission As . . . Dialog <ORG>_mission_<#>_<Difficulty> |

TABLE 3-continued

| yaml tag | parent tag | Orion Source |
| --- | --- | --- |
| vapp | — | Version for this mission base_vapp_<##> - start at 00 then check/increment when this mission is "deployed" |
| vms | — | Network Map |
| <vmName> | vms | Network Map |
| template | <vmName> | Network Map |
| startOrder | <vmName> | Default to 1 for Master-C7 and 2 for other VMs - modifiable by user |
| ram | <vmName> | Default to template value - modifiable by user |
| cpu | <vmName> | Default to template value - modifiable by user |
| core | <vmName> | Default to template value - modifiable by user |
| networks | <vmName> | |
| <network> | networks | |
| type | <network> | |
| ip | <network> | |
| mask | <network> | |
| mappable | <network> | |
| adapter | <network> | |
| nodeMeta | <network> | |
| location | nodeMeta | |
| type | location | |
| x | location | |
| y | location | |
| services | | Deprecated |
| mirror | <vmName> | |
| <mirror id> | mirror | |
| vm | <mirror id> | |
| src | <mirror id> | |
| dst | <mirror id> | |
| credentials | <vmName> | From template - not modifiable by user |
| user | credentials | From template - not modifiable by user |
| password | credentials | From template - not modifiable by user |
| connections | — | |
| from | connections | |
| to | connections | |
| points | connections | |
| x | points | |
| y | points | |

Mission Definition

The mission definition.yaml file depicted in Table 4 contains the high-level mission data for the mission.

TABLE 4

| yaml tag | parent tag | Orion Source |
| --- | --- | --- |
| serial_id | — | yymmdd<##> when file is to be written out |
| missionCharacteristics | — | |
| playType | missionCharacteristics | Mission Setup - Mission Characteristics |
| networkSize | missionCharacteristics | Mission Setup - Mission Characteristics |
| networkComplexity | missionCharacteristics | Mission Setup - Mission Characteristics |
| numberPlayers | missionCharacteristics | Mission Setup - Mission Characteristics |
| numberTrainers | missionCharacteristics | Mission Setup - Mission Characteristics |
| missionParameters | — | |
| missionType | missionParameters | Create Mission/Save Mission As . . . Dialog |
| trainingType | missionParameters | Create Mission/Save Mission As . . . Dialog (for regular mission - offensive or defensive) |
| operation | missionParameters | Create Mission/Save Mission As . . . Dialog |
| missionNumber | missionParameters | Create Mission/Save Mission As . . . Dialog |
| missionTitle | missionParameters | Create Mission/Save Mission As . . . Dialog (name) |
| description | missionParameters | Create Mission/Save Mission As . . . Dialog |
| difficulty | missionParameters | Create Mission/Save Mission As . . . Dialog |
| totalGamePoints | missionParameters | Advanced Settings Dialog |
| hintPercentage | missionParameters | Advanced Settings Dialog |
| thumbnail | missionParameters | Mission Setup - Mission Files |

Network

The Mission network.yaml file depicted in Table 5 lists the networks (both static and random) for the mission.

TABLE 5

| yaml tag | parent tag | Orion Source |
|---|---|---|
| serial_id | — | yymmdd<##> when file is to be written out |
| networks | — | |
| network | networks | |
| routes | networks | |
| dest | route | |
| gateway | route | |
| static | network | |
| <ip> | Static | |
| domain_name_servers | network | |
| <ip> | domain_name_servers | |
| dhcp | network | |
| domain_name_servers | dhcp | |

TABLE 5-continued

| yaml tag | parent tag | Orion Source |
|---|---|---|
| gateway | route | |
| members | random_networks | |
| <vmName> | members | |
| policies | — | |
| <domain> | policies | |
| members | <domain> | |
| <vmName> | members | |
| domain_name_servers | <domain> | |
| <ip> | domain_name_servers | |

Objectives

The Mission objectives.yaml file depicted by Table 6 provides the objectives with their skills/scores/hints solutions and umpire check detections for the mission.

The table below indicates where the information for the file comes from within Orion.

TABLE 6

| yaml tag | parent tag | Orion source |
|---|---|---|
| serial_id | — | yymmdd<##> when file is to be written out |
| objectives | — | Mission Objectives |
| coreskills | objective | Mission Objectives |
| name | coreskills | Mission Objectives |
| points | coreskills | Mission Objectives |
| description | objective | Mission Objectives |
| points | objective | (calculated based on total game points from Advanced Settings Dialog) |
| percentagePoints | objective | Mission Objectives (mission) |
| battleRoomScore | objective | Mission Objectives (battle room) |
| hints | objective | Solution and Hints |
| points | hint | (calculated based on objective points and % hint points from Advanced Settings Dialog) |
| text | hint | Solution and Hints For a Variable Hint - put text as (((hint<#>_obj<#>))) - matching the assignment.assign_extend variable (see Services yaml section) |
| isSummary | hint | (set when exporting the solution) |
| tag | objective | Mission Objectives (set to Objective<#>) |
| umpire | — | |
| <umpiretag> | umpire | Matches objective tag |
| description | <umpiretag> | -not required - Orion will not generate |
| type | <umpiretag> | Mission Objectives - Umpire Detections |
| require | <umpiretag> | Mission Objectives - Umpire Detections |
| <umpireCheckTag> | require | Umpire Detections - dialog to pick from other existing <umpiretag>(s) |
| callback | <umpiretag> | Mission Objectives - Umpire Detections |
| persist | <umpiretag> | Mission Objectives - Umpire Detections |
| detection | <umpiretag> | Mission Objectives - Umpire Detections |
| name | detection | Umpire Detections - pick from list of existing detections in detection library |
| type | detection | From detection library |
| target | detection | Associated from Network Map OR picked in Mission Objectives - Umpire Detections |
| persist | detection | Umpire Detections |
| args | detection | Umpire Detection Configuration dialog |

TABLE 5-continued

| yaml tag | parent tag | Orion Source |
|---|---|---|
| <ip> | domain_name_servers | |
| range | dhcp | |
| <from_ip> | range | |
| <to_ip> | range | |
| routers | dhcp | |
| <ip> | routers | |
| random_networks | — | |
| network | random_networks | |
| routes | random_networks | |
| dest | route | |

Services

There are two services yaml files shown by Table 7 which represent data that is loaded at different times into the VEM. The services in the network definition are broken into two layers: Services and Services_0. The first is the basic network which stores a working base definition. The second is an overlay (Services_O) that adds the dynamic variation in the mission to include threat actors. This lets you do many different things to your basic network definition. When a new threat attack comes out, like WannaCry, you can take your service template for a hospital network and quickly create a WannaCry Services_0 overlay, for example.

TABLE 7

| yaml tag | parent tag | Orion Source |
| --- | --- | --- |
| serial_id | — | yymmdd<##> when file is to be written out |
| variables | — | Added when a Service is added to the network Diagram or a detection is added to an Objective. A master list is kept and is editable from the network diagram or objective plugin The services/detection database will need to store the "type" (random_choice, machine_ip, . . . ) of the variables used in the service/detection definition The implication is that there is a list of Variable Types available. |
| assign | variables | Handled by the add/edit capability. |
| <assign> | assign | Handled by the add/edit capability. For "Variable Hint" - a set of assign variables may be created for each "choice" of the variable chosen for the hint with the value being the text for that choice (e.g. ssh_hint, vnc_hint, telnet_hint). |
| [value(s)] | <assign> | Handled by the add/edit capability. |
| random_string | variables | Handled by the add/edit capability. |
| <random_var> | random_string | Handled by the add/edit capability. |
| [value(s)] | <random_var> | Handled by the add/edit capability. |
| random_choice | variables | Handled by the add/edit capability. |
| <choose> | random_choice | Handled by the add/edit capability. |
| [value(s)] | <choose> | Handled by the add/edit capability. |
| machine_ips | variables | Handled by the add/edit capability. |
| <server> | machine_ips | Handled by the add/edit capability. |
| [value(s)] | <server> | Handled by the add/edit capability. |
| random_ip | variables | Handled by the add/edit capability. |
| <net_sim> | random_ip | Handled by the add/edit capability. |
| [value(s)] | <net_sim> | Handled by the add/edit capability. |
| assignments | — | Unclear need better definition from Ryan |
| assign_extend | assignments | See above |
| <assign> | assign_extend | See above For "Variable Hint" an assign_extend is created named hint<#>_obj<#> with <part1> being the variable associated with the hint and <part2> being "hint" |
| <part1> | <assign> | See above |
| <part2> | <assign> | See above |
| assign_service | assignments | See above |
| <service> | assign_service | See above |
| <name> | <service> | See above |
| users | — | List of users and trainers that can log into a system The Orion users will only specify the # of users/trainers. Orion will automatically create the user and trainer ids based on a starting UID for users/trainers The Orion users will also have the ability to add a random user to a node/host |
| <vmName> | users | Name of the Orion node. Trainer node floats just like random services and ????? |
| <user> | <vmName> | User is able to assign the UID for random users |
| uid | <user> | See above |
| configurations | — | Top level tag is included from Orion. The serviceName sub tags are added automatically by Orion when the user adds a service to a node on Network Map. |
| <serviceName> | configurations | Default name comes from the service database and assigned to a node. Multiple nodes can use one configuration. |
| name | <serviceName> | Assumed to be preconfigured in the services database - no user input is required - Orion will "copy" if it exists |
| service | <serviceName> | Assumed to be preconfigured in the services database - no user input is required - Orion will "copy" if it exists |
| type | <serviceName> | Assumed to be preconfigured in the services database - no user input is required - Orion will "copy" if it exists |
| event | <serviceName> | When service type = event - must select an event (name is in event block) Events come from events database Values within the event block is filled in by popping up a dynamic (?) dialog box. |
| <eventblock> | <serviceName> | See above |
| stage | <serviceName> | Assumed to be preconfigured in the services database - no user input is required - Orion will "copy" if it exists |
| ssh | <serviceName> | User is presented with a dialog box asking for the user passwd and sudo subtags Defaults is supplied in the services database |
| user | ssh | See above |
| passwd | ssh | See above |
| sudo | ssh | See above |

TABLE 7-continued

| yaml tag | parent tag | Orion Source |
|---|---|---|
| description | <serviceName> | Assumed to be preconfigured in the services database - no user input is required - Orion will "copy" if it exists |
| reset | <serviceName> | Assumed to be preconfigured in the services database - no user input is required - Orion will "copy" if it exists |
| transform | <serviceName> | Comes from the services database. Values within the transform block is filled in by popping up a dynamic dialog box. |
| <transformblock> | transform | See above |
| salt | <serviceName> | Comes from the services database. Values within the salt block is filled in by popping up a dynamic dialog box. |
| <saltblock> | salt | See above |
| services | — | Contains a list of network nodes that the user has placed on the Network Map. Only nodes that have a service at the corresponding level is included in this list |
| <vmName> | services | See above |
| <serviceName> | <vmName> | List of services that the user associated with the node on Network Map Originated from the services database |
| groups | — | Yaml files authored by Orion will only include groups for random services. (Orion will put in an entry for each node that uses a static service.) Random Services is added as a floating node on the map. Users is able to add a service to random list of hosts (nodes) and the ability to specify how many hosts in the list will get the random service. |
| <group> | groups | See above |
| hosts | <group> | See above |
| <vmName> | hosts | See above |
| services | <group> | See above |
| <serviceName> | <group> | See above |
| random | <group> | See above |
| <serviceName> | random | See above |

Base level—services.yaml: loaded into the VEM cache at startup—any services w/o variables or random information Level 1—services_0.yaml: loaded into VEM at Mission Game startup—any services with variables or random information Orion treats these two files similarly—the difference being that all variable/random information and events must be in services_0.

For adversary events an adversary "configuration" and "service event" is inserted.

VEM

The Mission vem.yaml file depicted in Table 8 is the data fixture file which contains basic metadata for the mission.

TABLE 8

| yaml tag | parent tag | Orion Source |
|---|---|---|
| fields | — | |
| boot_timeout | fields | Advanced Settings Dialog |
| default_location | fields | Advanced Settings Dialog |
| description | fields | Derived from mission number on New Mission/Save Mission As . . . Dialog |
| name | fields | Derived from mission number/difficulty level on New Mission/Save Mission As . . . Dialog |
| networking | fields | Static text |
| polymorphic_ctype | fields | Static text |
| publish_timeout | fields | Advanced Settings Dialog |
| timelimit | fields | Advanced Settings Dialog |
| base_services | fields | Static text |
| services | fields | Static text |
| objectives | fields | Static text |
| mission_parameters | fields | Static text |
| model | — | Static text |

TABLE 8-continued

| yaml tag | parent tag | Orion Source |
|---|---|---|
| pk | — | Derived from information on New Mission/Save Mission As . . . Dialog <ORG>_mission_<#>_<Difficulty> |
| serial_id | — | yymmdd<##> when file is to be written out | vsphere

The Mission vsphere.yaml file depicted in Table 9 is the data fixture file for the virtualization model. It describes and includes the data necessary for the virtualization implementation.

TABLE 9

| yaml tag | parent tag | Orion Source |
|---|---|---|
| fields | — | |
| blueprint | fields | Static text |
| model | — | Static text |
| pk | — | Derived from information on New Mission/Save Mission As . . . Dialog <ORG>_mission_<#>_<Difficulty> |
| serial_id | — | yymmdd<##> when file is to be written out |

Cyber Ranges

In one embodiment of the invention, the output of the Orion or mission builder system creates a single training mission that may train one or more users. The training mission may be reused and added to a library of other missions for use by students to learn key concepts.

In other embodiments, created missions may be grouped into a cyber training or exercise event in order to create a realistic virtual world or cyber range complete with simulated users, simulated mission systems, simulated data and emulated adversaries—all connected to a simulated Internet.

Cyber ranges may begin as racks of computer hardware that can be reconfigured into various network topologies and overlaid with different baseline network services and traffic profiles to coincide with the business or mission of the enterprise environment. Cyber ranges operate in a closed loop environment as a necessity to introduce malware safely and prevent damage to live networks. The cyber range provides for network routing, defensive tools, mission applications and an overlay of virtual users that automatically perform the activities of real users to generate realistic simulated network traffic.

The formation of a cyber range with which to train users with missions created by the system is a virtualization approach that essentially mimics the real-world internet of back-bone routing and connectivity between organizations. Modules and interconnection across virtual environments are essential components of the cyber range where training missions take place.

In the cyber range embodiment of the system, many mission designer users could create, for example, an ICS mission, a radar mission, a military range mission, and other required missions to meet their training objectives. No coordination is required when each mission designer or student latches on to the cyber range, which interconnects all users just like in the real world. This approach supports key training objectives such as trust relationships while creating a single plane from which the exercise support teams, like the opposing force, can operate using the cyber range across many teams at once. In addition, scenarios involving multi-team echelon reporting can be easily exercised. In other embodiments, entire virtual e-cities can be configured for training in a straightforward and tractable problem.

In one embodiment, key features of the cyber range embodiment where created missions are used for training may include: (1) the unique ability to "swing and latch" on to networks via the configuration of a single interface for each add-on environment; (2) a uniquely small footprint but is able to handle a large traffic volume and dynamically sets up routes to new environments; (3) scaling to different sizes, such as 2, 8, 16, and 28 mission networks; and (4) quick deployment due to the modular design.

The approach supports event configurations across multiple game training systems, meaning, it can be launched in one cyber training system and connected to an entirely different system as long as the physical switches that connect the two clusters or systems has the swing network (a virtual local area network distribution identification or "VLANID") defined. These clusters "could" be geographically different as long as the layer 2 traffic on each end of the WAN connection is unscathed. In addition, multiple cyber ranges might even be connected.

The cyber range can be latched on to user emulation modules, Internet corpus modules, management and monitoring modules, and opposition forces (live and automated) modules.

Using a cyber range of the invention, such as with missions created by the Orion/mission builder system of the invention as depicted in FIG. 4A, a port is tagged (perhaps in the blueprint.yaml) as an INTER-MISSION network as well as in the CORE (a baseline or background routing for Internet services) module. The Virtual Environment Manager (VEM) then creates a VLAN to work between the mission modules (Each key aspect of the system has a port tagged for Intermission of communications).

In the backbone of cyber range, dynamic routing is used via a Border Gateway Protocol (BGP). Each content server and infrastructure device is configured to redistribute the routes of all the interfaces configured. If a new sub-interface is created with a new IP address that has new web content, for example, that IP address is automatically injected into the BGP route table for client consumption. This dynamic routing capability facilitates content, traffic, and purpose flexibility into the product. Any and all valid IP space can be used in the virtual environment resulting in the ability to present regions of the world based on IP address.

The routing flexibility and solution design makes it very robust, such as a red team adversary emulation mission training platform. Adversary presence using the cyber range embodiment for training missions is simple, flexible, and realistic. A red team can control and distribute Domain Name System (DNS) and route characteristics into the cyber range much like today's adversaries have demonstrated. This feature provides the ability not only to demonstrate the characteristics of a specific attack method, but also enables it to be representative by a particular region and footprint.

Figure 63:
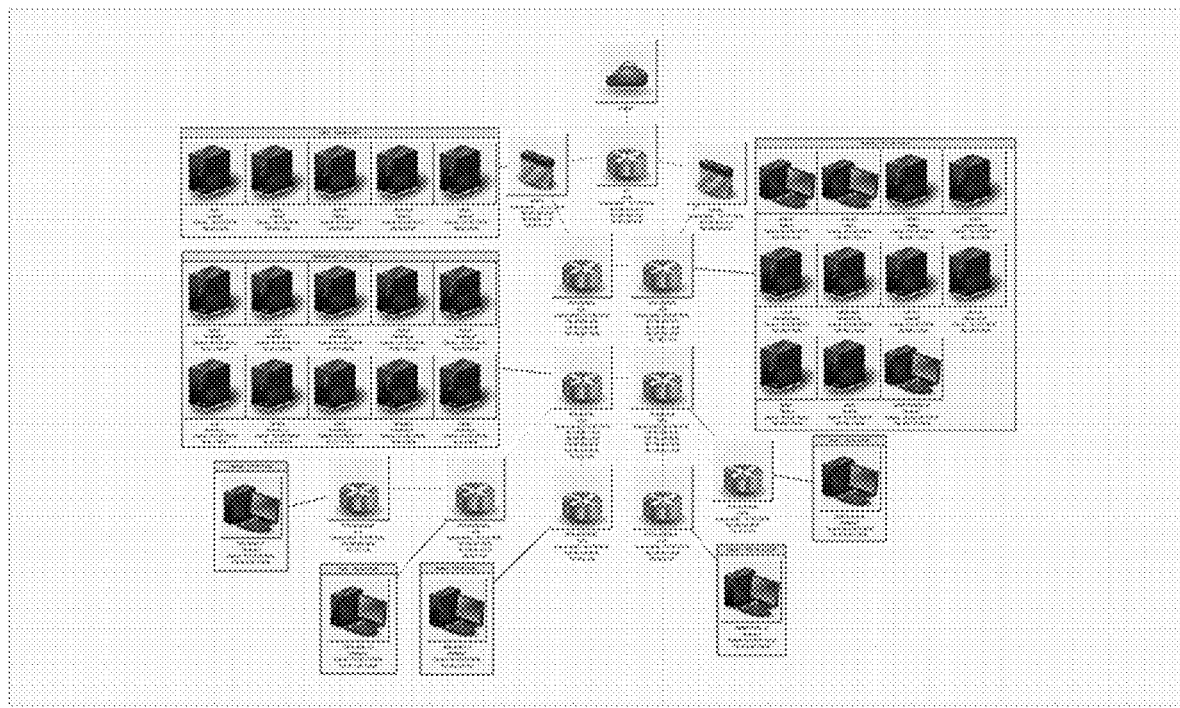
FIG. 63 illustrates a cyber range backbone of Internet services, user emulation, and auto-inject mission modules that support the training environment according to embodiments of the present invention.

FIG. 63 illustrates a cyber range backbone of Internet services, user emulation, and auto-inject mission modules that support the training environment. All missions created by the system hang off of the configured cyber range and are playable using missions developed with the Orion/mission builder system of the invention along with activities interjected by a live-inject mission module used as an opposing force ("OPFOR") or adversary training ground.

INET-NNW, NW, WNW,W,etc routers act essentially as "ISP's" "ISP" for each mission. If a small training exercise is run with 8 teams, the teams are able to share the "Internet Corpus" module which contains DNS, NTP, SMTP, FTP, and all the browsable websites for Lariat and/or other user traffic generators. The teams can also share the "User Emulation" module, which is a customized Lariat setup to support the teams in some capacity. Then there are two other pick-offs; the "Live Inject" module, and the "Auto-Inject" module. The "Live Inject" module is for a Red (OPFOR) team to work from with access to all the teams via the Cyber Range. The "Auto-Inject" module is for any automated attacks/objectives we put into the game that can be scripted and scored automatically.

Figure 64:
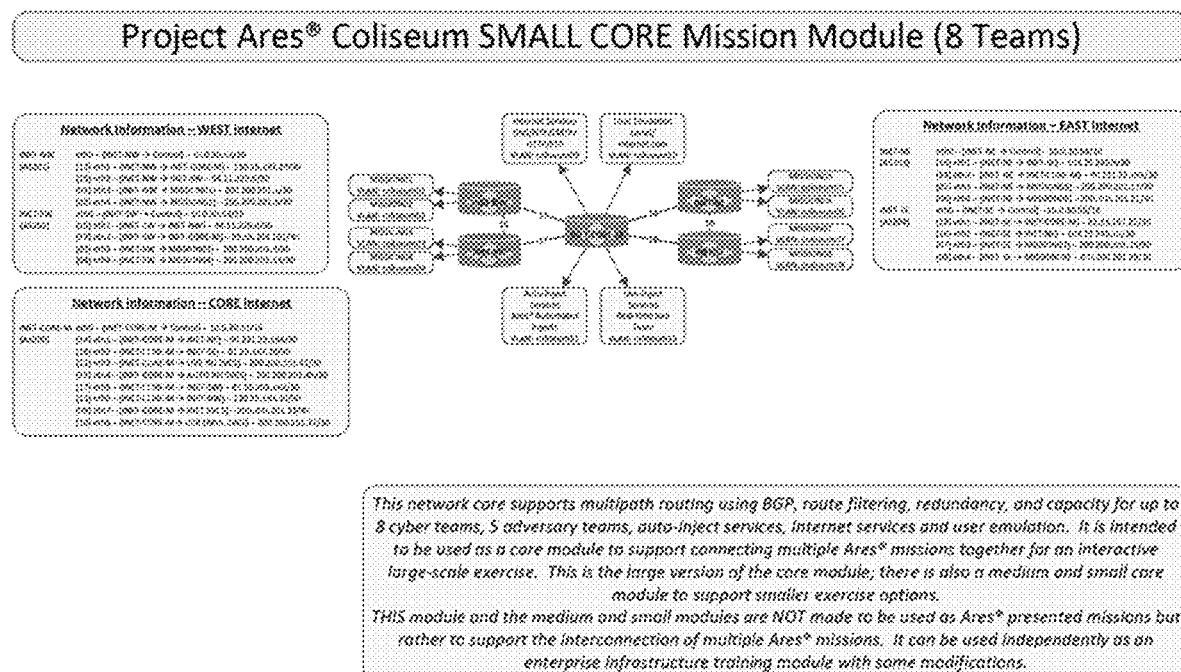
FIG. 64 illustrates a small core mission module for eight teams that support the training environment according to embodiments of the present invention.
Figure 65:
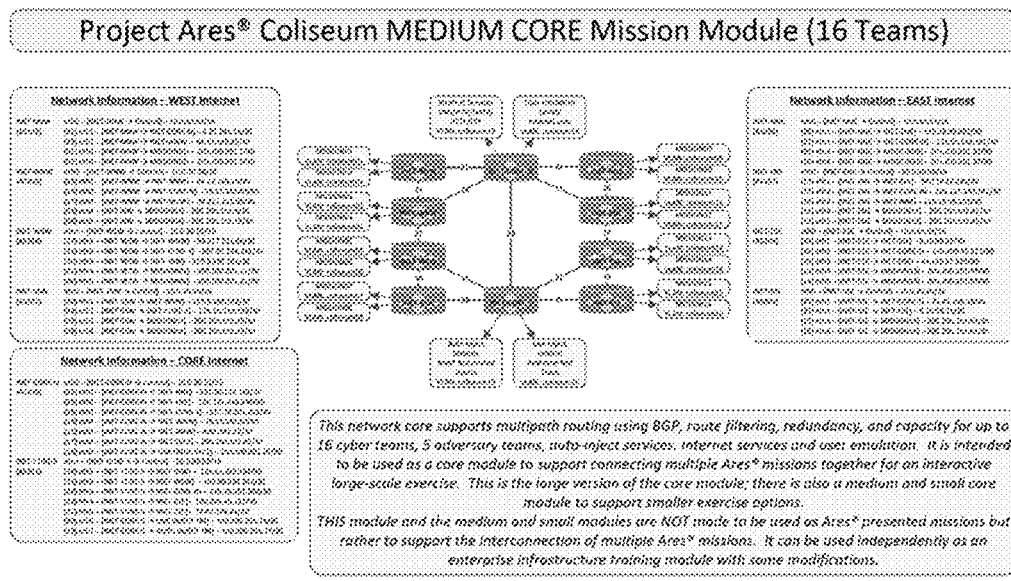
FIG. 65 illustrates a medium core mission module that support the training environment according to embodiments of the present invention.

This embodiment of the system, where missions are integrated and used by multiple teams as shown in FIGS. 64 and 65, provides the ability to modularize many of the disparate functions typically used in training exercises where the prior art used manual configuration. For example, one set of users can be responsible for maintaining the "Internet Corpus" module with updated websites, patches and updates, and added functionality if required and do releases of that module for use in the cyber range. This same approach can be used with the "User Emulation," "Live Inject," and "Auto-Inject modules." These features of the cyber range embodiment allow the mission designers to pick from a catalog of things needed for an interconnected training exercise. All the routing is automatic for each mission provided.

It will be understood that the above described arrangements of apparatus and the method there from are merely illustrative of applications of the principles of this invention and many other embodiments and modifications may be made without departing from the spirit and scope of the invention as defined in the claims.

What is claimed is:

1. A mission design system for a cyber training system, comprising:
   at least one user station, each user station comprising at least one display device, at least one user input device, a memory device, and at least one controller, and
   at least one mission server, said at least one mission server comprising:
   a processor configured to execute machine readable code;
   at least one communication interface which permits said server to transmit information to said at least one user station and to receive information from said at least one user station;
   a plurality of mission plugins which define a baseline cyber mission environment, each of the mission plugins configured to generate a corresponding graphical user interface of mission design information, each of the graphical user interfaces have a plurality of variable mission parameters; and
   machine readable code executable by said processor configured to cause said mission server to cause said at least one user station to display a mission design interface which includes a plurality of selectable mission plugin icons corresponding to the mission plugins, to display a corresponding one of said graphical user interfaces when a corresponding one of the mission plugin icons is selected from the mission design interface by a user, to receive input from the user of values for one or more of said plurality of variable mission parameters and, in response thereto, to generate a cyber mission file which is usable by a cyber training system to implement a cyber training mission defined by said cyber mission file within a cyber environment.

2. The mission design system in accordance with claim 1 wherein said mission plugins comprise one or more of a storyline plugin, a mission setup plugin, a mission order plugin, a mission objective plugin, a solution and hints plugin, a network map plugin, an events plugin, a questions and answers plugin, a quizzes plugin and a mission library plugin.

3. The mission design system in accordance with claim 2 wherein when said storyline plugin is selected, a storyline user interface is presented to prompt the user to enter a storyline text and/or a storyline video.

4. The mission design system in accordance with claim 2 wherein when said mission setup plugin is selected, a creating new mission interface is presented to the user prompting the user to enter a mission name, a mission description, and a mission difficulty of a new mission.

5. The mission design system in accordance with claim 2 wherein when said mission order plugin is selected, a mission order interface is presented to the user prompting the user to generate written mission orders.

6. The mission design system in accordance with claim 5 wherein said written mission orders includes at least one of a situation describing an overall mission scenario and threat intelligence information, a mission describing specifics of the mission and skills or core competencies required to go on the mission, execution describing a mission purpose, key tasks, an end state and concept of operations including user credentials and tools, sustainment describing how long the mission should take and any requirements on an end of the mission, command and control describing who commands the mission and any reporting requirements, rules of engagement describing any rules about the mission environment including an out-of-bounds list, tools, traffic generation and key services that must be maintained, and references describing what mission players should read.

7. The mission design system in accordance with claim 2 wherein when said mission objective plugin is selected, a mission objective interface is presented to the user prompting the user to generate written mission objectives including at least one of an objective name, an objective score, skills addressed by an objective, an umpire check associated with an objective that forms a basis for automated scoring, and (4) List of Existing Objectives.

8. The mission design system in accordance with claim 2 wherein when said solution and hints plugin is selected, a solution and hints interface is presented to the user prompting the user to generate a solution and at least one associated hint for each mission objective.

9. The mission design system in accordance with claim 2 wherein when said network map plugin is selected, a network map interface is presented to the user presenting network map option choices to the user.

10. The mission design system in accordance with claim 9 wherein said network map options include an option to show OS type, an option to show a simple name, an option to show an IP address, an option to show services, and an option to show key terrain.

11. The mission design system in accordance with claim 10 wherein when the show key terrain option is selected, a key terrain ranking is displayed on network elements in the network map designated as key elements.

12. The mission design system in accordance with claim 2 wherein when said events plugin is selected, a mission objective interface is presented to the user prompting the user to add events to the mission and to designate an event type.

13. The mission design system in accordance with claim 2 wherein when said questions and answers plugin is selected, a questions and answers interface is presented to the user prompting the user to add, delete or edit questions and answers including a question and answer category.

14. The mission design system in accordance with claim 2 wherein when said quizzes plugin is selected, a quizzes interface is presented to the user prompting the user to prepare written questions each with a user selected difficulty ranking and at least one associated skill.

15. The mission design system in accordance with claim 2 wherein when said mission library plugin is selected, a mission library interface is presented to the user presenting mission information concerning a mission selected by the user from a local file system.

16. The mission design system in accordance with claim 1 wherein said machine readable code is configured to generate a top-level graphical user interface displayed on said user station, the top-level graphical user interface displaying the mission plugins as a plurality of selectable tabs, wherein when a user selects one of the tabs, the corresponding graphical user interface for the selectable plugin is displayed.

17. The mission design system in accordance with claim 16 wherein the selectable tabs corresponding to the mission plugins on the top-level user interface each include a designator having a visual indication of a completion state of data needed by the corresponding mission plugin to have a complete mission.

18. The mission design system in accordance with claim 2 further comprising a mission database, the mission database storing saved missions and preconfigured missions.

19. The mission design system in accordance with claim 18 wherein when said mission setup plugin is selected, an open existing mission interface is presented to the user prompting the user to select an existing mission from the mission database.

20. The mission design system in accordance with claim 1 further comprising a global data logger configured to maintain and share information among the plurality of mission plugins.

* * * * *